US008782503B2

(12) United States Patent
Kaeriyama

(10) Patent No.: US 8,782,503 B2
(45) Date of Patent: Jul. 15, 2014

(54) SEMICONDUCTOR INTEGRATED CIRCUIT AND DRIVE APPARATUS INCLUDING THE SAME

(75) Inventor: Shunichi Kaeriyama, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 195 days.

(21) Appl. No.: 13/535,256

(22) Filed: Jun. 27, 2012

(65) Prior Publication Data

US 2013/0055052 A1 Feb. 28, 2013

(30) Foreign Application Priority Data

Aug. 31, 2011 (JP) .................................. 2011-188245

(51) Int. Cl.
*G06F 11/00* (2006.01)
*G06K 19/07* (2006.01)
*G01R 31/265* (2006.01)
*H04B 5/00* (2006.01)
*G01R 31/302* (2006.01)

(52) U.S. Cl.
CPC .......... *G06K 19/0723* (2013.01); *G01R 31/265* (2013.01); *H04B 5/0075* (2013.01); *G01R 31/302* (2013.01)
USPC ..... 714/799; 714/48; 340/572.1; 324/754.27; 324/754.28; 324/754.29

(58) Field of Classification Search
CPC ............. G06K 19/0723; G01R 31/265; G01R 31/302; H04B 5/0075
USPC ............. 714/799, 48; 340/572.1; 324/754.27, 324/754.28, 754.29
See application file for complete search history.

(56) References Cited

U.S. PATENT DOCUMENTS

| | | | |
|---|---|---|---|
| 7,148,074 B1* | 12/2006 | Drost et al. ..................... 438/15 |
| 7,712,663 B2* | 5/2010 | Sukegawa et al. ............ 235/451 |
| 7,750,709 B1* | 7/2010 | Schauer et al. ............... 327/264 |
| 7,979,754 B2* | 7/2011 | Drost et al. ................... 714/704 |
| 7,994,890 B2 | 8/2011 | Edo et al. |
| 8,024,623 B2* | 9/2011 | Ho et al. ....................... 714/700 |
| 8,195,990 B2* | 6/2012 | Ho et al. ....................... 714/700 |

(Continued)

FOREIGN PATENT DOCUMENTS

| | | |
|---|---|---|
| EP | 1 193 725 A1 | 3/2002 |
| JP | 05-029914 A | 2/1993 |
| JP | 09-312555 A | 12/1997 |
| JP | 2002-084173 A | 3/2002 |

(Continued)

OTHER PUBLICATIONS

Extended Eurpean Search Report dated Mar. 25, 2013.

*Primary Examiner* — John Trimmings
(74) *Attorney, Agent, or Firm* — McGinn IP Law Group, PLLC

(57) ABSTRACT

Disclosed herein is a semiconductor integrated circuit capable of detecting an abnormality that can cause a malfunction in signal transmission via an isolation element and of issuing a stop signal to the target to be controlled. The semiconductor integrated circuit includes a transmission circuit generating and outputting a transmission signal reflecting transmission data supplied from outside, a reception circuit reproducing the transmission data based on a reception signal, an isolation element isolating the transmission circuit from the reception circuit and transmitting the transmission signal as the reception signal, an abnormality detection part detecting an abnormality that can cause a malfunction in signal transmission via the isolation element, and a control part outputting a stop signal if the abnormality detection part detects the abnormality, regardless of the transmission data supplied to the transmission circuit from outside.

29 Claims, 65 Drawing Sheets

(56) References Cited

U.S. PATENT DOCUMENTS

| | | |
|---|---|---|
| 2007/0001270 A1* | 1/2007 | Sukegawa et al. ............ 257/664 |
| 2008/0180248 A1* | 7/2008 | Lian et al. .................. 340/572.1 |
| 2009/0052214 A1 | 2/2009 | Edo et al. |
| 2009/0193295 A1* | 7/2009 | Drost et al. ..................... 714/32 |

FOREIGN PATENT DOCUMENTS

| | | |
|---|---|---|
| JP | 2004-222367 A | 8/2004 |
| JP | 2005-6459 A | 1/2005 |
| JP | 2009-049035 A | 3/2009 |
| JP | 2010-118248 A | 5/2010 |

\* cited by examiner

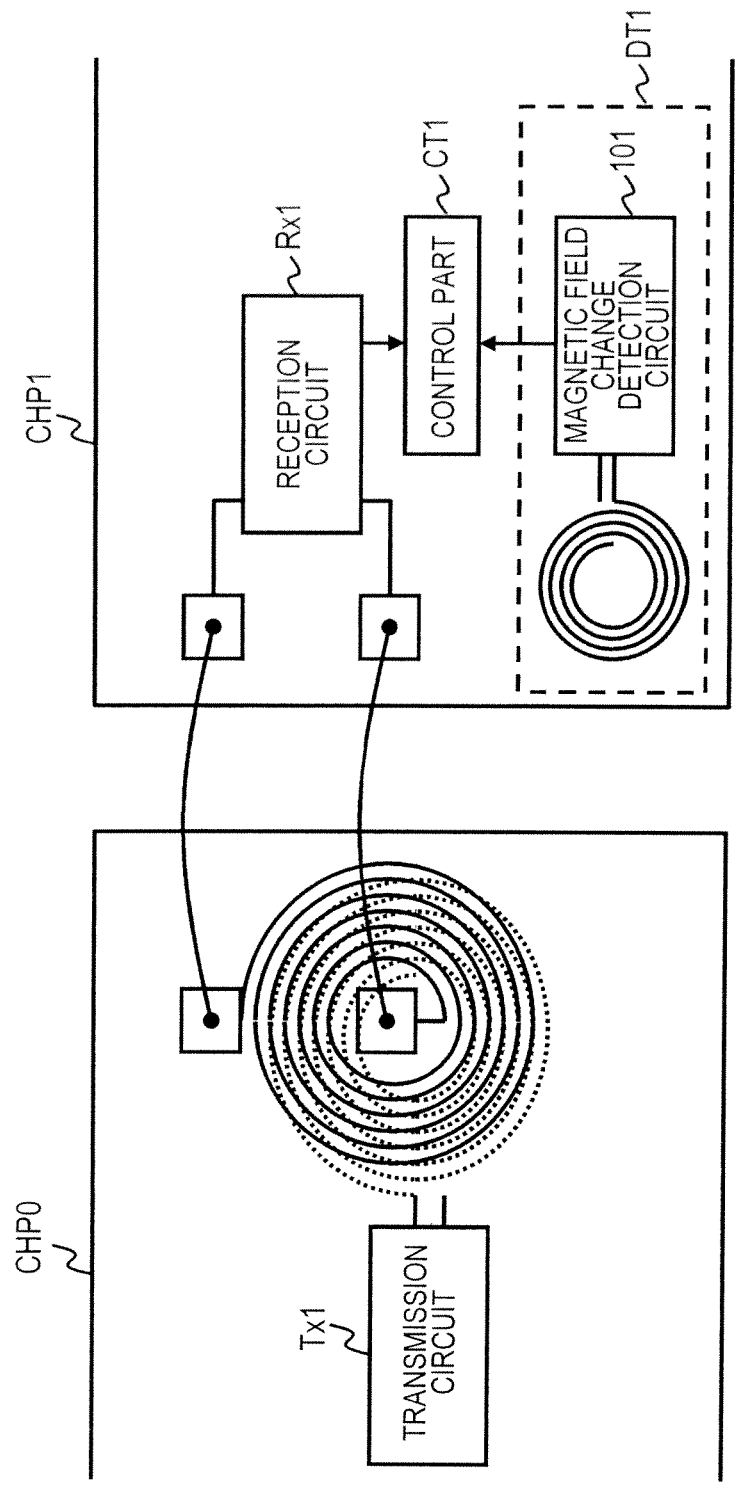

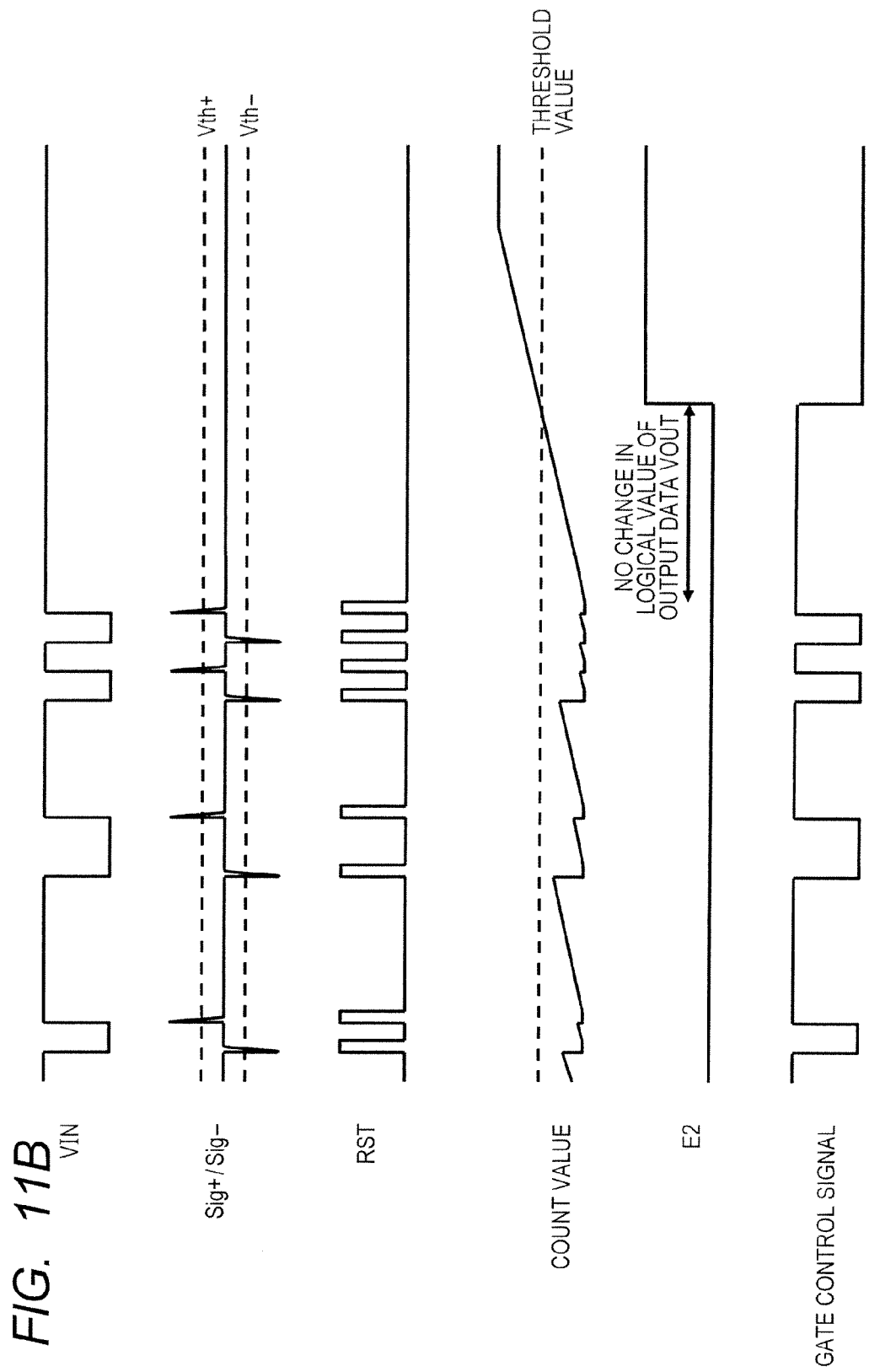

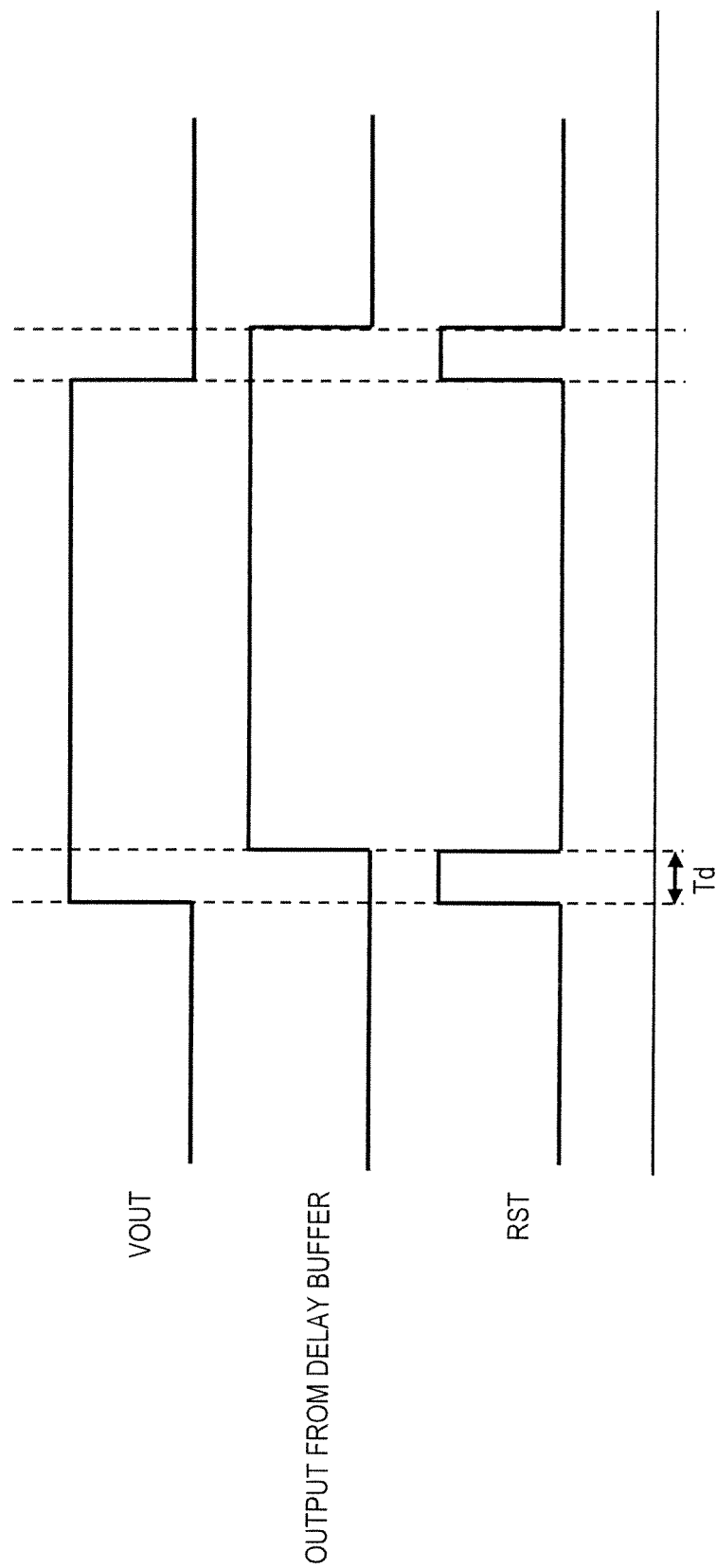

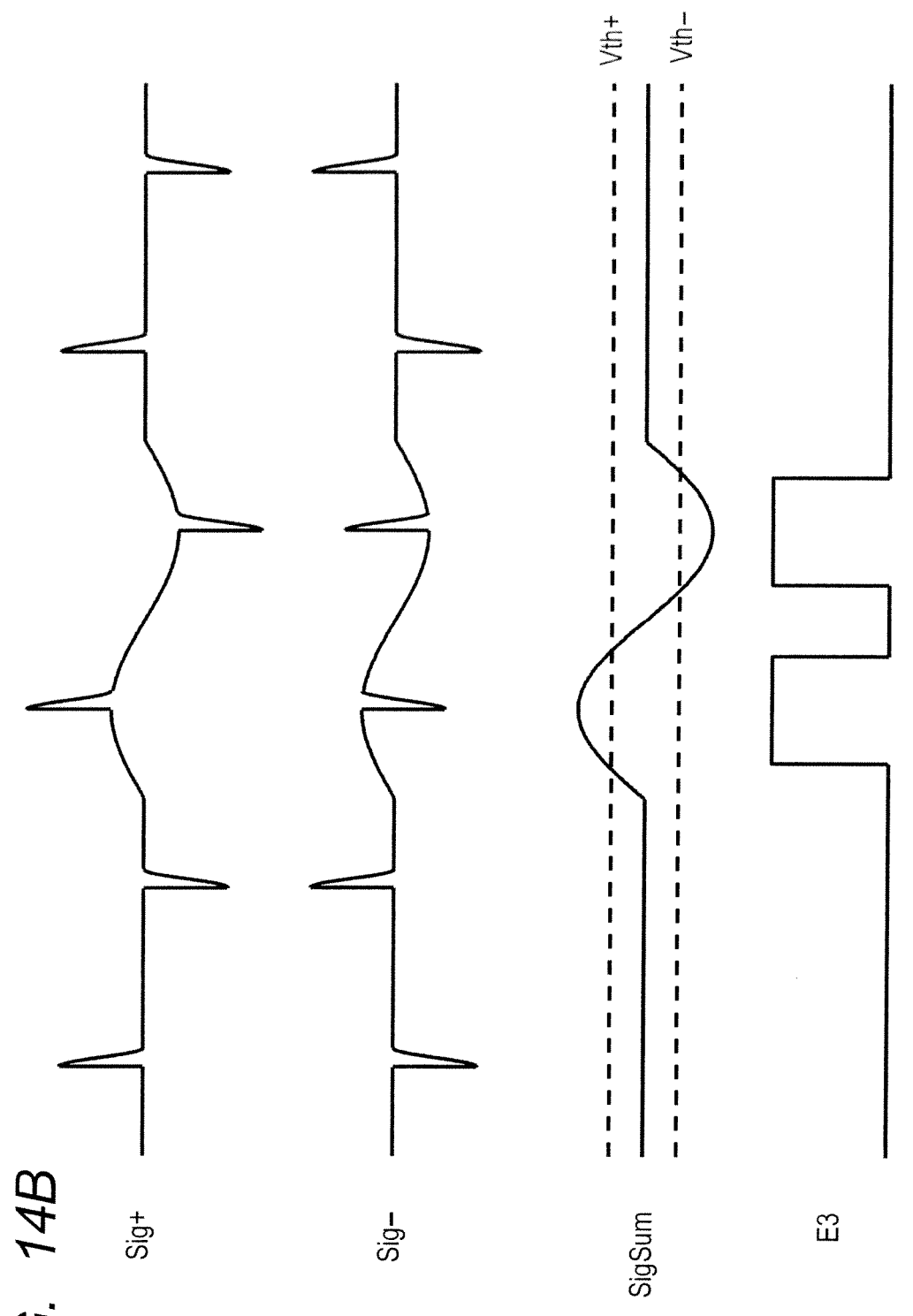

SEMICONDUCTOR INTEGRATED CIRCUIT AND DRIVE APPARATUS INCLUDING THE SAME

CROSS-REFERENCE TO RELATED APPLICATIONS

The disclosure of Japanese Patent Application No. 2011-188245 filed on Aug. 31, 2011 including the specification, drawings and abstract is incorporated herein by reference in its entirety.

BACKGROUND

The present invention relates to a semiconductor integrated circuit and a drive apparatus including the semiconductor integrated circuit. More particularly, the invention relates to a semiconductor integrated circuit that transmits signals via an isolation element, and to a drive apparatus that includes the semiconductor integrated circuit.

Isolation elements such as the photo-coupler, inductor-coupled isolator, capacitor-coupled isolator, and GMR (Giant Magneto Resistive) element isolator are currently used as the means for transmitting signals between a plurality of semiconductor chips each operating on a different source voltage.

For example, the photo-coupler uses one chip to convert an electric signal to an optical signal before getting another chip to convert that optical signal to an electric signal, thus providing isolation between two semiconductor chips. The inductor-coupled isolator uses one coil to convert an electric signal to magnetism before getting another coil to convert the magnetism to an electric signal, thus ensuring isolation between two semiconductor chips. The capacitor-coupled isolator uses one electrode of a capacitative element to convert an electric signal to an electric field before utilizing the other electrode of the element to convert the electric field to an electric signal, thereby providing isolation between two semiconductor chips. The GMR element isolator uses a coil to convert an electric signal to magnetism before utilizing a GMR element to convert the magnetism to an electric signal, thereby offering isolation between two semiconductor chips.

The above-described isolation elements are used in today's power control circuits such as inverter equipment and converter equipment. Specifically, this type of power control circuit of recent years operating on one power supply system transmits a control signal output from a microcomputer to a chip of another power supply system via an isolation element, thereby converting the voltage level of the control signal in question. The power control circuit proceeds to get a gate driver amplifying the control signal with its voltage level converted, before feeding the amplified control signal to a control terminal of a power transistor (output transistor) that controls currents flowing through a load.

Some related art is disclosed in the following literature: Japanese Unexamined Patent Publication No. 2009-49035 (called the Patent Literature 1 hereunder), Japanese Unexamined Patent Publication No. Hei 9 (1997)-312555 (Patent Literature 2), Japanese Unexamined Patent Publication No. 2002-84173 (Patent Literature 3), Japanese Unexamined Patent Publication No. 2004-222367 (Patent Literature 4), and Japanese Unexamined Patent Publication No. Hei 5 (1993)-29914 (Patent Literature 5).

Disclosed in the Patent Literature 1, an intelligent power module for a step up/down converter includes a CPU, an isolation transformer, a safeguard-equipped gate driver IC, and an IGBT (Insulated Gate Bipolar Transistor). The CPU generates a gate drive PWM signal designating conduction or non-conduction of the IGBT, and transmits the signal insulatingly to the safeguard-equipped gate driver via the isolation transformer. Based on the gate drive PWM signal, the safeguard-equipped gate driver IC generates a gate signal and feeds it to the control terminal of the IGBT for a switching operation. The chip on which the IGBT is formed has a temperature sensor and a current sensor.

Upon determining that the current flowing through the IGBT has exceeded a threshold value possibly triggering IGBT destruction based on an overheat detection signal from the temperature sensor and/or on an overcurrent detection signal from the current sensor, the safeguard-equipped gate driver IC transmits an alarm signal to the CPU. On receiving the alarm signal from the safeguard-equipped gate driver IC, the CPU stops generating the gate drive PWM signal and thereby cuts off the current flowing through the IGBT.

A switching circuit control apparatus disclosed in the Patent Literature 2 includes a mask circuit that masks information signals such as a temperature signal and a current signal only while switching noise is being generated from a switching circuit that repeats on and off operations. The switching circuit control apparatus detects such information signals from inside the switching circuit or from within electric circuits adjacent to and affected by the switching circuit generating the switching noise. If the switching circuit control apparatus detects an abnormality in temperature or in other parameters based on the information signals except during the masking period, the apparatus supplies a gage circuit with a gate control signal such as a switching stop command or a switching reduction command.

Consequently, the switching circuit control circuit can detect the information signals at high speed without making false determination by averting the adverse effects of the noise from the switching circuit, according to the Patent Literature 2.

The Patent Literature 3 discloses a power semiconductor device that securely protects power transistors against an overcurrent state by unfailingly detecting the generation of that state without making false determination even if noise is detected in a sense voltage obtained by having a sense current detected with a sense resistor.

A gate drive apparatus disclosed in the Patent Literature 4 drives a main semiconductor device of a power converter by the gate. The gate drive apparatus includes a voltage detection part, a waveform control circuit, a reference power source, and a voltage comparator. The voltage detection part is coupled to the collector terminal of the main semiconductor device and detects a collector voltage of that device. The waveform control circuit is coupled in electrical parallel to the voltage detection part and controls differentially the collector voltage detected by the voltage detection part. The reference power source generates a reference voltage. The voltage comparator compares the reference voltage from the reference power source with the collector voltage controlled by the waveform control circuit. Based on the result of the comparison, the voltage comparator outputs an abnormality detection signal.

In this manner, the gate drive apparatus protects the main semiconductor device from a short circuit or an overcurrent at high speed, according to the Patent Literature 4.

An output buffer circuit disclosed in the Patent Literature 5 includes an output buffer, a power source noise detection circuit, and a ground noise detection circuit. The output buffer has a first and a second PMOS transistor coupled in parallel between a power terminal and an output terminal OUT and a first and a second NMOS transistor coupled in parallel between a ground terminal and the output terminal OUT.

When the potential of the power terminal drops due to a change in the potential level of an output signal OUT, the power source noise detection circuit detects the potential drop and acts to cut off the second PMOS transistor during the potential drop period. When the potential of the ground terminal rises because of a change in the potential level of the output signal OUT, the ground noise detection circuit detects the potential rise and acts to cut off the second NMOS transistor during the potential rise period.

Thus by reducing its drive capability only during the period where the power source potential or ground potential is being changed, the output buffer circuit prevents the other circuits on the same chip from malfunctioning, according to the Patent Literature 5.

SUMMARY

The configuration disclosed in the Patent Literature 1 is designed to detect the overcurrent flowing through the IGBT and its overheat to prevent IGBT destruction. This configuration is not intended to detect abnormalities that can cause a malfunction in signal transmission through the isolation transformer.

The configuration disclosed in the Patent Literature 2 is designed to detect the information signals such as the temperature signal and current signal inside the switching circuit or within the electric circuits adjacent to and affected by the switching circuit generating the switching noise. This configuration is not intended to detect abnormalities that can cause a malfunction in signal transmission through the isolation element. To begin with, the configuration discussed in the Patent Literature 2 has no arrangements for implementing signal transmission through the isolation element. Thus it is obvious that the configuration does not detect any abnormality that may cause malfunctioning in the signal transmission via the isolation element.

The configuration disclosed in the Patent Literature 3 is designed to detect the overcurrent flowing through the power transistor and not intended to detect abnormalities that can cause a malfunction in signal transmission through the isolation element. To begin with, the configuration discussed in the Patent Literature 3 has no arrangements for implementing signal transmission through the isolation element. Thus it is obvious that the configuration does not detect any abnormality that may cause malfunctioning in the signal transmission via the isolation element.

The configuration disclosed in the Patent Literature 4 is designed to protect the main semiconductor device against a short circuit or an overcurrent by detecting the collector voltage of that device. The configuration is not intended to detect abnormalities that can cause a malfunction in signal transmission through the isolation element. To begin with, the configuration discussed in the Patent Literature 4 has no arrangements for implementing signal transmission through the isolation element. Thus it is obvious that the configuration does not detect any abnormality that may cause malfunctioning in the signal transmission via the isolation element.

The configuration disclosed in the Patent Literature 5 is designed to control the drive capability of the output buffer by detecting changes in the power potential and ground potential for driving that buffer. The configuration is not intended to detect abnormalities that can cause a malfunction in signal transmission through the isolation element. To begin with, the configuration discussed in the Patent Literature 5 has no arrangements for implementing signal transmission through the isolation element. Thus it is obvious that the configuration does not detect any abnormality that may cause malfunctioning in the signal transmission via the isolation element.

As outlined above, the configurations of the related art have the problem of not being capable of detecting abnormalities that may cause malfunctioning in the signal transmission via the isolation element. In case of a malfunction during signal transmission via the isolation element, the objects to be controlled downstream can operate erroneously, according to the related art. For example, if a malfunction occurs during signal transmission via the isolation element, the output transistor for controlling the current flowing through the load can be inadvertently turned on, which can cause the load to operate erroneously.

In carrying out the present invention and according to one aspect thereof, there is provided a semiconductor integrated circuit including a first transmission circuit generating and outputting a first transmission signal reflecting a first data signal supplied from outside; a first reception circuit reproducing the first data signal based on a first reception signal; a first isolation element isolating the first transmission circuit from the first reception circuit and transmitting the first transmission signal as the first reception signal; an abnormality detection part detecting an abnormality that can cause a malfunction in signal transmission via the first isolation part, and a control part which, upon detection of an abnormality by the abnormality detection party, outputs a stop signal regardless of the first data signal supplied from outside to the first transmission circuit.

The circuit configuration outlined above detects an abnormality that can cause a malfunction in signal transmission via the isolation element and outputs a stop signal upon such detection to the object to be controlled. This prevents the malfunction of the control target.

According to the present invention, it is thus possible to provide a semiconductor integrated circuit which detects an abnormality that can cause a malfunction in signal transmission via the isolation element and which issues a stop signal to the object to be controlled to turn off its operation upon such detection, thereby preventing the malfunction of the control target.

BRIEF DESCRIPTION OF THE DRAWINGS

Further objects and advantages of the present invention will become apparent upon a reading of the following description and appended drawings in which:

FIG. 10 is a schematic view showing another typical layout of the magnetic field change detection circuit in the first embodiment;

FIG. 11B is a timing chart showing typical operations of the pulse width detection circuit in the first embodiment;

FIG. 13B is a timing chart showing typical operations of the pulse width detection circuit in FIG. 13A;

FIG. 14B is a timing chart showing typical operations of the common mode noise detection circuit in the first embodiment;

DETAILED DESCRIPTION

Figure 1:
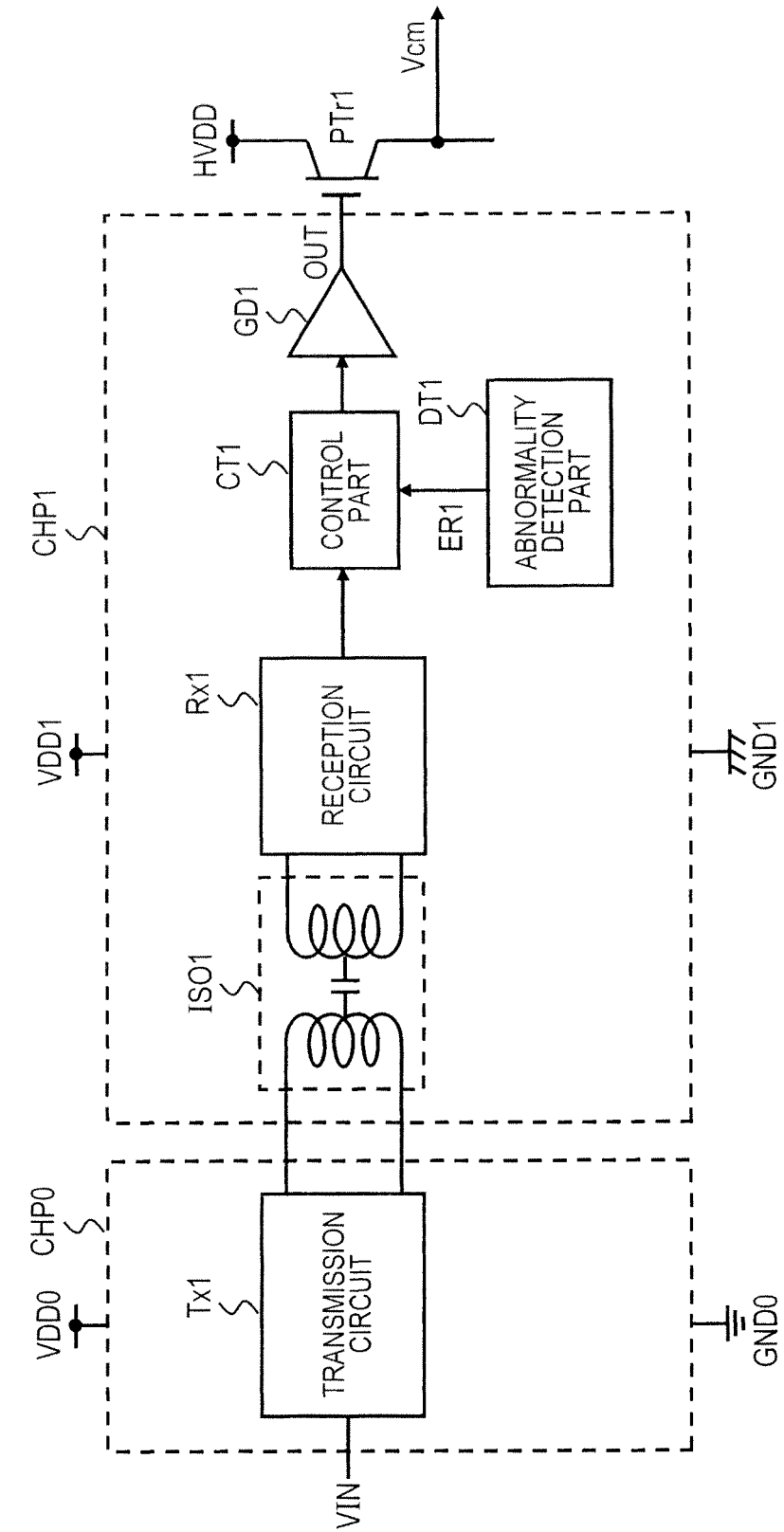
FIG. 1 is a block diagram showing a typical configuration of a semiconductor integrated circuit as a first embodiment of the present invention.

Some preferred embodiments of the present invention will now be described by reference to the accompanying drawings. These drawings are only for purpose of simplification and illustration and should not be construed as limitative of the present invention. In the ensuing paragraphs and in the drawings, like reference characters designate like or corresponding component parts of which the explanations will be omitted where redundant.

First Embodiment

FIG. 1 shows a typical configuration of a semiconductor integrated circuit 1 as the first embodiment of the present invention. The semiconductor integrated circuit 1 embodying the invention has the ability to detect an abnormality that can cause a malfunction in signal transmission via an isolation element and to forcibly turn off a power transistor (a typical target to be controlled) upon such detection. Explained below is an example in which a data signal reproduced by a reception circuit controls on/off operations of the power transistor. It should be noted that the power transistor is not limitative of the target to be controlled using the data signal reproduced by the reception circuit.

The semiconductor integrated circuit 1 shown in FIG. 1 includes a transmission circuit (first transmission circuit) Tx1, a reception circuit (second reception circuit) Rx1, an isolation element (first isolation element) ISO1, a gate driver GD1, an abnormality detection part DT1, and a control part CT1. FIG. 1 also shows a power transistor (output transistor) PTr1 as the target to be controlled using transmission data VIN (first data signal) reproduced by the reception circuit Rx1. The power transistor PTr1 is provided between a source voltage terminal to which a source voltage HVDD is supplied (the terminal is simply called the source voltage terminal HVDD hereunder) on the one hand, and a load (not shown) on the other hand. The conduction state of the power transistor PTr1 is controlled using a gate control signal (to be discussed later) OUT supplied to the gate (control terminal) of the transistor. When in the conducting state, the power transistor PTr1 outputs a load drive signal Vcm to the load.

The transmission circuit Tx1 is included in a semiconductor chip (first semiconductor chip) CHP0. The semiconductor chip CHP0 is driven by a first power source (with source voltage VDD0 and ground voltage GND0) belonging to a first power source system.

The isolation element ISO1, reception circuit Rx1, gate driver GD1, abnormality detection part DT1, and control part CT1 are included in another semiconductor chip (second semiconductor chip) CHP1. The semiconductor chip CHP1 is driven by a second power source (with source voltage VDD1 and ground voltage GND1) belonging to a second power source system different from the power source system of the semiconductor chip CHP0.

The ensuing explanation will center on the case where the isolation element ISO1 is an inductor type isolator comprised of a primary side coil L11 and a secondary side coil L12 (the element is simply called the transformer hereunder). However, the transformer is not limitative of the isolation element. A capacitor-coupled isolator (simply called the capacitor hereunder), a GMR element isolator, or a photo-coupler may also be used as the isolation element. The same holds for other isolation elements (ISO2 through ISO4, to be discussed later) apart from the isolation element ISO1. The transformer is an AC coupling element that uses the primary side coil L11 to convert an electric signal to magnetism and utilizes the secondary side coil L12 to convert the magnetism to an electric signal thereby transmitting an AC signal from the primary side coil L11 to the secondary side coil L12.

A parasitic coupling capacitance Cc is provided between the primary side coil L11 and the secondary side coil L12. The parasitic coupling capacitance is a capacitor with dielectric films comprised of an isolator that fills the spacing between the metallic wiring forming the primary side coil L11 on the one hand and the metallic wiring making up the secondary side coil L12 on the other hand.

When the transmission circuit Tx1 outputs a positive amplitude pulse signal as a transmission signal, a positive amplitude pulse signal develops at one end of the secondary side coil L12 and a negative amplitude pulse signal appears at the other end of the same coil L12. When the transmission circuit Tx1 outputs a negative amplitude pulse signal as the transmission signal, a negative amplitude pulse signal develops at one end of the secondary side coil L12 and a positive amplitude pulse signal appears at the other end of the same coil L12. Thus the pulse signals with their amplitude directions different from each other develop at both ends of the secondary side coil L12. In other words, the pulse signals that are inverse to each other relative to the amplitude center potential appear at both ends of the secondary side coil L12. Meanwhile, an in-phase common mode voltage is overlaid over both ends of the secondary side coil L12. In the ensuing paragraphs, the amplitude status at only one of the two ends of the secondary side coil L12 may be explained where appropriate.

Figure 2:
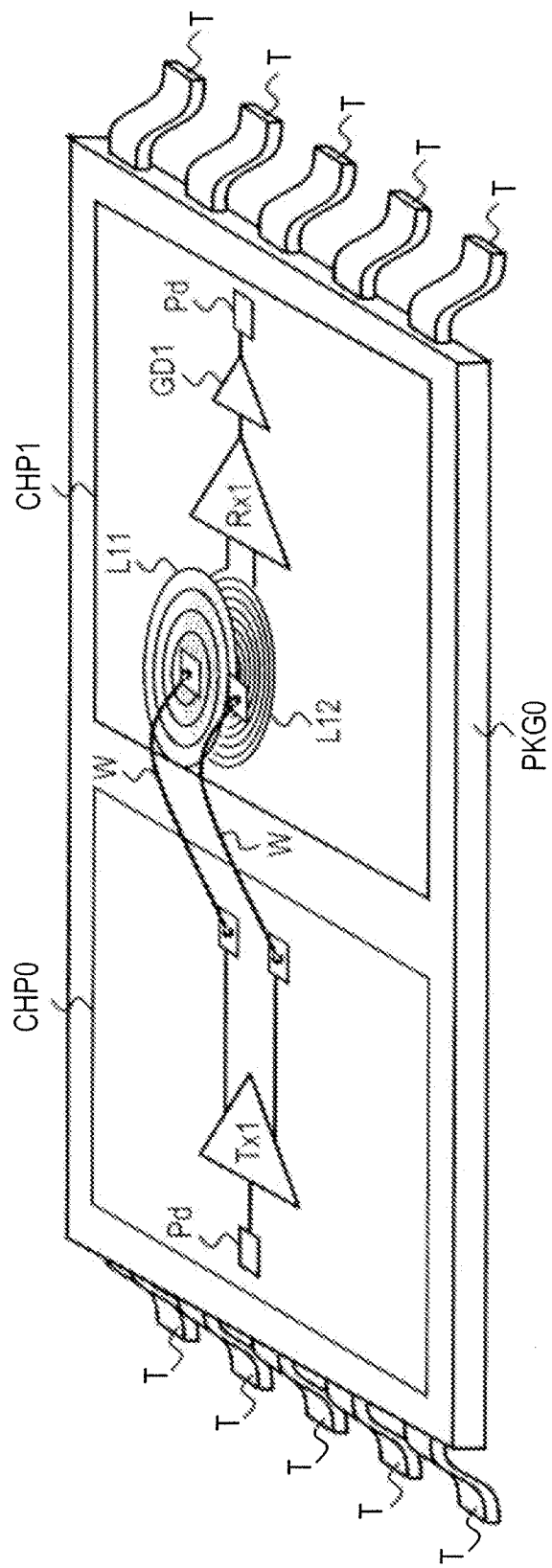
FIG. 2 is a schematic view showing how the semiconductor integrated circuit as the first embodiment is typically packaged.

FIG. 2 shows how the semiconductor integrated circuit 1 is typically packaged. FIG. 2 illustrates primarily how the transmission circuit, reception circuit, and isolation element ISO1 provided therebetween are packaged. As such, FIG. 2 does not indicate the control part CT1 and abnormality detection part DT1.

The packaged state in FIG. 2 shows the semiconductor chips CHP0 and CHP1 included in a semiconductor package PKG0. The semiconductor chips CHP0 and CHP1 have a pad Pd each. The pads Pd of the semiconductor chips CHP0 and CHP1 are coupled using bonding wires, not shown, to a plurality of lead terminals (external terminals) T furnished over the semiconductor package PKG0.

As shown in FIG. 2, the transmission circuit Tx1 is included in the semiconductor chip CHP0. The reception circuit Rx1, primary side coil L11, secondary side coil L12, and gate driver GD1 are included in the semiconductor chip CHP1. The semiconductor chip CHP0 also includes pads coupled to the output of the transmission circuit Tx1, and the semiconductor chip CHP1 includes pads coupled to both ends of the primary side coil L11. By way of these pads and bonding wires W, the transmission circuit Tx1 is coupled to the primary side coil L11 formed over the semiconductor chip CHP1.

In the example shown in FIG. 2, the primary side coil L11 and secondary side coil L12 are formed, respectively, in a first wiring layer and a second wiring layer stacked one on top the other within one semiconductor chip.

Also explained below by reference to FIG. 1 is a typical detailed configuration of the semiconductor integrated circuit 1. The transmission circuit Tx1 operates from the first power source belonging to the first power source system. The reception circuit Rx1, gate driver GD1, abnormality detection part DT1, and control part CT1 operate from the second power source belonging to the second power source system.

The transmission circuit Tx1 converts the transmission data VIN to a pulse signal that is output as a transmission signal. The isolation element ISO1 forwards the transmission signal from the transmission circuit Tx1 to the reception circuit Rx1 as a reception signal. Specifically, the transmission signal output from the transmission circuit Tx1 is first converted to a magnetic signal by the primary side coil L11. The secondary side coil L12 generates a reception signal having a voltage level reflecting the magnetic field change of the primary side coil L11 and outputs the generated signal to the reception signal Rx1. Thus the transmission signal from the transmission circuit Tx1 is sent via the isolation element ISO1 to the reception circuit Rx1 as the reception signal.

Based on the reception signal from the isolation element ISO1, the reception circuit Rx1 reproduces the transmission data VIN and outputs the reproduced data as output data VOUT.

The abnormality detection part DT1 detects an abnormality that can cause a malfunction in signal transmission via the isolation element ISO1 and outputs a detection result ER1. For example, upon detection of an abnormality, the abnormality detection part DT1 outputs a high-level detection result ER1. When no such abnormality is detected, the abnormality detection part DT1 outputs a low-level detection result ER1. The abnormality detection part DT1 will be discussed later in more detail.

Upon detection of an abnormality by the abnormality detection part DT1, the control part CT1 outputs a stop signal to turn off the power transistor PTr1 regardless of the output data VOUT from the reception circuit Rx1. In other words, if the abnormality detection part DT1 detects an abnormality, the control part CT1 outputs a stop signal to turn off the power transistor PTr1 regardless of the transmission data VIN supplied to the transmission circuit Tx1 from outside. For example, when the detection result ER1 is at the high level, the control part outputs a low-level stop signal regardless of the output data VOUT (i.e., regardless of the transmission data VIN). When the detection result ER1 is at the low level, the control part CT1 outputs the output data VOUT unchecked.

The gate driver GD1 drives the output signal from the control part CT1 so as to output a gate control signal OUT. At the power transistor PTr1, the collector is supplied with the source voltage HVDD having a voltage value higher than the source voltage VDD1, and the gate is fed with the gate control signal OUT from the gate driver GD1. The emitter of the power transistor PTr1 outputs the load drive signal Vcm.

Thus if the detection result ER1 from the abnormality detection part DT1 is at the low level, i.e., if any abnormality that can cause a malfunction in signal transmission via the isolation element ISO1 is not detected, the conduction state of the power transistor PTr1 is controlled on the basis of the output data VOUT from the reception circuit Rx1. At this point, the power transistor PTr1 may be turned on when the output data VOUT is at the high level and turned off when the output data VOUT is at the low level, for example.

Meanwhile, if the detection result ER1 from the error detection part DT1 is at the high level, i.e., if an abnormality that can cause a malfunction in signal transmission via the isolation element ISO1 is detected, the power transistor PTr1 is controlled to be forcibly turned off regardless of the output data VOUT.

(Timing Chart)

Figure 3:
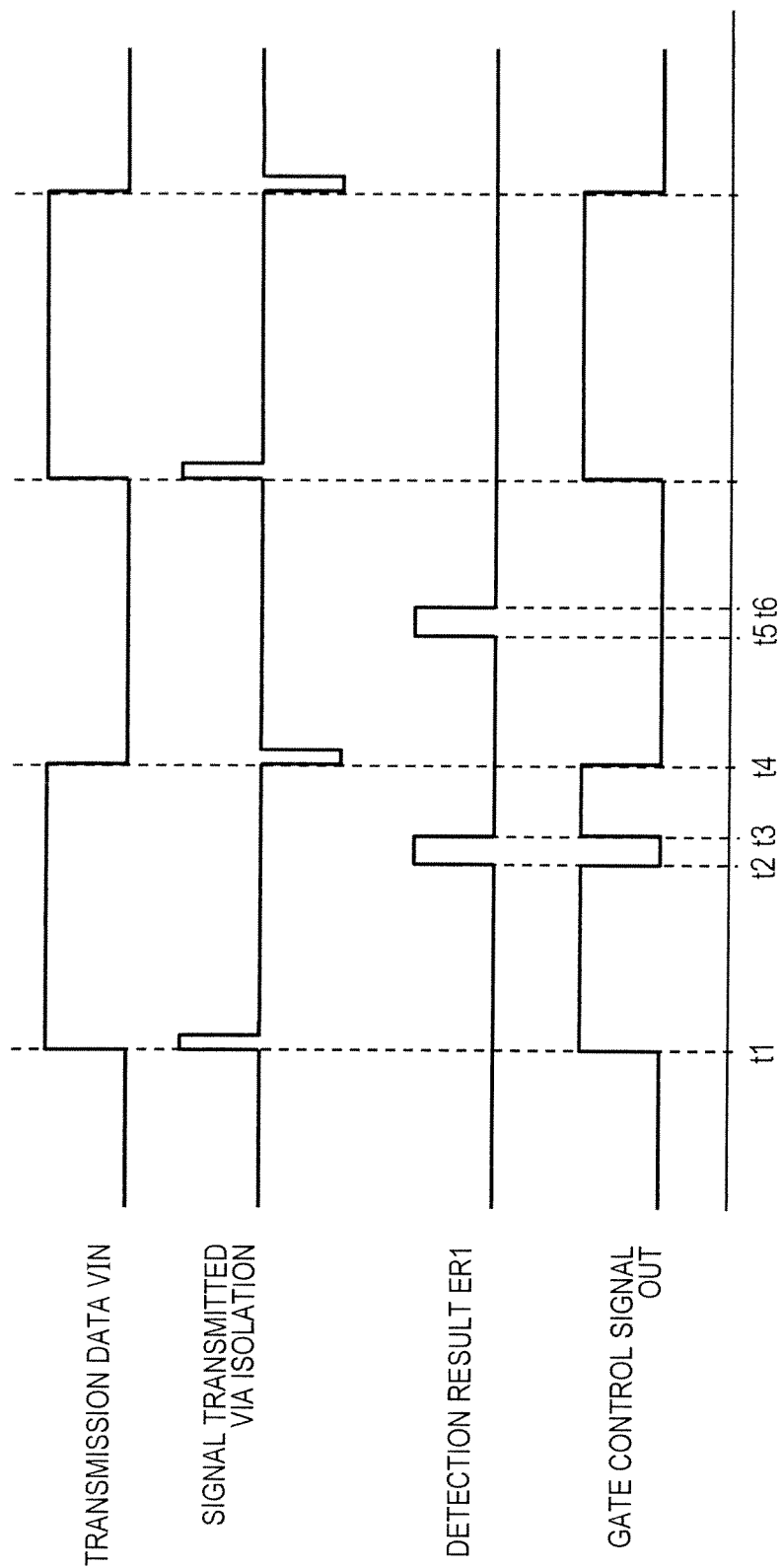
FIG. 3 is a timing chart showing typical operations of the semiconductor integrated circuit as the first embodiment.

Explained below by reference to FIG. 3 are some typical workings of the semiconductor integrated circuit as the first embodiment of the invention. FIG. 3 is a timing chart showing typical operations of the semiconductor integrated circuit 1. The method of signal transmission illustrated in FIG. 3 may be adopted when the AC coupling element such as the transformer, capacitor, or GMR element isolator is used as the isolation element ISO1. The signal transmission method shown in FIG. 3 is used not only for signal transmission via the isolation element ISO1 but also for signal transmission through other isolation elements to be discussed later.

In the example of FIG. 3, the transmission circuit Tx1 outputs a positive amplitude pulse signal as the transmission signal in synchronism with a rising edge of the transmission data VIN and a negative amplitude pulse signal as the transmission signal in synchronism with a falling edge of the transmission data VIN. The isolation element ISO1 forwards the transmission signal from the transmission circuit Tx1 as the reception signal to the reception circuit Rx1. On receiving the positive amplitude pulse signal as the reception signal, the reception circuit Rx1 drives the output data VOUT high; upon receipt of the negative amplitude pulse signal as the reception signal, the reception circuit Rx1 drives the output data VOUT low. In this manner, the reception circuit Rx1 reproduces the transmission data VIN to output the output data VOUT.

According to the signal transmission method shown in FIG. 3, the reception circuit Rx1 may have a hysteresis comparator as an output-stage circuit, for example. When the voltage level of the reception signal (or its equivalent) is higher than a threshold voltage Vth+ on the high-level side, the hysteresis comparator outputs high-level output data VOUT. When the voltage level of the reception signal (or its equivalent) is lower than a threshold voltage Vth− on the low-level side, the hysteresis comparator outputs low-level output data VOUT. Thus on receiving the positive amplitude pulse signal as the reception signal, the hysteresis comparator drives the output data VOUT high; upon receipt of the negative amplitude pulse signal as the reception signal, the hysteresis comparator drives the output data VOUT low.

As shown in FIG. 3, the transmission data VIN changes from low level to high level at time t1. This causes the transmission circuit Tx1 to output a positive amplitude pulse signal as the transmission signal (at time t1). On receiving the positive amplitude pulse signal as the reception signal, the reception circuit Rx1 drives the output data VOUT high (at time t1). At this point, there is no abnormality that may cause a malfunction in signal transmission via the isolation element ISO1. Consequently the abnormality detection part DT1 outputs a low-level detection result ER1. Thus the control part CT1 outputs the output data VOUT from the reception circuit Rx1 unchecked. Since the output data VOUT is at the high level, the gate control signal OUT also becomes high, which turns on the power transistor PTr1.

Suppose that there has since occurred an abnormality that can cause a malfunction in signal transmission via the isolation element ISO1. In this case, the abnormality detection part DT1 outputs a high-level detection result ER1 as long as the abnormality is present (from time t2 to time t3). Thus the control part CT1 outputs a low-level stop signal regardless of the output data VOUT (i.e., regardless of the transmission data VIN). This drives the gate control signal OUT low, which forcibly turns off the power transistor PTr1.

When the abnormality disappears, the abnormality detection part DT1 changes the detection result ER1 from high level to low level (at time t3). This causes the control part CT1 to again start outputting the output data VOUT from the reception circuit Rx1 unchecked. That is, the control part CT1 cancels the stop signal. Because the output data VOUT is at the high level, the gate control signal OUT also becomes high, which turns on the power transistor PTr1 (from time t3 to time t4).

Thereafter, the transmission data VIN changes from high level to low level at time t4. This causes the transmission circuit Tx1 to output a negative amplitude pulse signal as the transmission signal (at time t4). On receiving the negative amplitude pulse signal as the reception signal, the reception circuit Rx1 drives the output data VOUT low (at time t4). At this point, there is no abnormality that may cause a malfunction in signal transmission via the isolation element ISO1. Consequently the abnormality detection part DT1 outputs a low-level detection result ER1. Thus the control part CT1 outputs the output data VOUT from the reception circuit Rx1 unchecked. Since the output data VOUT is at the low level, the gate control signal OUT also becomes low, which turns off the power transistor PTr1.

Suppose that there later occurred an abnormality that can cause a malfunction in signal transmission via the isolation element ISO1. In this case, the abnormality detection part DT1 outputs a high-level detection result ER1 as long as the abnormality is present (from time t5 to time t6). Thus the control part CT1 outputs a low-level stop signal regardless of the output data VOUT (i.e., regardless of the transmission data VIN). This drives the gate control signal OUT low, which forcibly turns off the power transistor PTr1. That is, the power transistor PTr1 is kept turned off.

When the abnormality disappears, the abnormality detection part DT1 changes the detection result ER1 from high level to low level (at time t6). This causes the control part CT1 to again start outputting the output data VOUT from the reception circuit Rx1 unchecked. That is, the control part CT1 cancels the stop signal. Because the output data VOUT is at the low level, the gate control signal OUT also becomes low, which keeps the power transistor PTr1 off (at time t6).

As explained above, upon detection of an abnormality that can cause a malfunction in signal transmission via the isolation element ISO1 on the side of the semiconductor chip CHP1, the semiconductor integrated circuit 1 embodying the present invention forcibly turns off the power transistor PTr1 that is the target to be controlled. The inventive semiconductor integrated circuit 1 thus prevents the power transistor PTr1 from getting inadvertently turned on and thereby forestalls the malfunction of the load.

Figure 4:
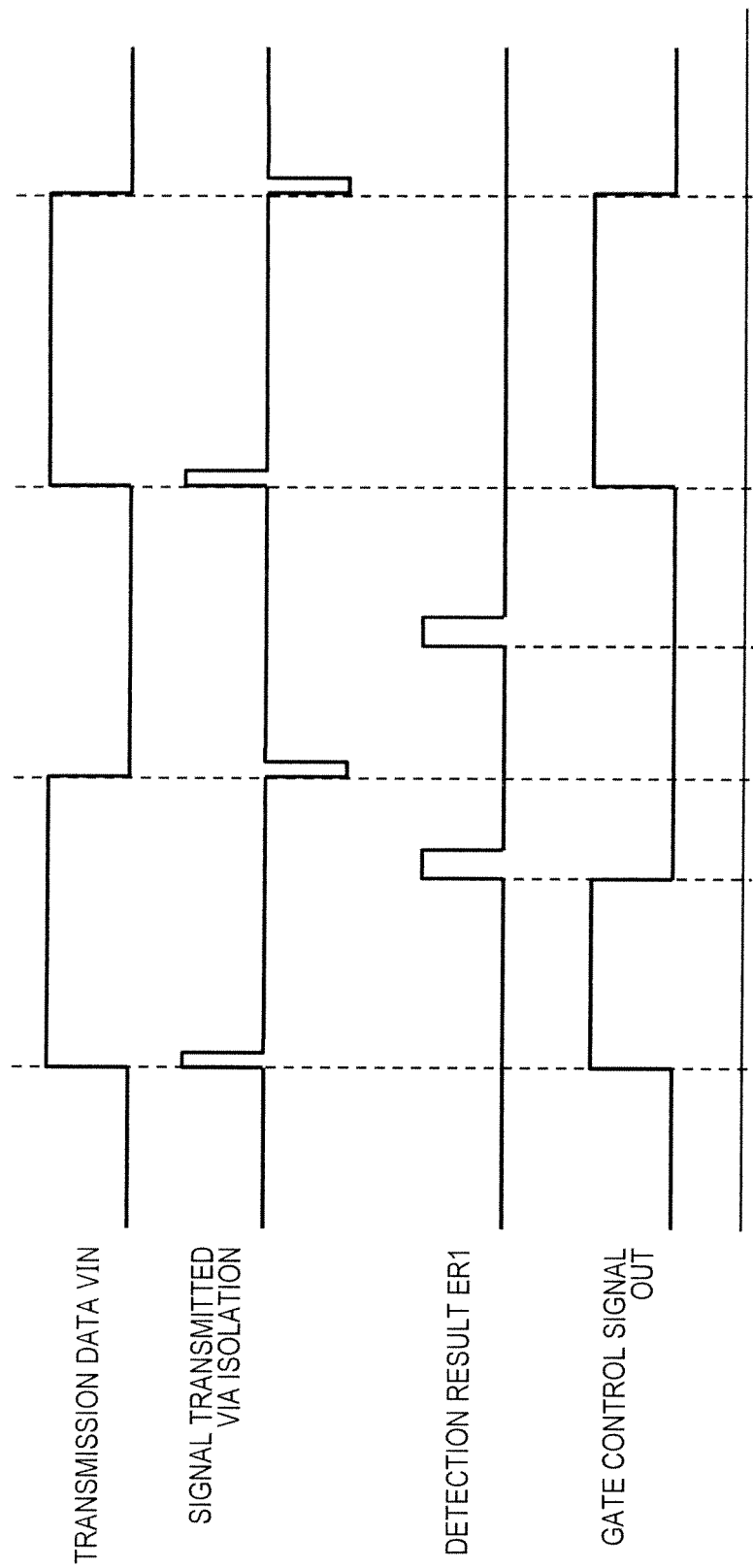
FIG. 4 is a timing chart showing other typical operations of the semiconductor integrated circuit as the first embodiment.

The first embodiment above was shown having the control part CT1 furnished separately from the reception circuit Rx1. Alternatively, the control part CT1 may be incorporated as part of the reception circuit Rx1. The same holds for the relationship between other control parts to be discussed later on the one hand and the reception circuit on the other hand. For example, the control part CT1 may be incorporated in the hysteresis comparator attached to the reception circuit Rx1. The hysteresis comparator is configured to output the low-level output data VOUT in synchronism with a rising edge of the detection result ER1. In this case, even when the detection result ER1 changes from high level to low level following disappearance of the abnormality, the reception circuit Rx1 keeps outputting the low-level output data VOUT until a logical value change occurs in the transmission data VIN (see FIG. 4). In other words, after the abnormality detected by the abnormality detection part is no longer detected, the reception circuit Rx1 cancels the stop signal in synchronism with a first logical value change in the transmission data VIN.

(Typical Configurations of the Abnormality Detection Part DT1 and Control Part CT1)

Figure 5:
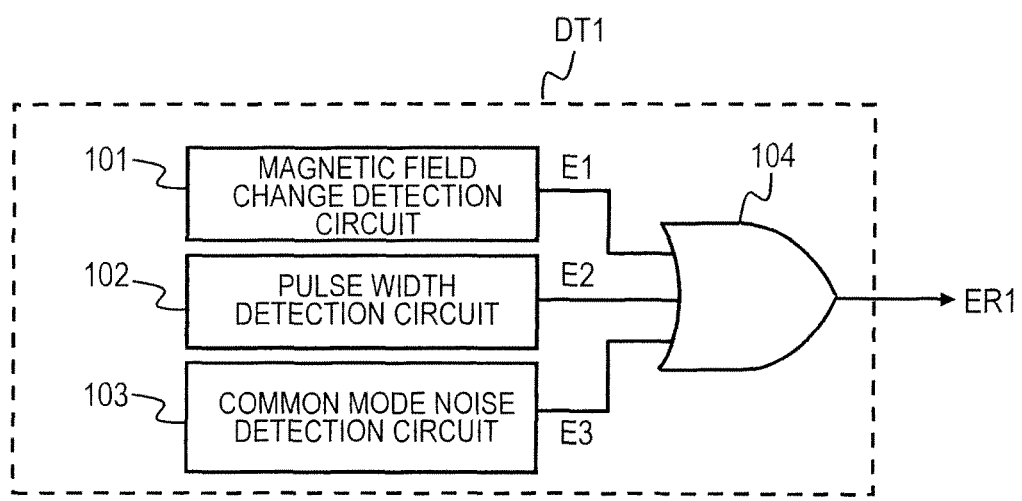
FIG. 5 is a circuit diagram showing a typical configuration of an abnormality detection part in the first embodiment.

FIG. 5 shows a typical configuration of the abnormality detection part DT1. As shown in FIG. 5, the abnormality detection part DT1 has a plurality of detection circuits for detecting an abnormality that can cause a malfunction in signal transmission via the isolation element ISO1. Specifically, the abnormality detection part DT1 includes a magnetic field change detection circuit 101, a pulse width detection circuit 102, a common mode noise detection circuit 103, and an OR circuit 104 that outputs the OR of the results from these circuits as the detection result ER1. When at least one of these detection circuits has detected an abnormality, the abnormality detection part DT1 outputs a high-level detection result ER1. When none of the detection circuits detects an abnormality, the abnormality detection part DT1 outputs a low-level detection result ER1.

Figure 6:
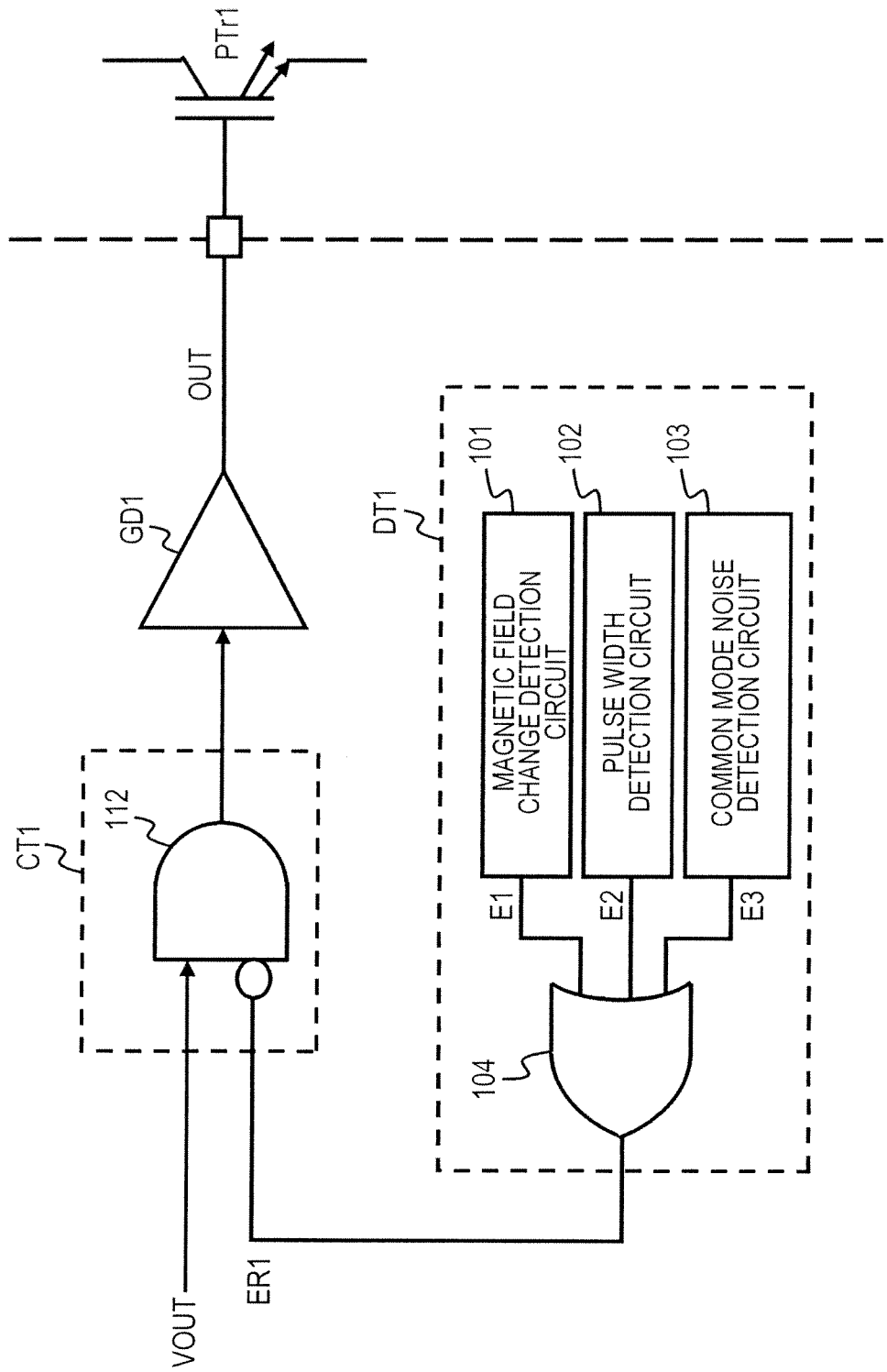
FIG. 6 is a circuit diagram showing a typical configuration of a control part and some of its peripheral circuitry in the first embodiment.

FIG. 6 shows a specific configuration of the control part CT1 and some of its peripheral circuitry. As shown in FIG. 6, the control part CT1 has an AND circuit 112 that outputs the AND of the output data VOUT from the reception circuit Rx1 and of a reversal value of the detection result ER1 from the abnormality detection circuit DT1.

For example, when the detection result ER1 is at the low level, i.e., when any abnormality that can cause a malfunction in signal transmission via the isolation element ISO1 is not detected, the AND circuit 112 outputs the output data VOUT unchecked to the gate driver GD1. This allows the conduction state of the power transistor PTr1 to be controlled in accordance with the output data VOUT from the reception circuit Rx1. On the other hand, when the detection result ER1 is at the high level, i.e., when an abnormality that can cause a malfunction in signal transmission via the isolation element ISO1 is detected, the AND circuit 112 outputs a low-level stop signal to the gate driver GD1 regardless of the output data VOUT (i.e., regardless of the transmission data VIN). This causes the power transistor PTr1 to be forcibly turned off.

What follows are explanations of specific configurations of the detection circuits in the abnormality detection circuit DT1 and their typical operations.

(Magnetic Field Change Detection Circuit 101)

The magnetic field change detection circuit 101 is a circuit that detects magnetic field changes exceeding a predetermined threshold range. In the transformer used as the isolation element ISO1, an electromotive force is induced in keeping with magnetic field changes. An increasing magnetic field change leading to a growing induced electromotive force can trigger a malfunction in signal transmission via the isolation element ISO1. Thus if the induced electromotive force caused by the magnetic field change exceeds the predetermined threshold range, the magnetic field change detection circuit 101 determines that an abnormality that would potentially cause a malfunction in signal transmission via the isolation element ISO1 has occurred.

Figure 7:
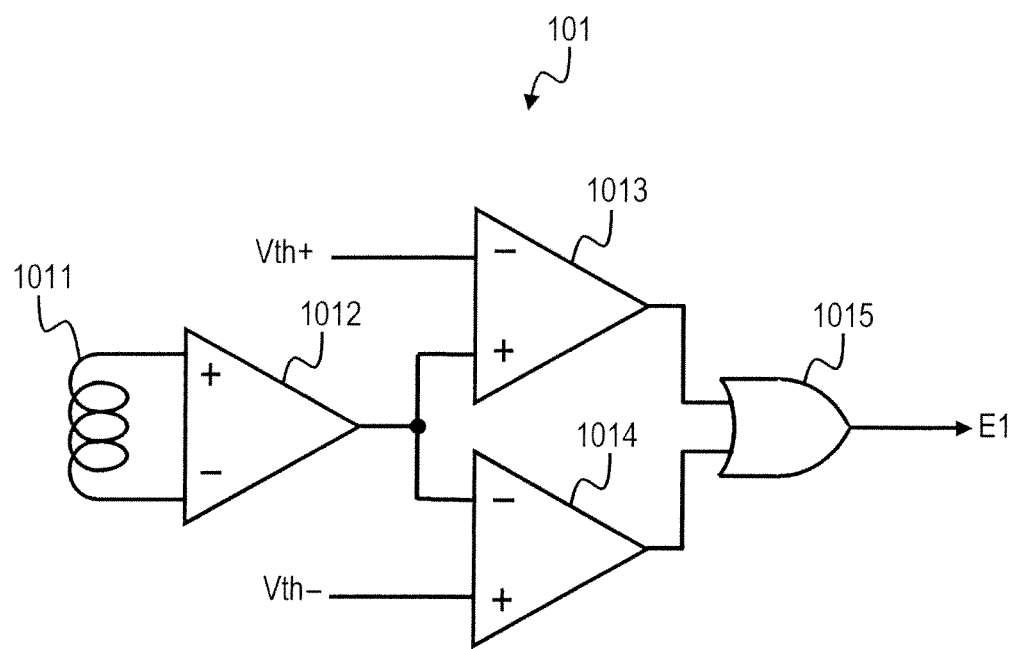
FIG. 7 is a circuit diagram showing a typical configuration of a magnetic field change detection circuit in the first embodiment.
Figure 8:
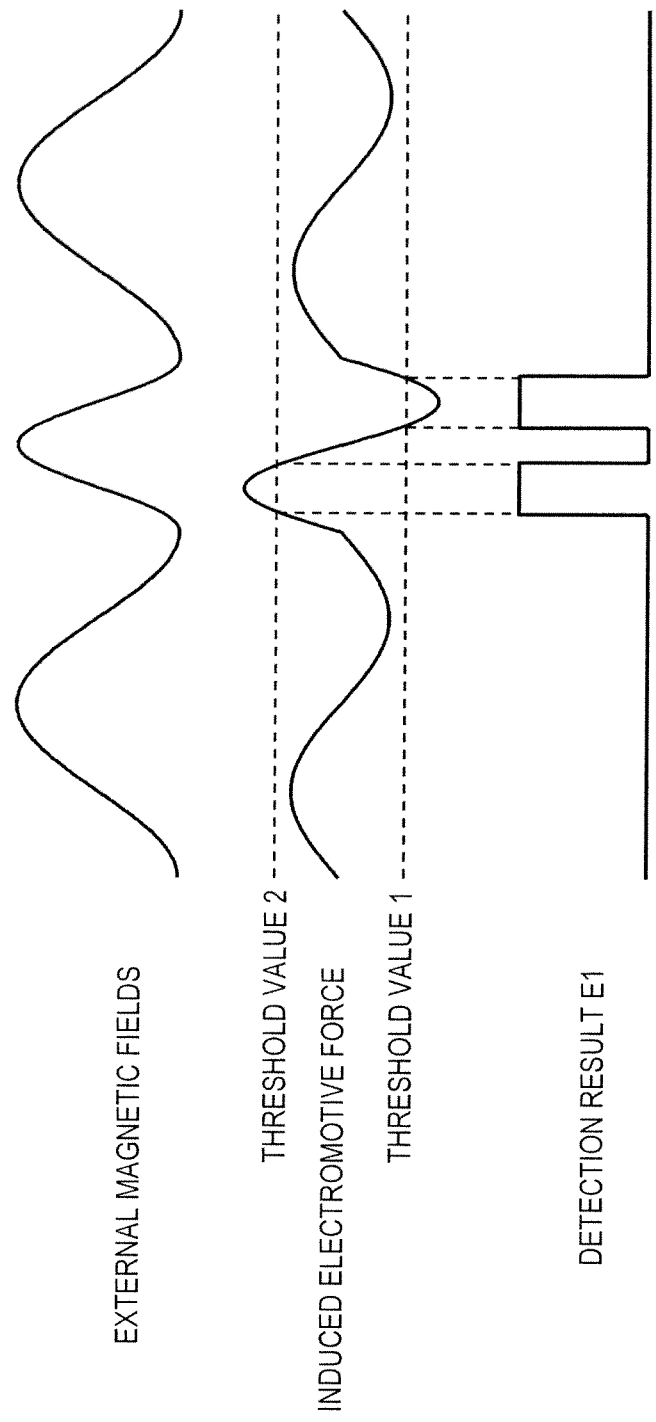
FIG. 8 is a timing chart showing typical operations of the magnetic field change detection circuit in the first embodiment.

FIG. 7 shows a typical configuration of the magnetic field change detection circuit 101. FIG. 8 is a timing chart showing typical operations of the magnetic field change detection circuit 101. As shown in FIG. 7, the magnetic field change detection circuit 101 includes a coil 1011, comparators 1012 through 1014, and an OR circuit 1015. An electromotive force reflecting magnetic field changes is induced in the coil 1011. A potential difference corresponding to the magnetic field change then develops between the two ends of the coil 1011. The comparator 1012 outputs the result of the comparison reflecting the potential difference between the two ends of the coil 1011.

The comparator 1013 compares the threshold voltage Vth+ on the high-level side with the comparison result from the comparator 1012 and outputs the result of the comparison. The comparator 1014 compares the threshold voltage Vth− on the low-level side with the comparison result from the comparator 1012 and outputs the result of the comparison. The OR circuit 1015 outputs the OR of the comparison result from the comparator 1013 and of the comparison result from the comparator 1014 as a detection result E1.

If the electromotive force induced in the coil by the magnetic field change falls within the predetermined threshold range (Vth− through Vth+), the magnetic field change detection circuit 101 determines that any abnormality that can cause a malfunction in signal transmission via the isolation element ISO1 has not occurred, and outputs a low-level detection result E1. If the electromotive force induced in the coil by the magnetic field change exceeds the predetermined threshold range, the magnetic field change detection circuit 101 determines that an abnormality that can cause a malfunction in signal transmission via the isolation element ISO1 has occurred and outputs a high-level detection result E1.

Incidentally, the magnetic field change detection circuit 101 detects abnormalities effectively regarding the type of isolation element ISO1 that is vulnerable to the effects of magnetic fields. Specifically, the magnetic field change detection circuit 101 detects abnormalities effectively where the transformer or GMR element isolator is used as the isolation element ISO1.

Figure 9:
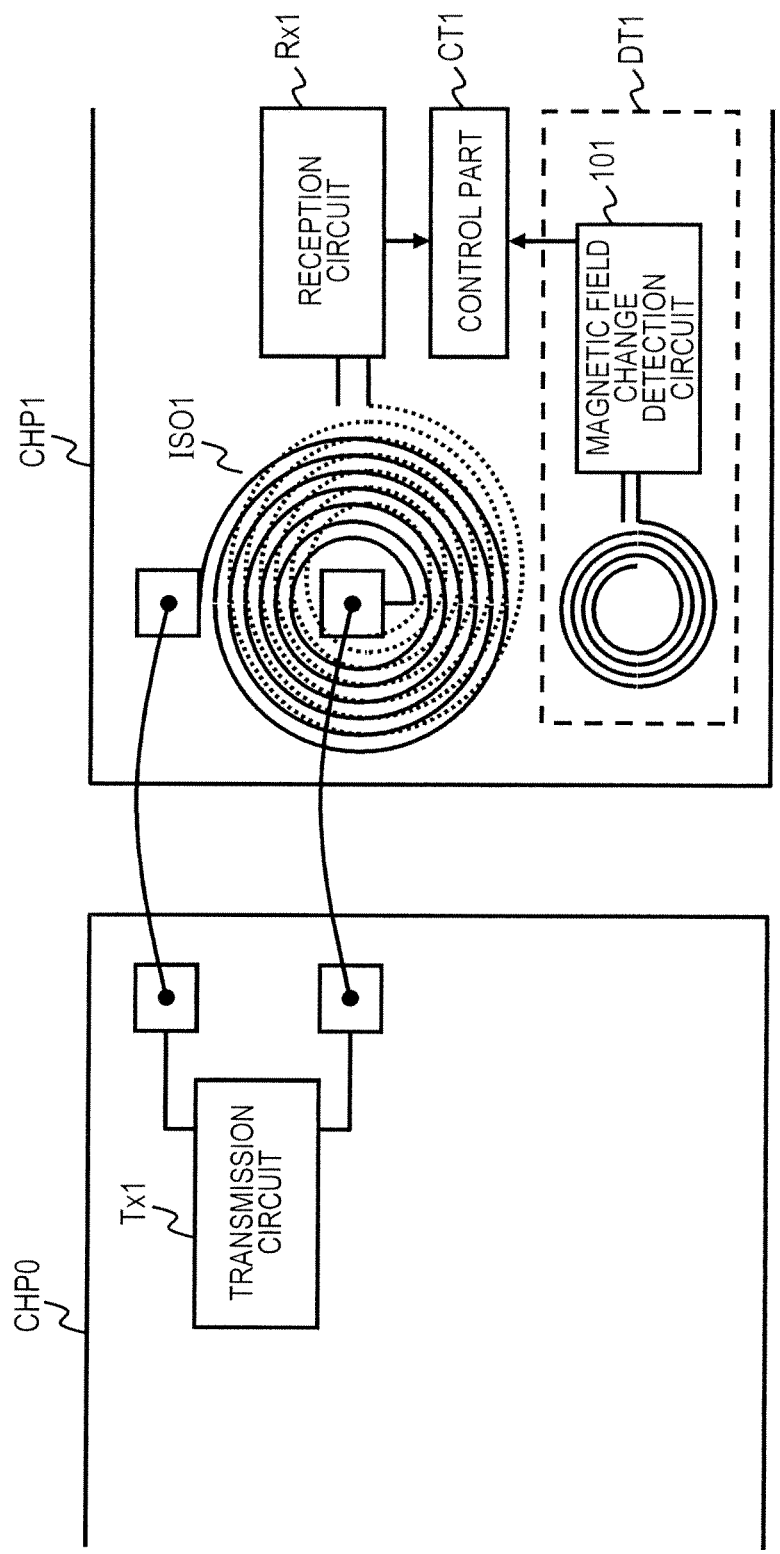
FIG. 9 is a schematic view showing a typical layout of the magnetic field change detection circuit in the first embodiment.

FIGS. 9 and 10 show typical layouts of the magnetic field change detection circuit 101. As shown in FIGS. 9 and 10, the coil of the magnetic field change detection circuit 101 should preferably be positioned close to the isolation element ISO1 so that the coil will be exposed to magnetic fields at a level equivalent to that of the magnetic fields sustained by the isolation element ISO1. FIG. 10 shows a typical layout in which the isolation element ISO1 is formed on the side of the semiconductor chip CHP0.

(Pulse Width Detection Circuit 102)

The pulse width detection circuit 102 is a circuit that detects whether the interval between logical value changes in the reproduced transmission data VIN (i.e., output data VOUT) has become longer than a predetermined interval. In other words, the pulse width detection circuit 102 detects whether the pulse width of the output data VOUT has become greater than a predetermined width. Ordinarily, the signal for controlling the power transistor PTr1 is PWM-modulated so that its pulse width does not become greater than the predetermined width. That is, the power transistor PTr1 is not kept turned on longer than the predetermined interval. If the pulse width of the output data VOUT is greater than the predetermined width, there is a possibility that a malfunction has occurred in signal transmission via the isolation element ISO1. For that reason, if the pulse width of the output data VOUT turns out to be greater than the predetermined width, the pulse width detection circuit 102 determines that an abnormality that can cause a malfunction in signal transmission via the isolation element ISO1 has occurred.

Figure 11A:
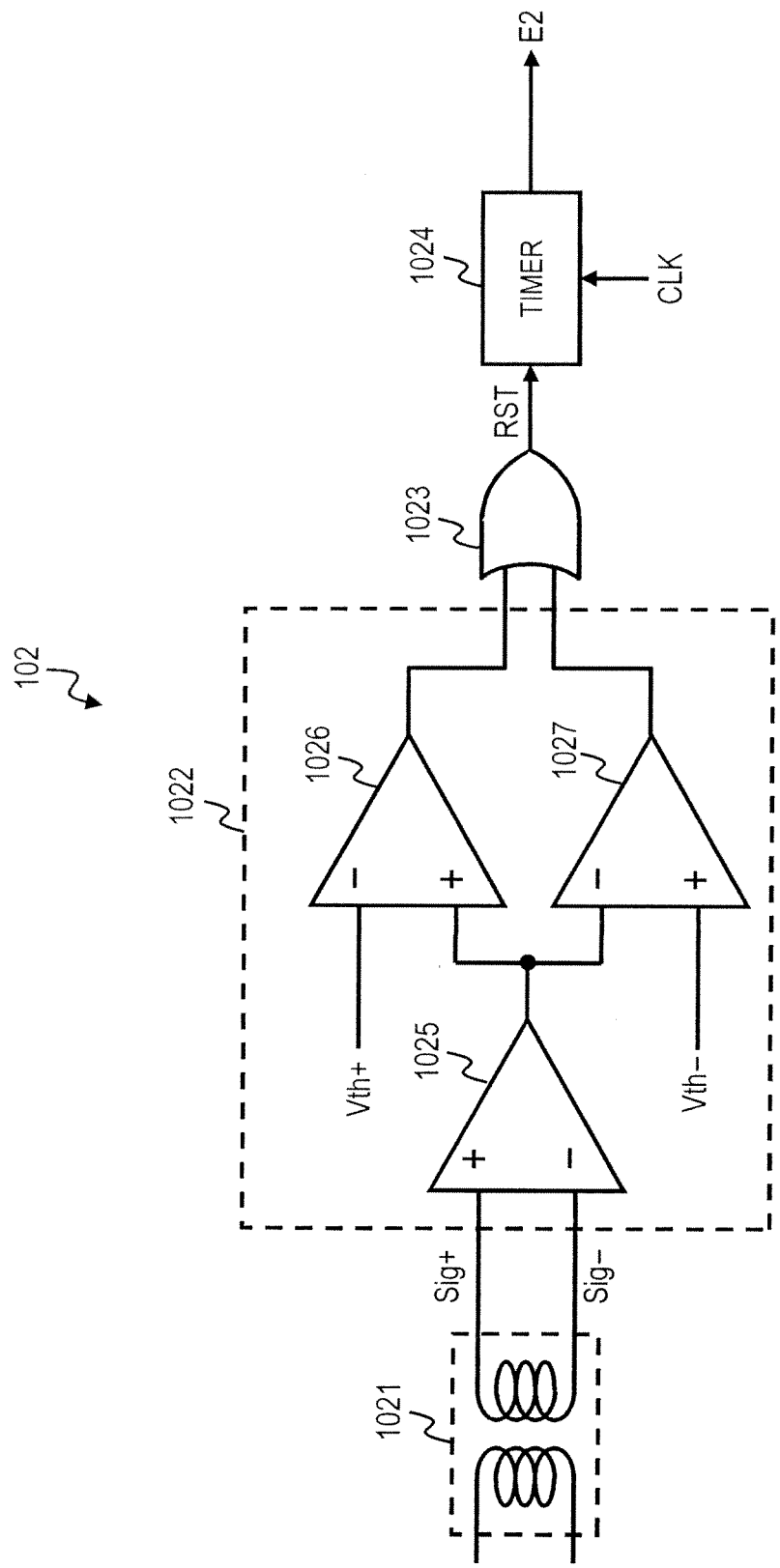
FIG. 11A is a circuit diagram showing a typical configuration of a pulse width detection circuit in the first embodiment.

FIG. 11A shows a typical configuration of the pulse width detection circuit 102. FIG. 11B is a timing chart showing typical operations of the pulse width detection circuit 102. As shown in FIG. 11A, the pulse width detection circuit 102 includes an isolation part 1021, a pulse detection part 1022, an OR circuit 1023, and a timer 1024. The pulse detection part 1022 has comparators 1025 through 1027.

The isolation part 1021 is configured the same as the isolation element ISO1. The isolation part 1021 forwards the transmission signal from the transmission circuit Tx1 to the pulse detection part 1022 as reception signals (Sig+, Sig−).

In the pulse detection part 1022, the comparator 1025 outputs the result of the comparison reflecting the potential difference between the reception signals (Sig+, Sig−) from the isolation part 1021. The comparator 1026 compares the threshold voltage Vth+ on the high-level side with the comparison result from the comparator 1025 and outputs the result of the comparison. The comparator 1027 compares the threshold voltage Vth− on the low-level side with the comparison result from the comparator 1025 and outputs the result of the comparison. The OR circuit 1023 outputs the OR of the comparison result from the comparator 1026 and of the comparison result from the comparator 1027 as a reset signal RST. Thus the reset signal RST is driven high every time a positive amplitude pulse signal and a negative amplitude pulse signal are transmitted as reception signals.

For example, the timer 1024 performs a count operation in synchronism with a clock signal CLK for counting purposes. Alternatively, the timer 1024 performs a count operation based on a constant current or a constant voltage for driving a time constant circuit. When the count value reaches a predetermined threshold value, the timer 1024 outputs a high-level detection result E2; otherwise the timer 1024 outputs a low-level detection result E2. The timer 1024 resets the count value to "0" in synchronism with a rising edge of the reset signal RST. Thus when the interval between rising edges of the reset signal RST is within a predetermined interval, i.e., when the interval between logical value changes in the reproduced transmission data VIN (output data VOUT) is within a predetermined interval, the timer 1024 resets the count value to "0" before the count value reaches the threshold value. Consequently the detection result E1 is kept at the low level. On the other hand, if the interval between rising edges of the reset signal RST exceeds the predetermined interval, i.e., if the interval between logical value changes in the reproduced transmission data VIN (output data VOUT) exceeds the predetermined interval, the detection result E2 becomes high because the count value on the timer 1024 has reached the threshold value.

As explained above, when the interval between logical value changes in the reproduced transmission data VIN (output data VOUT) is within the predetermined interval, the pulse width detection circuit 102 determines that any abnormality that can cause a malfunction in signal transmission via the isolation element ISO1 has not occurred, and outputs the low-level detection result E2. On the other hand, if the interval between logical value changes in the reproduced transmission data VIN (output data VOUT) exceeds the predetermined interval, the pulse width detection circuit 102 determines that an abnormality that can cause a malfunction in signal transmission via the isolation element ISO1 has occurred and outputs the high-level detection result E2.

(Variation of the Pulse Width Detection Circuit 102)

Figure 12:
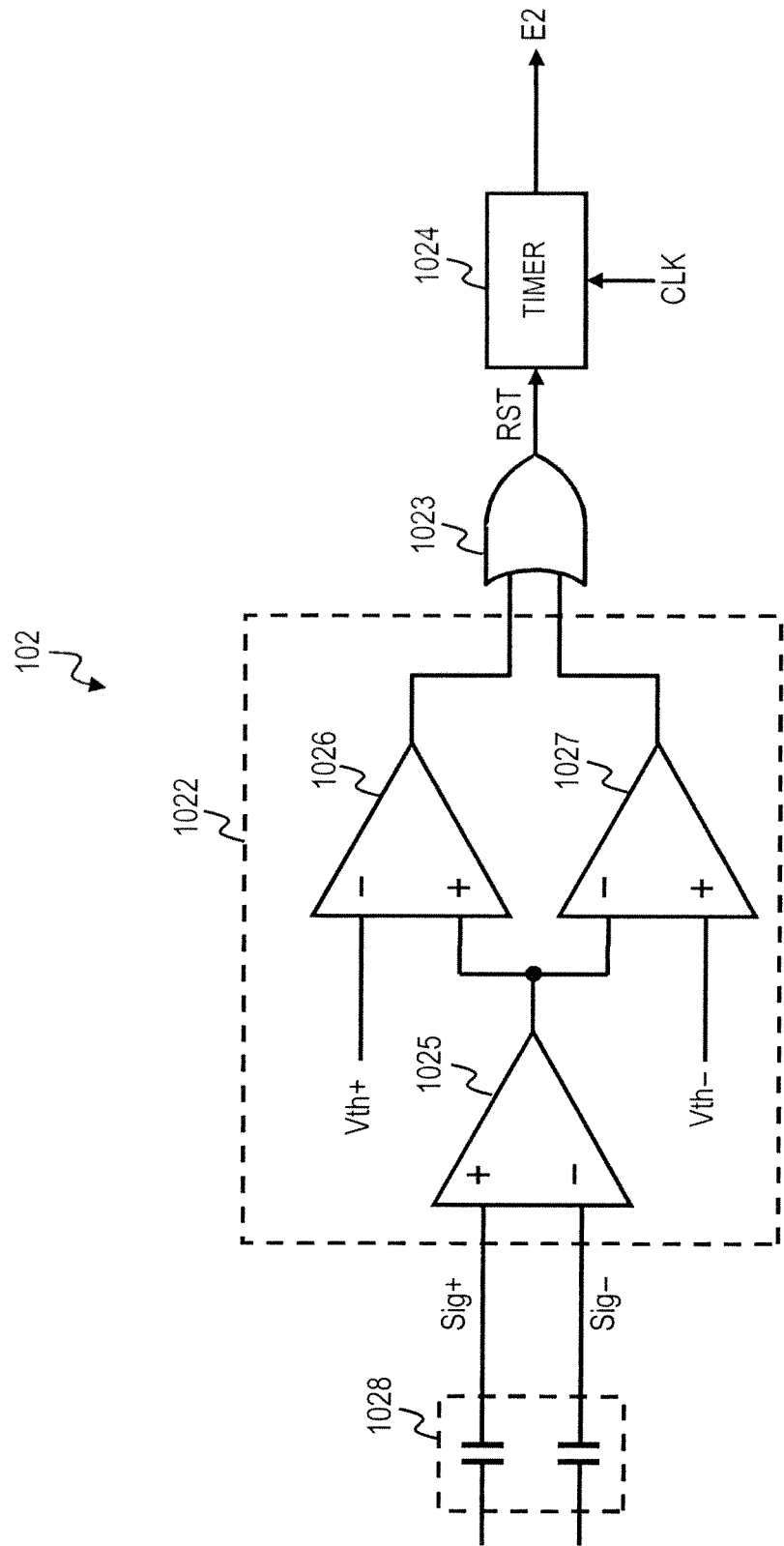
FIG. 12 is a circuit diagram showing a variation of the pulse width detection circuit in the first embodiment.

The pulse width detection circuit 102 can detect abnormalities not only when the transformer is used as the isolation element ISO1 but also where the capacitor, GMR element isolator, or photo-coupler is utilized as the isolation element ISO1. In these cases, the configuration of the isolation part 1021 is changed in keeping with the configuration of the isolation element ISO1. For example, if the capacitor is used as the isolation part ISO1, the isolation part 1021 is replaced with an isolation part 1028 comprised of a capacitor as shown in FIG. 12.

(Another Typical Configuration of the Pulse Width Detection Circuit)

Figure 13A:
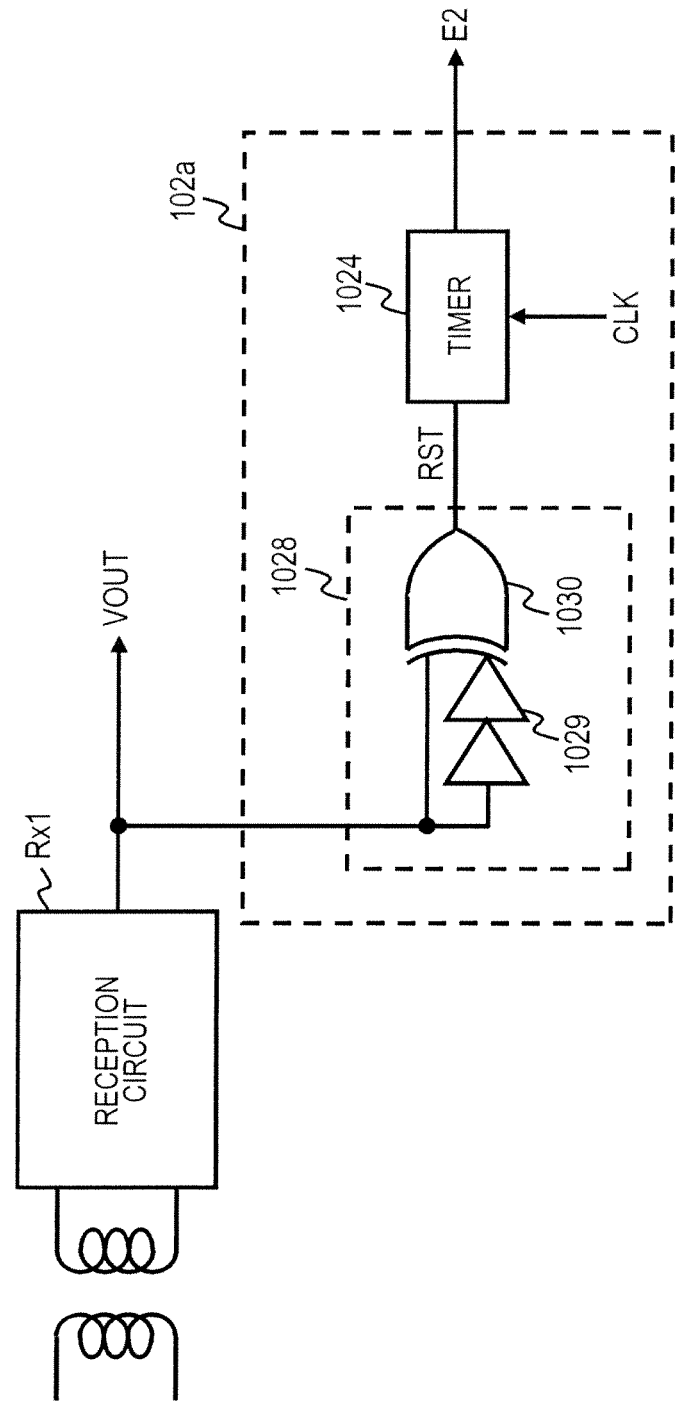
FIG. 13A is a circuit diagram showing another typical configuration of the pulse width detection circuit in the first embodiment.

FIG. 13A shows another typical configuration of the pulse width detection circuit 102 as a pulse width detection circuit 102a. FIG. 13B is a timing chart showing typical operations of the pulse width detection circuit 102a. As shown in FIG. 13A, the pulse width detection circuit 102a includes a logical value change detection circuit 1028 and a timer 1024. The logical value change detection circuit 1028 has a delay buffer 1029 and an exclusive-OR circuit 1030.

In the logical value change detection circuit 1028, the delay buffer 1029 outputs the output data VOUT from the reception circuit Rx1 after delaying it by a predetermined time period Td. The exclusive-OR circuit 1030 outputs the exclusive-OR of the output data VOUT and of the output from the delay buffer 1029 as a reset signal RST. Thus the exclusive-OR circuit 1030 drives the reset signal RST high in response to a logical value change in the output data VOUT and drives the reset signal RST low upon elapse of the predetermined time period Td. That is, the logical value change detection circuit 1028 drives the reset signal RST high every time the output data VOUT develops a logical value change.

The operation of the timer 1024 was explained above and thus will not be discussed further.

The pulse width detection circuit 102a shown in FIG. 13A also provides the same effects as the pulse width detection circuit 102 in FIG. 11A. In particular, unlike the pulse width detection circuit 102, the pulse width detection circuit 102a has no need for an isolation part and thus can minimize the increase in circuitry size. Also, the pulse width detection circuit 102a is easier to configure than the pulse width detection circuit 102. Furthermore, the pulse width detection circuit 102a can be used as the abnormality detection part regardless of the type of the isolation element ISO1 in use. That means the pulse width detection circuit 102a can also be used as the abnormality detection part in conjunction with a non-pulse time isolation element such as the photo-coupler. The configuration shown in FIG. 13A is not limitative of the pulse width detection circuit 102a; the pulse width detection circuit 102a may be configured differently while still offering equivalent functions.

(Common Mode Noise Detection Circuit 103)

The common mode noise detection circuit 103 is a circuit that detects whether common mode noise has exceeded a predetermined threshold range. Common mode noise refers to the noise generated due to the voltage difference (i.e., common mode voltage) between two power sources, one power source driving one semiconductor chip and the other power source driving another semiconductor chip. In this example, the common mode noise is the noise of which the cause is attributable to the voltage difference (common mode voltage) between a first power source (e.g., ground voltage GND0) driving the semiconductor chip CHP0 and a second power source (e.g., ground voltage GND1) driving the semiconductor chip CHP1. As fluctuations in the common mode voltage become more pronounced, the inter-power-source noise starts getting generated due to the parasitic coupling capacitance Cc produced in the isolation element ISO1, which may cause a malfunction in signal transmission via the isolation element ISO1. Thus if the common mode noise has exceeded the threshold range, the common mode noise detection circuit 103 determines that an abnormality that can cause a malfunction in signal transmission via the isolation element ISO1 has occurred.

Figure 14A:
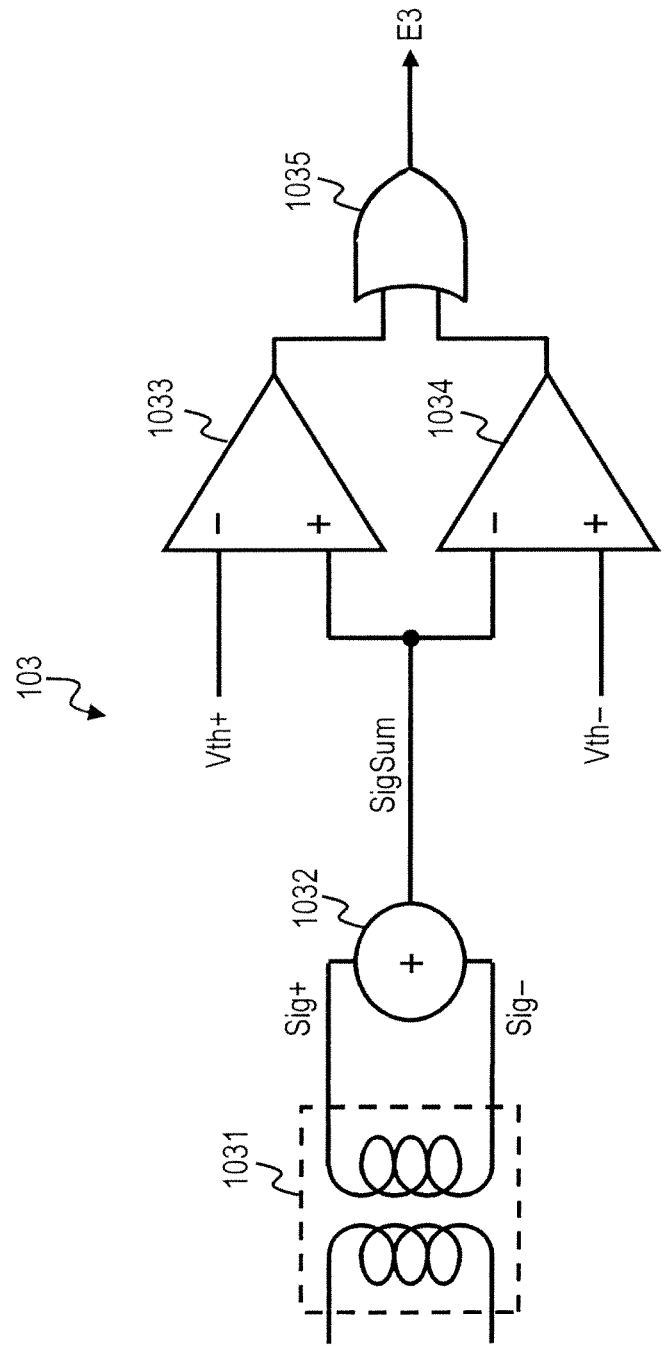
FIG. 14A is a circuit diagram showing a typical configuration of a common mode noise detection circuit in the first embodiment.

FIG. 14A is a typical configuration of the common mode noise detection circuit 103. FIG. 14B is a timing chart showing typical operations of the common mode noise detection circuit 103. The common mode noise detection circuit 103 shown in FIG. 14A includes an isolation part 1031, an adder circuit 1032, comparators 1033 and 1034, and an OR circuit 1035.

The isolation part 1031 is configured the same as the isolation element ISO1. The isolation part 1031 forwards the transmission signal from the transmission circuit Tx1 to the adder circuit 1032 as reception signals (Sig+, Sig−).

The adder circuit 1032 adds up the voltage of the reception signal (Sig+) and that of the reception signal (Sig−) to output a sum result SigSum. The comparator 1033 compares the threshold voltage Vth+ on the high-level side with the sum result SigSum from the adder circuit 1032 and outputs the result of the comparison. The comparator 1034 compares the threshold voltage Vth− on the low-level side with the sum result SigSum from the adder circuit 1032 and outputs the result of the comparison. The OR circuit 1035 outputs the OR of the comparison result from the comparator 1033 and of the comparison result from the comparator 1034 as a detection result E3.

As shown in FIG. 14B, the adder circuit 1032 gets the pulse signal overlaid on the reception signal (Sig+) and the pulse signal overlaid on the reception signal (Sig−) to cancel out each other, and adds up the in-phase common mode voltages overlaid on the reception signals (Sig+, Sig−) to output the sum. That is, the sum result SigSum from the adder circuit 1032 is a signal on which only the common mode voltage component is overlaid. If the sum result SigSum is higher than the threshold voltage Vth+, the comparator 1033 outputs a high-level comparison result; otherwise the comparator 1033 outputs a low-level comparison result. If the sum result SigSum is lower than the threshold voltage Vth−, the comparator 1034 outputs a high-level comparison result; otherwise the comparator 1034 outputs a low-level comparison result. Thus if the sum result SigSum exceeds the threshold voltage range of Vth− through Vth+, the OR circuit 1035 outputs a high-level detection result E3; otherwise the OR circuit 1035 outputs a low-level detection result E3.

As explained above, as long as the common mode noise falls within the predetermined threshold voltage, the common mode noise detection circuit 103 determines that any abnormality that can cause a malfunction in signal transmission via the isolation element ISO1 has not occurred and outputs the low-level detection result E3. On the other hand, if the common mode noise exceeds the predetermined threshold range, the common mode noise detection circuit 103 determines that an abnormality that can cause a malfunction in signal transmission via the isolation element ISO1 has occurred and outputs the high-level detection result E3.

(Variation of the Common Mode Noise Detection Circuit 103)

Figure 15:
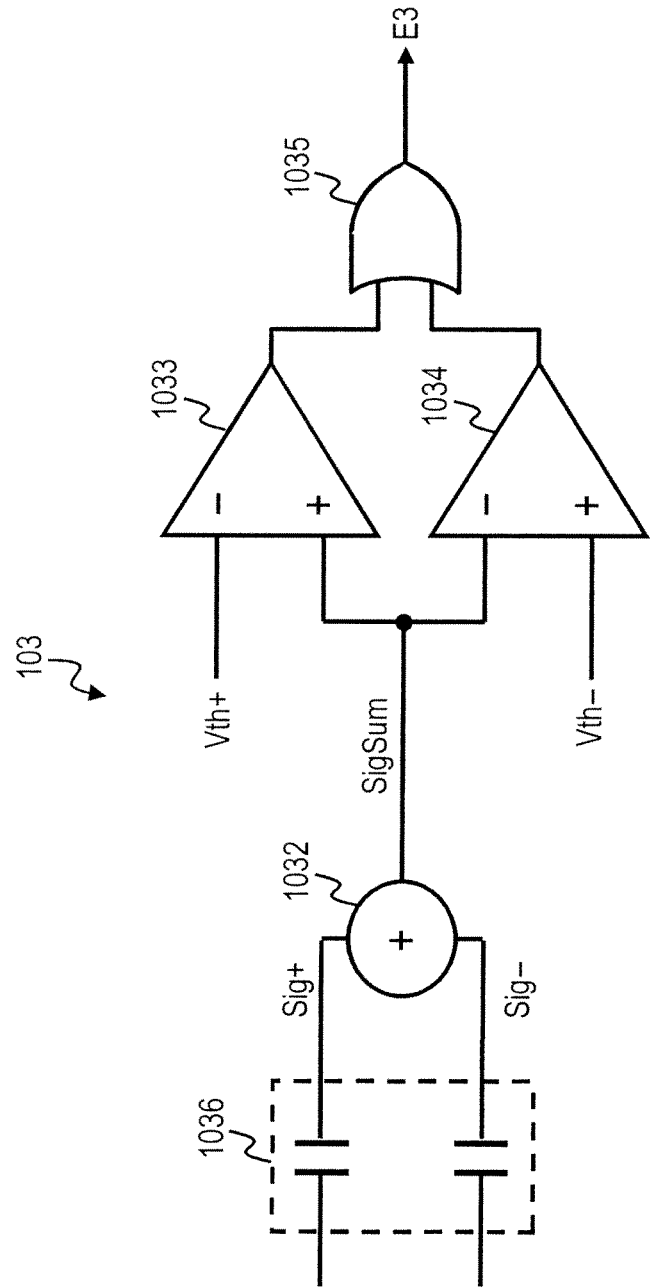
FIG. 15 is a circuit diagram showing a variation of the common mode noise detection circuit in the first embodiment.

The common mode noise detection circuit 103 can detect abnormalities not only when the transformer is used as the isolation element ISO1 but also where the capacitor, GMR element isolator, or photo-coupler is utilized as the isolation element ISO1. In these cases, the configuration of the isolation part 1031 is changed in keeping with the configuration of the isolation element 101. For example, if the capacitor is used as the isolation part ISO1, the isolation part 1031 is replaced with an isolation part 1036 comprised of a capacitor as shown in FIG. 15.

(Another Typical Configuration of the Common Mode Noise Detection Circuit)

Figure 16:
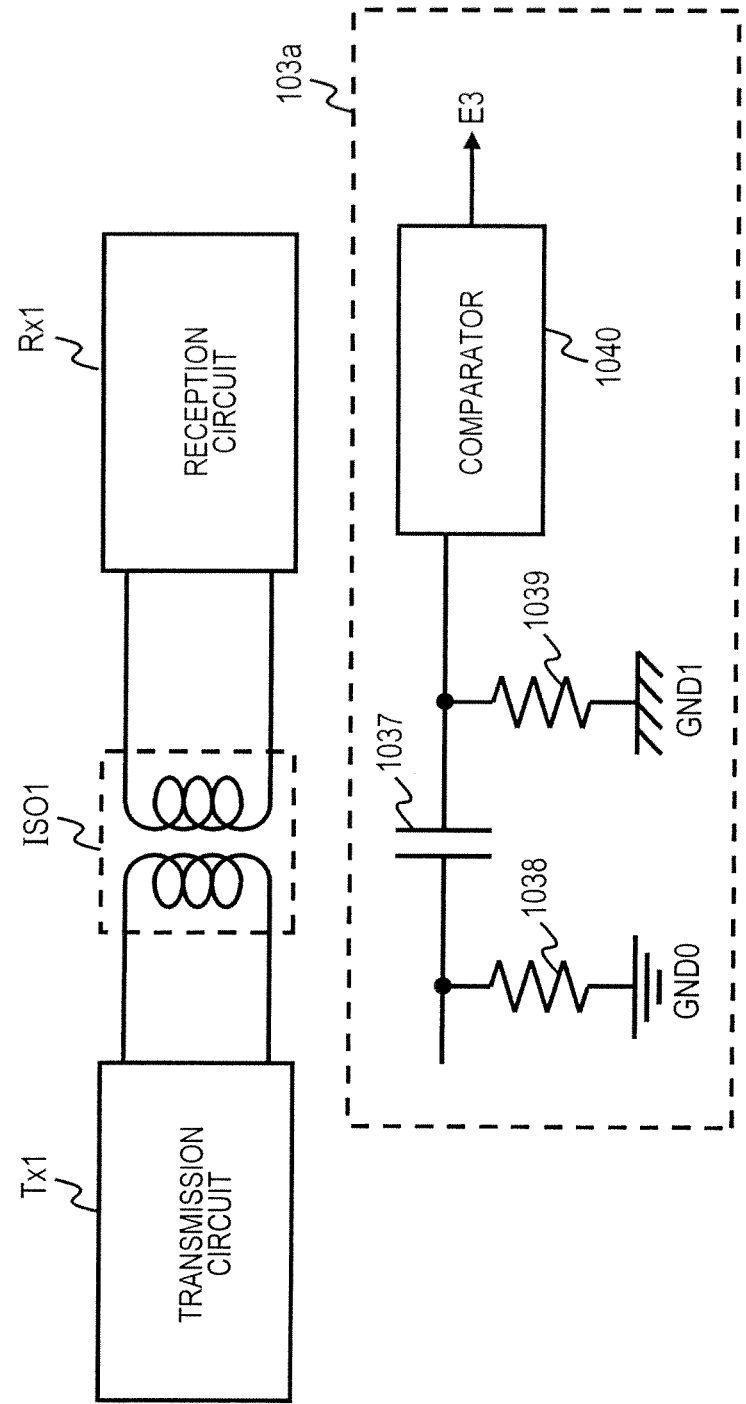
FIG. 16 is a circuit diagram showing another typical configuration of the common mode noise detection circuit in the first embodiment.

FIG. 16 is a circuit diagram showing another typical configuration of the common mode noise detection circuit 103 in the form of a common mode noise detection circuit 103a. The common mode noise detection circuit 103a shown in FIG. 16 includes a capacitor 1037 used as the isolation element, resistance elements 1038 and 1039, and a comparator 1040.

One electrode of the capacitor 1037 is supplied via the resistance element 1038 with the ground voltage GND0 that is the first power source. The other electrode of the capacitor 1037 is fed via the resistance element 1039 with the ground voltage GND1 that is the second power source. The comparator 1040 compares a predetermined threshold voltage with the voltage on the other electrode (on the second power source side) of the capacitor 1037 and outputs the result of the comparison (comparison result E3). Specifically, if the voltage on the other electrode of the capacitor 1037 is higher than the threshold voltage, the comparator 1040 outputs the high-level detection result E3; otherwise the comparator 1040 outputs the low-level comparison result E3.

Just as large fluctuations in the voltage difference (common mode voltage) between the ground voltage GND0 and the ground voltage GND1 can generate the inter-power-source noise due to the parasitic coupling capacitance C1 produced in the isolation element ISO, the capacitor 1037 can also incur an inter-power-source noise. This causes the voltage on the other electrode of the capacitor 1037 to fluctuate. The common mode noise detection circuit 103a shown in FIG. 16 determines that an abnormality that can cause a malfunction in signal transmission via the isolation element ISO1 has occurred if the capacitor 1037 has generated the inter-power-source noise (common mode noise) causing the other electrode (second power source side) of the capacitor 1037 to carry a voltage higher than the threshold voltage. That is, if the inter-power-source noise (common mode noise) attributable to the capacitor 1037 has exceeded the predetermined threshold range, the common mode noise detection circuit 103a shown in FIG. 16 determines that an abnormality that can cause a malfunction in signal transmission via the isolation element ISO1 has occurred.

Configured as explained above, the common mode noise detection circuit 103a also provides the same effects as the common mode noise detection circuit 103 shown in FIG. 14A.

Figure 17:
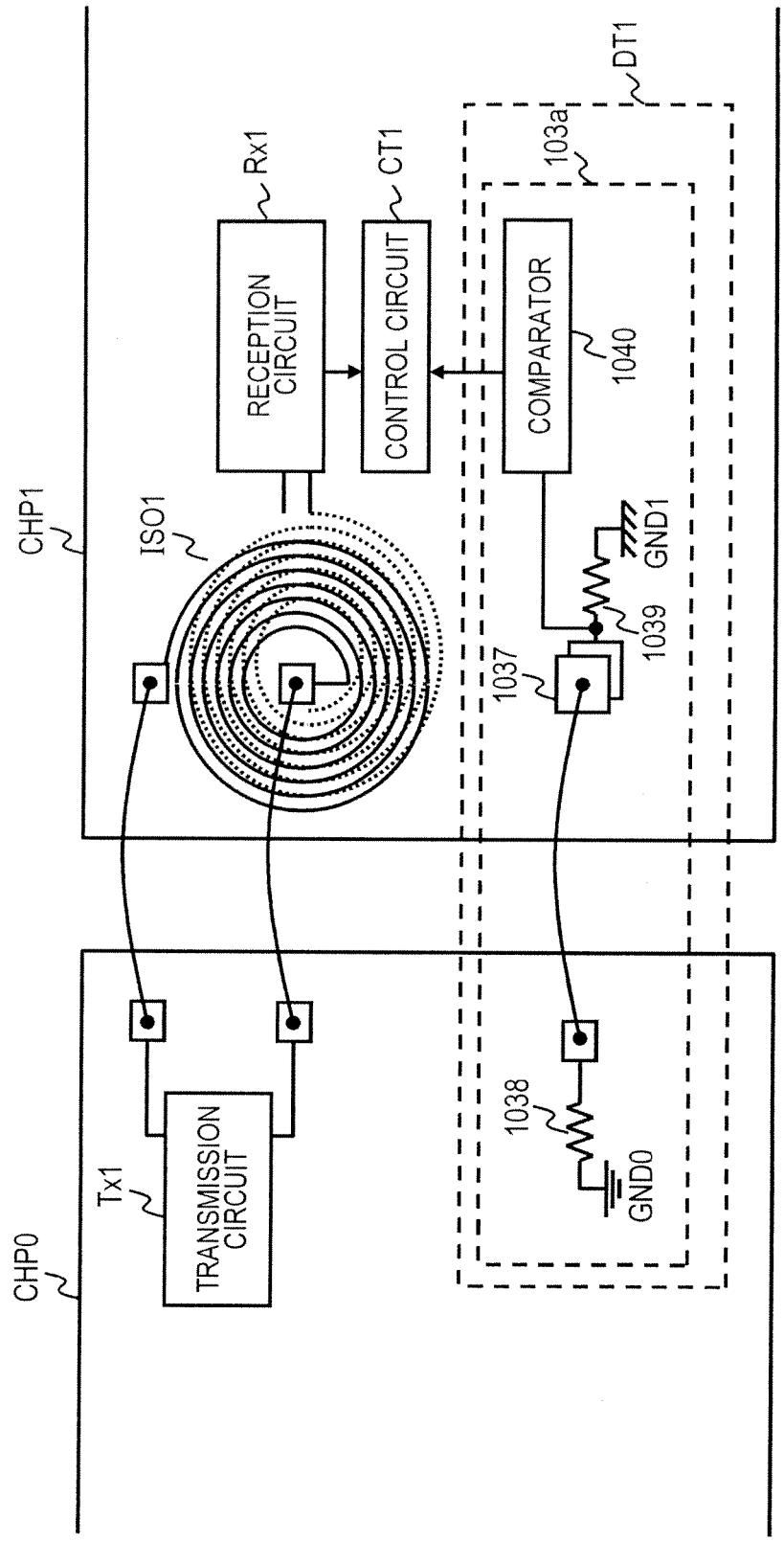
FIG. 17 is a schematic view showing a typical layout of the common mode noise detection circuit in the first embodiment.
Figure 18:
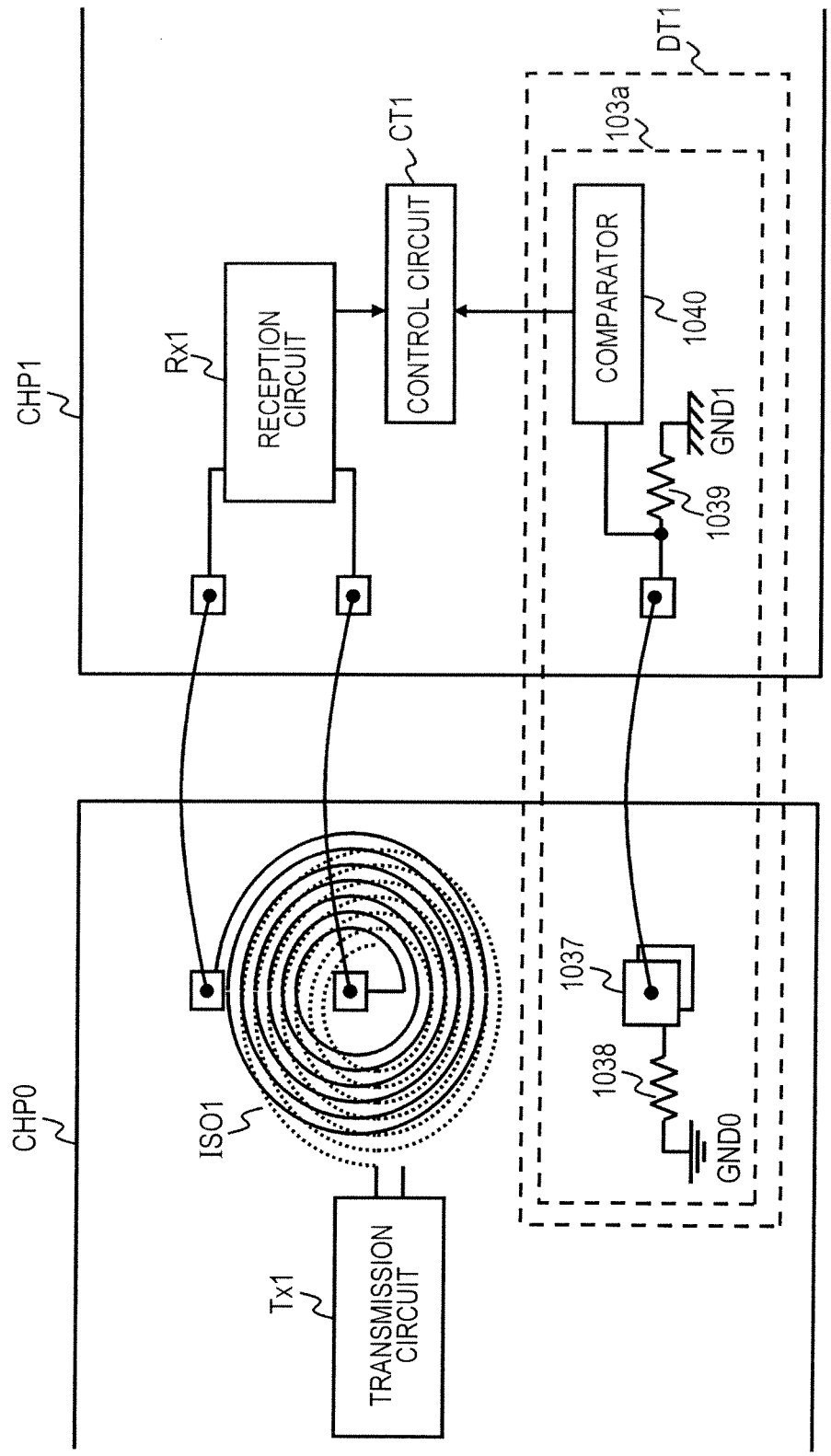
FIG. 18 is a schematic view showing another typical layout of the common mode noise detection circuit in the first embodiment.

FIGS. 17 and 18 show typical layouts of the common mode noise detection circuit 103a. As shown in FIGS. 17 and 18, the capacitor 1037 of the common mode noise detection circuit 103a should preferably be positioned close to the isolation element ISO1 so that the noise may be generated under conditions as similar as possible to those for the isolation element ISO1. FIG. 18 shows a layout example in which both the isolation element ISO1 and the capacitor 1037 are formed on the side of the semiconductor chip CHP0.

(Yet Another Typical Configuration of the Common Mode Noise Detection Circuit)

Figure 19A:
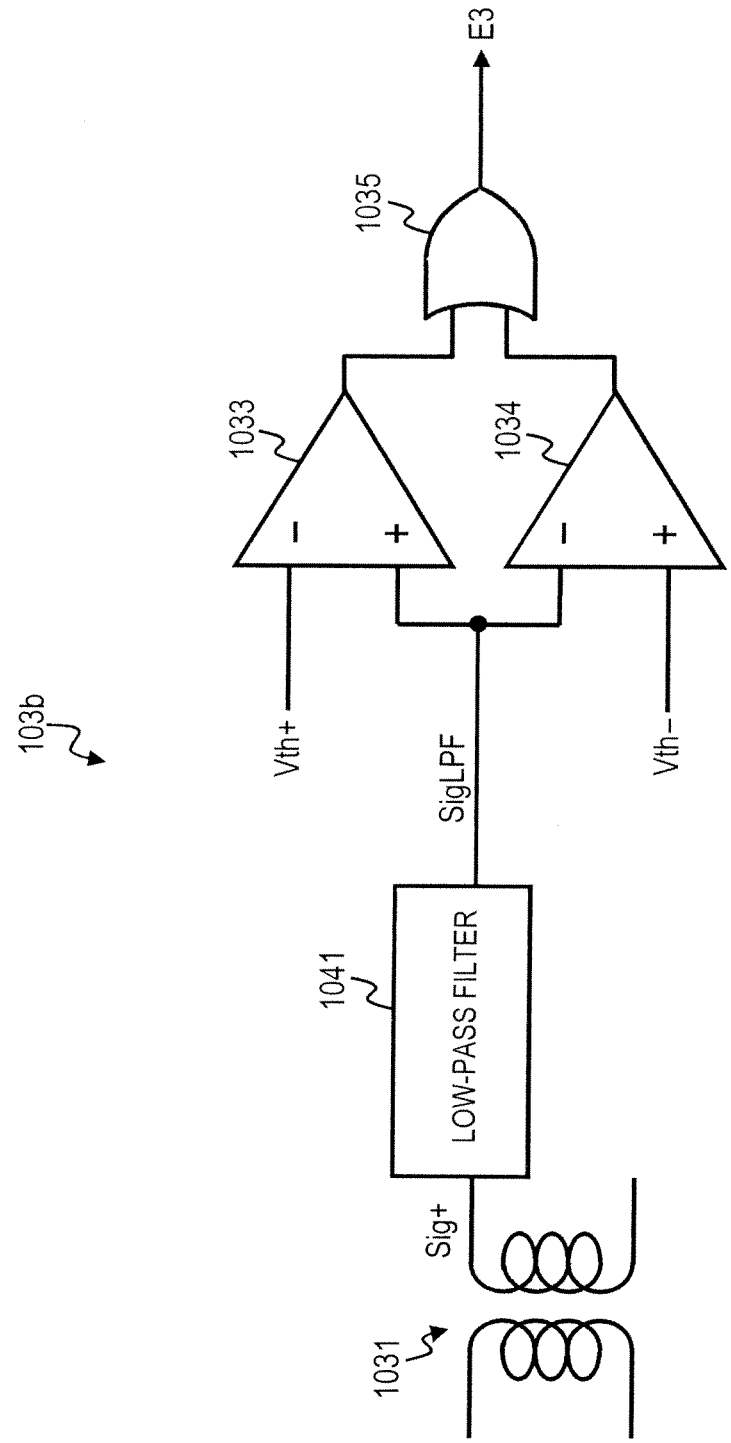
FIG. 19A is a circuit diagram showing another typical configuration of the common mode noise detection circuit in the first embodiment.
Figure 19B:
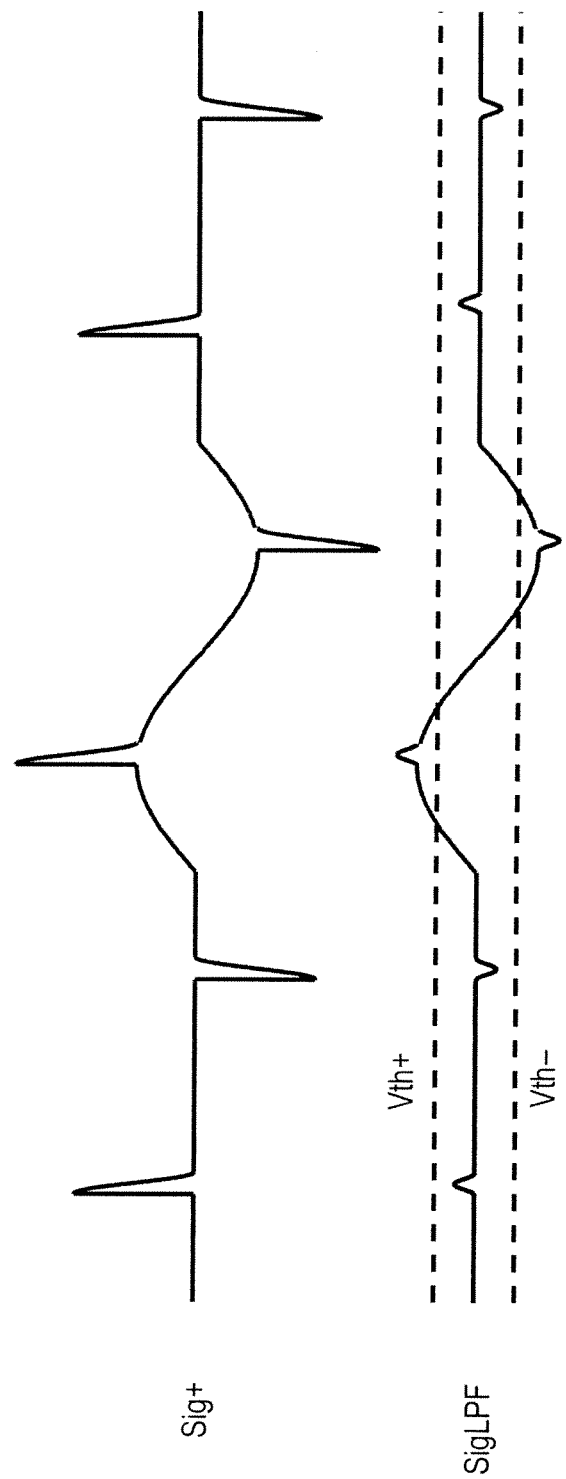
FIG. 19B is a timing chart showing typical operations of the common mode noise detection circuit in FIG. 19A.

FIG. 19A is a circuit diagram showing yet another typical configuration of the common mode noise detection circuit 103 in the form of a common mode noise detection circuit 103b. FIG. 19B is a timing chart showing typical operations of the common mode noise detection circuit 103b. As shown in FIG. 19A, the common mode noise detection circuit 103b includes an isolation part 1031, a low-pass filter 1041, comparators 1033 and 1034, and an OR circuit 1035.

As explained above, the isolation part 1031 forwards the transmission signal from the transmission circuit Tx1 as a reception circuit Sig+ (voltage at one end of the secondary side coil).

The low-pass filter 1041 extracts the common mode noise component overlaid on the reception signal Sig+ and outputs the extracted component as a signal SigLPF.

If the signal SigLPF from the low-pass filter 1041 is higher than the threshold voltage Vth+ on the high-level side, the comparator 1033 outputs a high-level comparison result; otherwise the comparator 1033 outputs a low-level comparison result. If the signal SigLPF from the low-pass filter 1041 is lower than the threshold voltage Vth− on the low-level side, the comparator 1034 outputs a high-level comparison result; otherwise the comparator 1034 outputs a low-level comparison result. Thus when the signal SigLPF (i.e., common mode noise component) from the low-pass filter 1041 exceeds the threshold voltage range of Vth− through Vth+, the OR circuit 1035 outputs the high-level detection result E3; otherwise the OR circuit 1035 outputs the low-level detection result E3.

The common mode noise detection circuit 103b shown in FIG. 19A also provides the same effects as the common mode noise detection circuit 103 in FIG. 14A.

(Typical Configuration of the Abnormality Detection Part DTX1)

In the examples above, the control part CT1 was explained as outputting the stop signal only if the abnormality detection part DT1 has detected an abnormality. Alternatively, the control part CT1 may be configured differently so as to output the stop signal not only when the abnormality is detected by the abnormality detection part DT1 but also where other abnormalities are detected.

Figure 20:
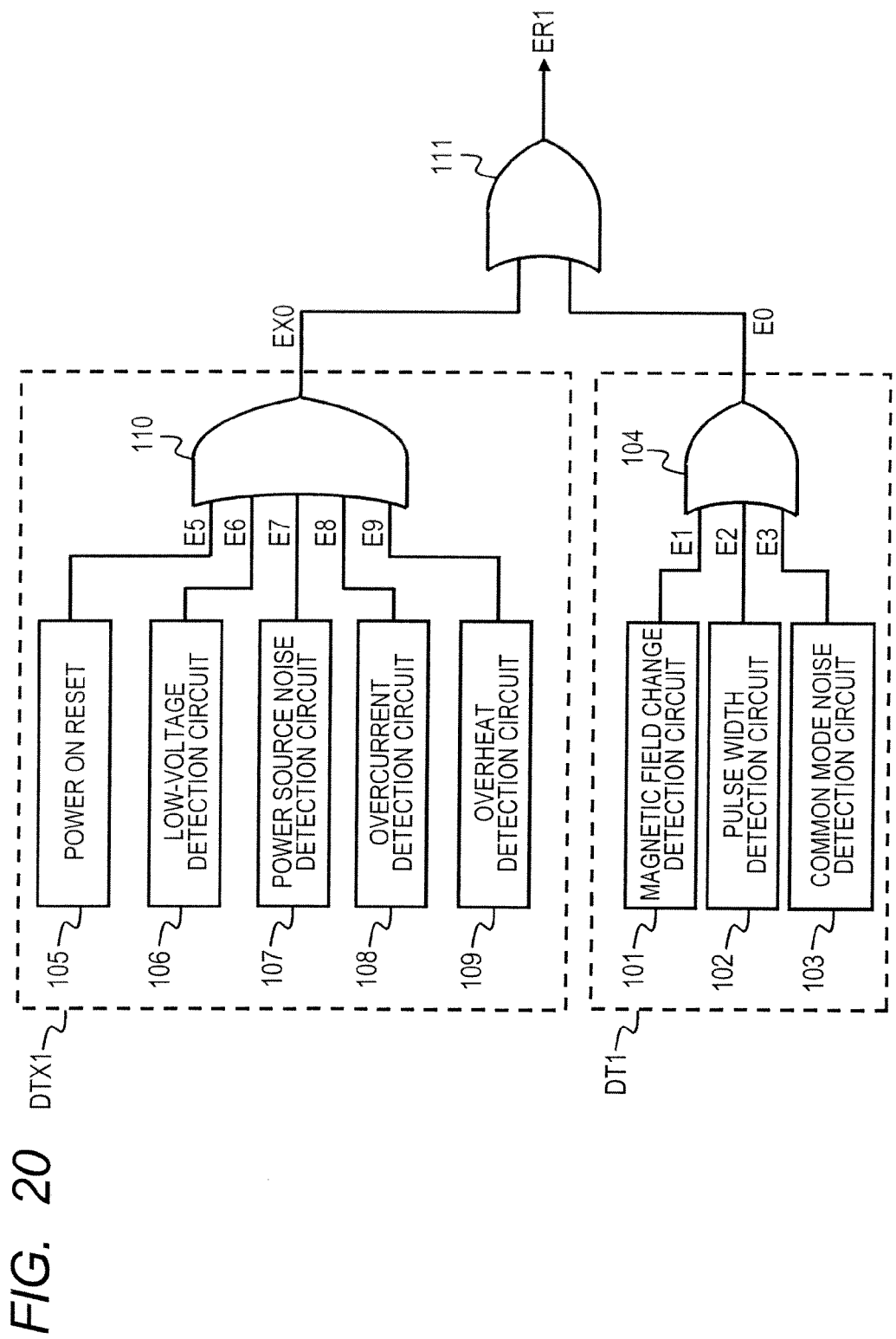
FIG. 20 is a circuit diagram partially showing a variation of the semiconductor integrated circuit as the first embodiment.

FIG. 20 shows a variation of the semiconductor integrated circuit 1, i.e., a configuration of the semiconductor integrated circuit 1 supplemented with an abnormality detection part DTX1 for detecting other abnormalities. FIG. 20 shows only the abnormality detection circuit DT1, abnormality detection circuit DTX1, and an OR circuit 111. The ensuing explanation will primarily deal with the configuration and operations of the abnormality detection part DTX1.

Figure 21:
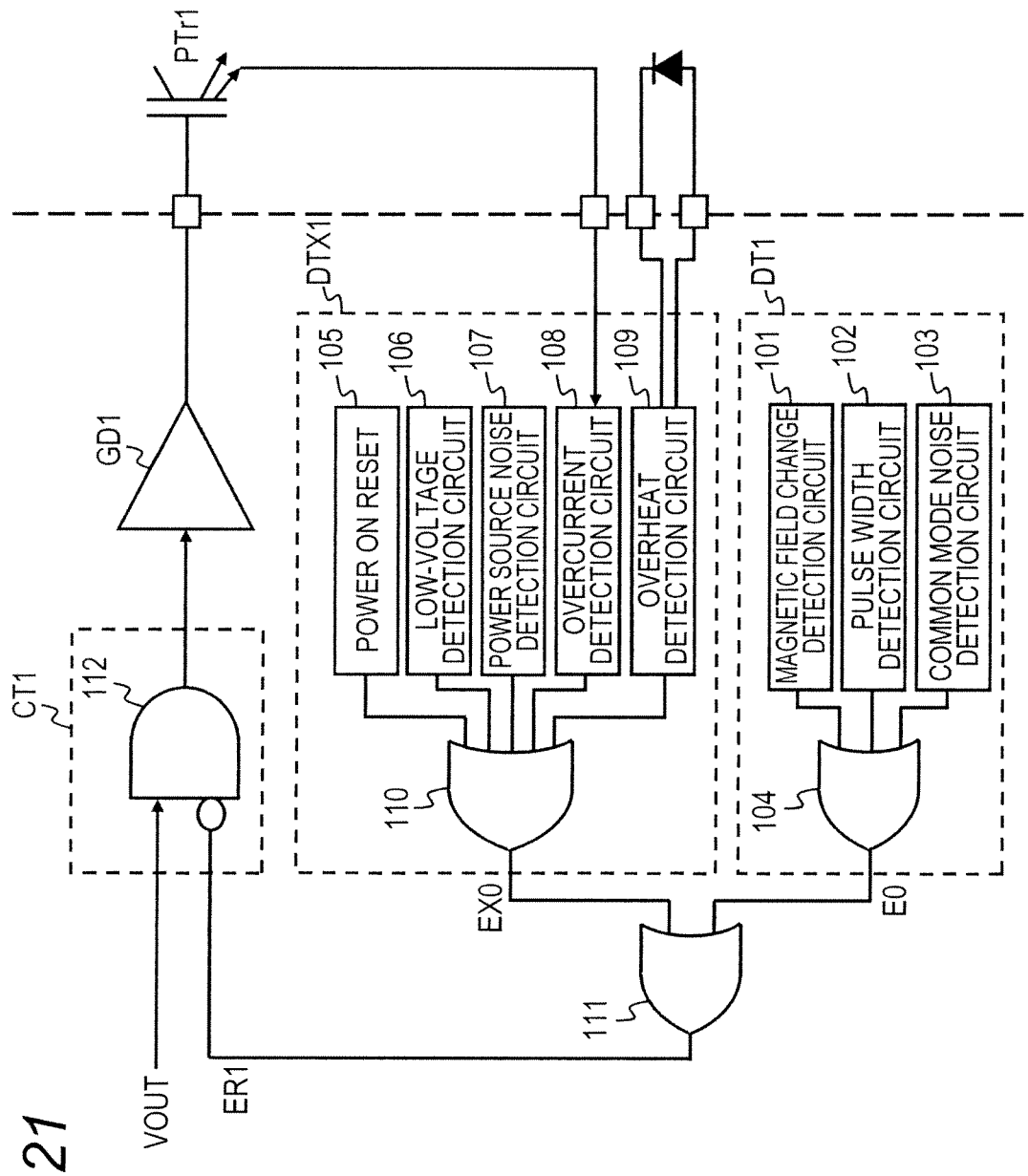
FIG. 21 is a circuit diagram also showing partially the variation of the semiconductor integrated circuit as the first embodiment.

The abnormality detection part DTX1 shown in FIG. 20 includes a power-on reset circuit 105, a low-voltage detection circuit 106, a power source noise detection circuit 107, an overcurrent detection circuit 108, an overheat detection circuit 109, and an OR circuit 110 that outputs the OR of the detection results from these circuits as a detection result EX0. When at least one of these detection circuits detects an abnormality, the abnormality detection part DTX1 outputs a high-level detection result EX0; when none of the detection circuits detects an abnormality, the abnormality detection part DTX1 outputs a low-level detection result EX0. The abnormality detection part DT1 outputs the detection result E0. The OR circuit 111 outputs the OR of the detection result E0 from the abnormality detection part DT1 and of the detection result EX0 from the abnormality detection part DTX1 as a detection result ER1. FIG. 21 shows typical relations of coupling among the abnormality detection parts DT1 and DTX1, control part CT1, and their peripheral circuits.

What follows are explanations of specific configurations and operations of the individual detection circuits provided in the abnormality detection part DTX1.

(Power-on Reset Circuit 105)

The power-on reset circuit 105 is a circuit that detects a predetermined time period over which the source voltage VDD1 on the side of the semiconductor chip CHP1 stabilizes after power-on. Immediately after power is turned on, the source voltage VDD1 is unstable so that the circuits powered thereby may not operate normally for a certain period. Thus during a predetermined time period following power-on, the power-on reset circuit 105 determines that an abnormality is taking place.

Figure 22:
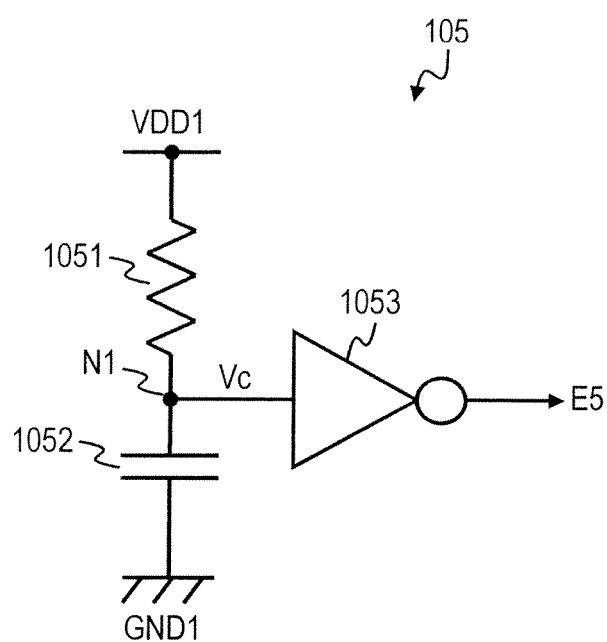
FIG. 22 is a circuit diagram showing a typical configuration of a power-on reset circuit in the first embodiment.
Figure 23:
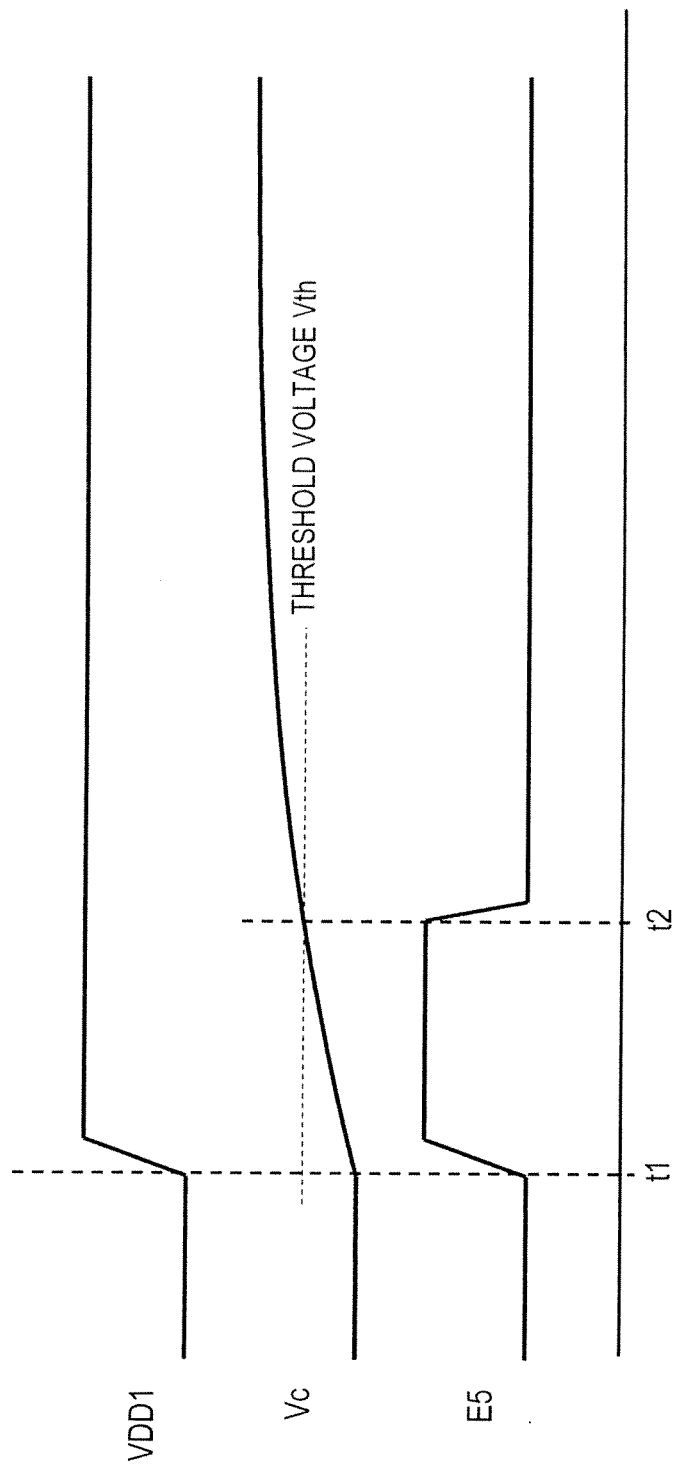
FIG. 23 is a timing chart showing typical operations of the power-on reset circuit in the first embodiment.

FIG. 22 shows a typical configuration of the power-on reset circuit 105. FIG. 23 is a timing chart showing typical operations of the power-on reset circuit 105. As shown in FIG. 22, the power-on reset circuit 105 includes a resistance element 1051, a capacitor 1052, and an inverter 1053.

The resistance element 1051 is provided interposingly between the source voltage terminal to which the source voltage VDD1 is supplied (the terminal is called the source voltage terminal VDD1 hereunder) and a node N1. The capacitor 1052 is provided interposingly between the node N1 and the ground voltage terminal to which the ground voltage GND1 is supplied (the terminal is called the ground voltage terminal GND1 hereunder). When the voltage Vc of the node N1 is lower than a threshold voltage Vth, the inverter 1053 outputs a high-level detection result E5; when the voltage Vc of the node N1 exceeds the threshold voltage Vth, the inverter 1053 outputs a low-level detection result E5.

As shown in FIG. 23, when power is applied and the voltage level of the source voltage VDD1 is raised (at time t1), the voltage Vc of the node N1 starts to rise gradually. For some time following power-on, the voltage Vc of the node N1 is lower than the threshold voltage Vth. During that time, the inverter 1053 outputs the high-level detection result E1 (from time t1 to time t2). When the voltage Vc of the node N1 exceeds the threshold voltage Vth, the inverter 1053 outputs the low-level detection result E5 (at time t2).

As explained above, the power-on reset circuit 105 outputs the high-level detection result E5 after power is applied and until a predetermined time period elapses. Upon elapse of the predetermined time period, with the source voltage stabilized, the power-on reset circuit 105 outputs the low-level detection result E5.

(Low-Voltage Detection Circuit 106)

The low-voltage detection circuit 106 is a circuit that detects whether the voltage level of the source voltage VDD1 on the side of the semiconductor chip CHP1 is lower than a predetermined threshold value. While the source voltage VDD1 is being lower than the threshold value, the circuits powered thereby may not operate normally. Thus if the voltage level of the source voltage VDD1 becomes lower than the threshold value, the low-voltage detection circuit 106 determines that an abnormality has occurred.

Figure 24:
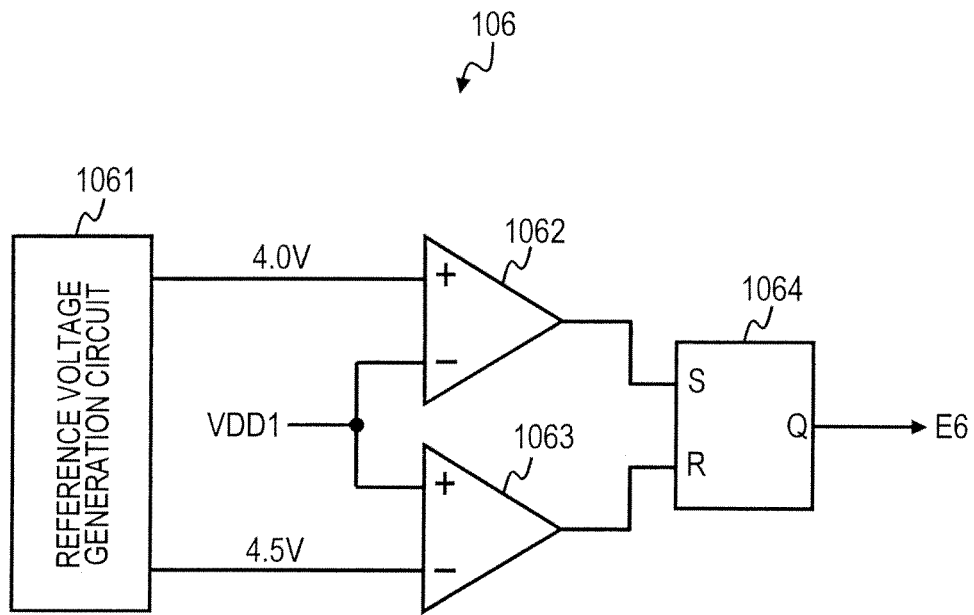
FIG. 24 is a circuit diagram showing a typical configuration of a low-voltage detection circuit in the first embodiment.
Figure 25:
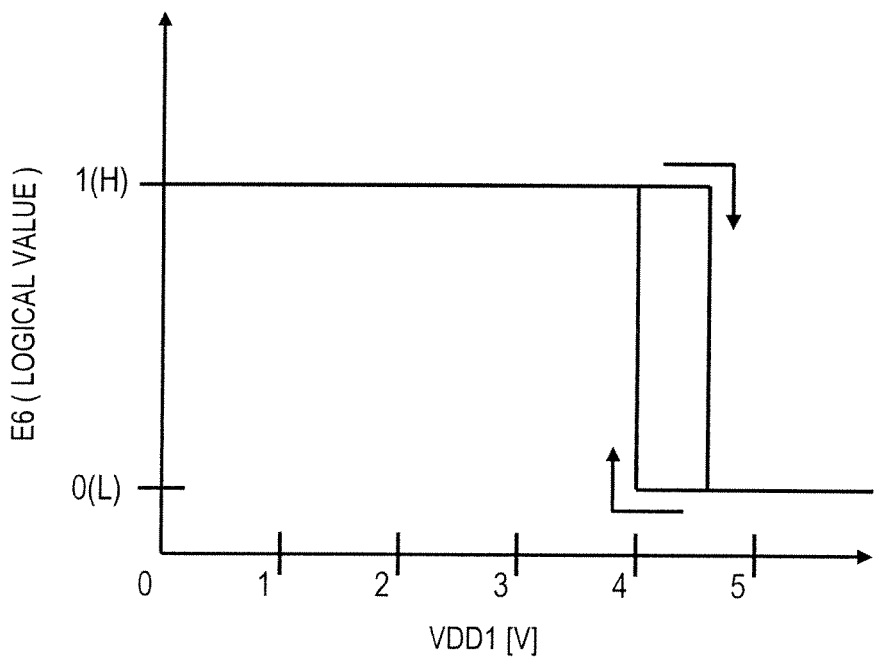
FIG. 25 is a graphic representation explanatory of the workings of the low-voltage detection circuit in the first embodiment.
Figure 26:
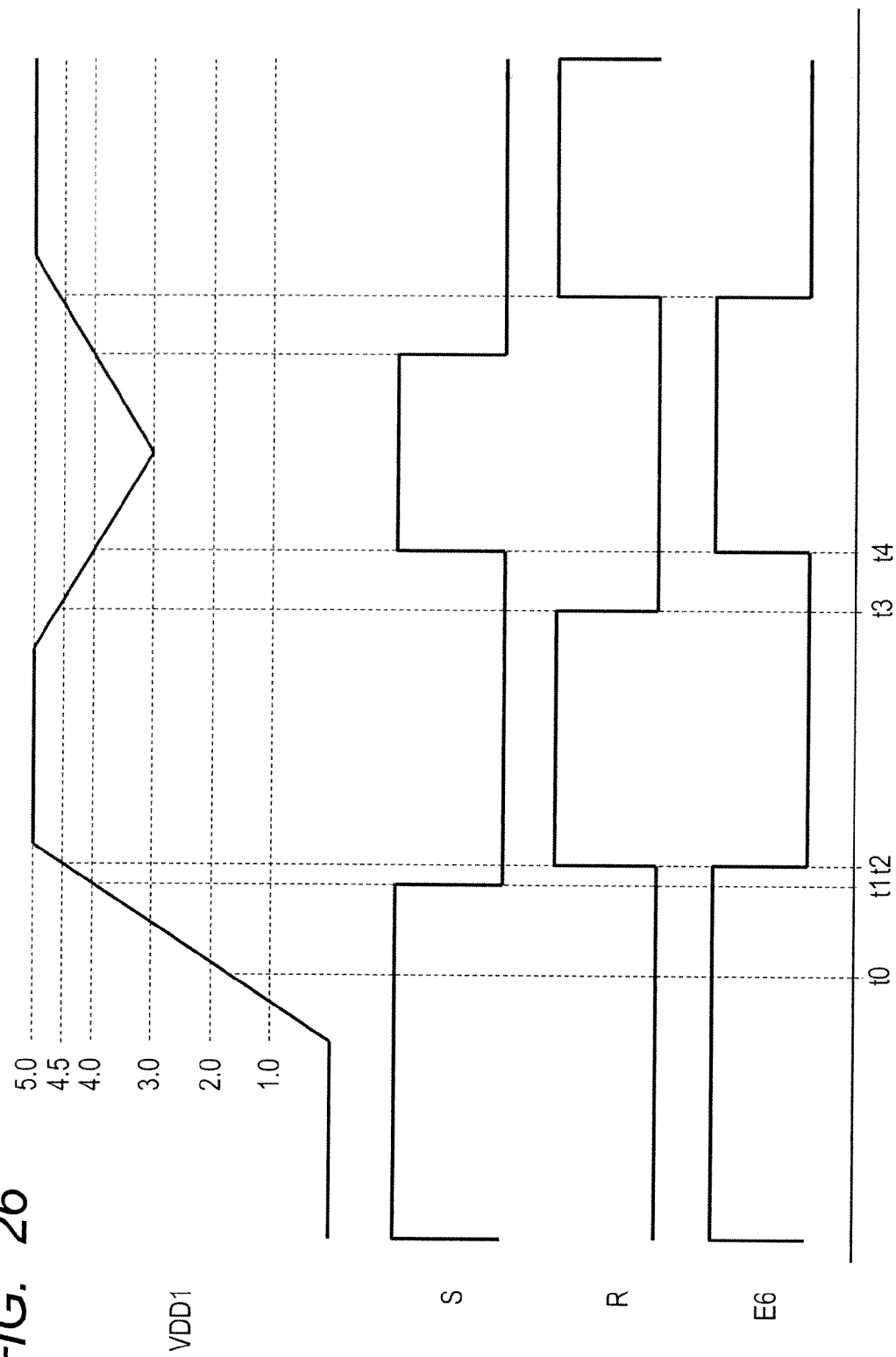
FIG. 26 is a timing chart showing typical operations of the low-voltage detection circuit in the first embodiment.

FIG. 24 shows a typical configuration of the low-voltage detection circuit 106. FIG. 25 is a graphic representation explanatory of the workings of the low-voltage detection circuit 106. FIG. 26 is a timing chart showing typical operations of the low-voltage detection circuit 106. The low-voltage detection circuit 106 shown in FIG. 24 includes a reference voltage generation circuit 1061, comparators 1062 and 1063, and an RS latch 1064. Shown in FIG. 24 is the configuration example in which the voltage level of the source voltage VDD1 at stable time is 5V.

The reference voltage generation circuit 1061 generates a first reference voltage of 4V and a second reference voltage of 4.5V, for example. The comparator 1062 compares the source voltage VDD1 with the first reference voltage and outputs the result of the comparison. The comparator 1063 compares the source voltage VDD1 with the second reference voltage and outputs the result of the comparison. The RS latch 1064 outputs from an output terminal Q a detection result E6 based on the comparison result coming from the comparator 1062 and input to a set terminal S and on the comparison result sent from the comparator 1063 and input to a reset terminal R.

As shown in FIG. 26, when the voltage level of the source voltage VDD1 is lower than 4.0V (at time t0), the comparator 1062 outputs a high-level comparison result and the comparator 1063 outputs a low-level comparison result. This causes the RS latch 1064 to output a high-level detection result E6. When the voltage level of the source voltage VDD1 rises and exceeds 4.0V (at time t1), the comparator changes its comparison result to the low level but the comparator 1063 holds its low-level comparison result unchanged. This causes the RS latch 1064 to keep outputting the high-level detection result. When the voltage level of the source voltage VDD1 further rises and becomes higher than 4.5V (at time t2), the comparator 1063 changes its comparison result to the high level. This causes the RS latch 1064 to change its detection result E6 to the low-level and output the low-level detection result E6.

Conversely, when the voltage level of the source voltage VDD1 drops and becomes lower than 4.5V (but higher than 4.0V, at time t3), the comparator 1063 changes its comparison result to the low level but the comparator 1062 holds its low-level comparison result unchanged. This causes the RS latch 1064 to keep outputting the low-level detection result E6. When the voltage level of the source voltage VDD1 further drops and becomes lower than 4V (at time t4), the comparator 1062 changes its comparison result to the high level. This causes the RS latch 1064 to changes its detection result E6 to the high level and output the high-level detection result E6. That is, the low-voltage detection circuit 106 provides the detection of the source voltage VDD1 with a hysteresis characteristic (see FIG. 25).

As explained above, when the voltage level of the source voltage VDD1 is higher than the predetermined threshold value, the low-voltage detection circuit 106 determines that the source voltage VDD1 is stable and outputs the low-level detection result E6. On the other hand, when the voltage level of the source voltage VDD1 is lower than the threshold value, the low-voltage detection circuit 106 determines that the source voltage VDD1 is unstable and outputs the high-level detection result E6.

(Power Source Noise Detection Circuit 107)

The power source noise detection circuit 107 is a circuit that detects whether the noise of the source voltage VDD1 on the side of the semiconductor chip CHP1 has exceeded a predetermined threshold range. If the noise of the source voltage VDD1 exceeds the threshold range, the circuits powered thereby may not operate normally. Thus if the noise of the source voltage VDD1 has exceeded the threshold range, the power source noise detection circuit 107 determines that an abnormality has occurred.

Figure 27:
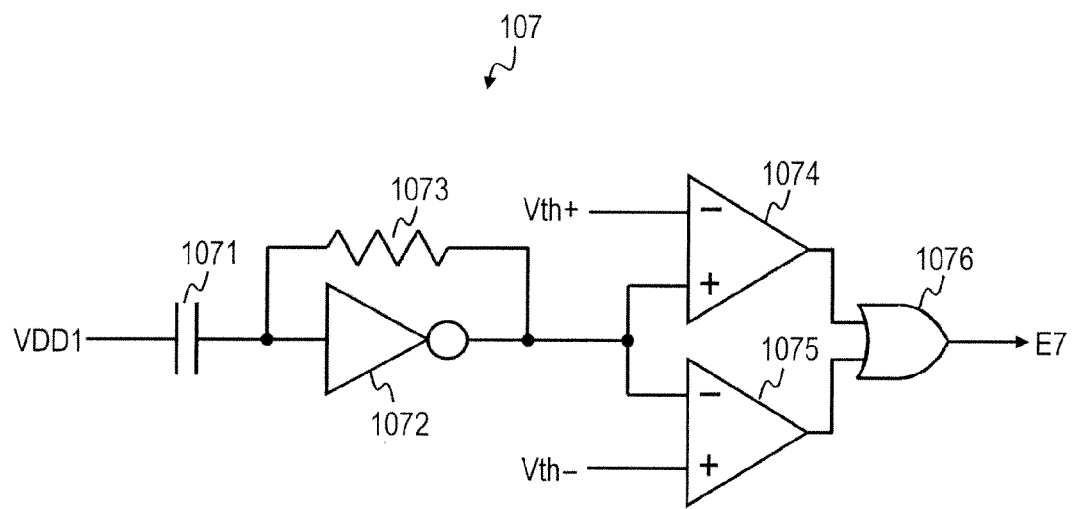
FIG. 27 is a circuit diagram showing a typical configuration of a power source noise detection circuit in the first embodiment.
Figure 28:
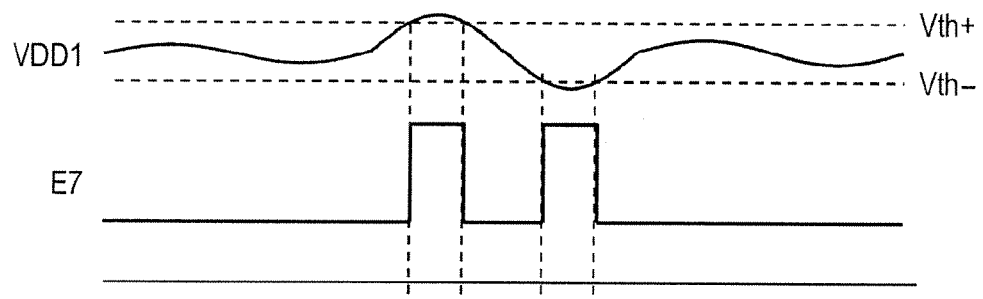
FIG. 28 is a timing chart showing typical operations of the power source noise detection circuit in the first embodiment.

FIG. 27 shows a typical configuration of the power source noise detection circuit 107. FIG. 28 is a timing chart showing typical operations of the power source noise detection circuit 107. The power source noise detection circuit 107 shown in FIG. 27 includes a capacitor 1071, an operation amplifier 1072, a resistance element 1073, comparators 1074 and 1075, and an OR circuit 1076.

The capacitor 1071 is provided interposingly between the source voltage terminal VDD1 and the operation amplifier 1072. The resistance element 1073 is provided interposingly between the output and the input terminals of the operation amplifier 1072. That is, the capacitor 1071, operation amplifier 1072, and resistance element 1073 make up a so-called high-pass filter. The comparator 1074 compares the threshold voltage Vth+ on the high-level side with the output voltage from the operation amplifier 1072 and outputs the result of the comparison. The comparator 1075 compares the threshold voltage Vth− on the low-level side with the output voltage from the operation amplifier 1072 and outputs the result of the comparison. The OR circuit 1076 outputs the OR of the comparison result from the comparator 1074 and of the comparison result from the comparator 1075 as a detection result E7.

As shown in FIG. 28, when the noise of the source voltage VDD1 falls within the threshold voltage range of Vth− through Vth+, the power source noise detection circuit 107 determines that the source voltage VDD1 is stable and outputs a low-level detection result E7. On the other hand, when the noise of the source voltage VDD1 exceeds the threshold voltage range of Vth− through Vth+, the power source noise detection circuit 107 determines that the source voltage VDD1 is unstable and outputs a high-level detection result E7.

(Overcurrent Detection Circuit 108)

The overcurrent detection circuit 108 is a circuit that detects whether an overcurrent flows through the power transistor PTr1. If the current value of the current flowing through the power transistor PTr1 is larger than a predetermined threshold value, the power transistor PTr1 may be destroyed or otherwise damaged. Thus if the current value of the current flowing through the power transistor PTr1 becomes larger than the predetermined threshold value, the overcurrent detection circuit 108 determines that an abnormality has occurred and outputs a high-level detection result E8.

(Overheat Detection Circuit 109)

The overheat detection circuit 109 is a circuit that detects whether the temperature inside or around the semiconductor chip CHP1 has become higher than a predetermined threshold temperature. If the temperature becomes higher than the threshold value, the circuits may operate normally. Thus if the temperature inside or around the semiconductor chip CHP1 is higher than the predetermined threshold temperature, the overheat detection circuit 109 determines that an abnormality has occurred and outputs a high-level detection result E9. For example, the overheat detection circuit 109 may detect the temperature based on the value of a forward voltage Vf of diodes located near the object of which the temperature is to be measured.

(Other Typical Packaged States of the Semiconductor Integrated Circuit 1)

Figure 36:
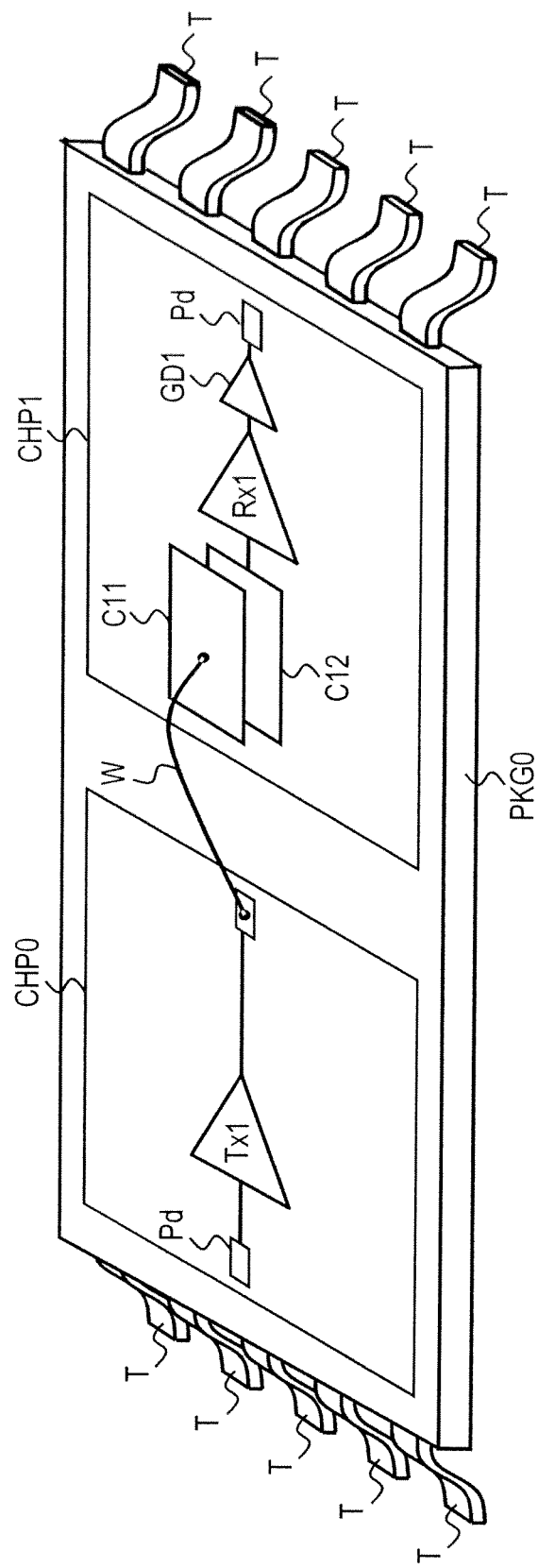
FIG. 36 is another schematic view showing how the semiconductor integrated circuit of the present invention is typically packaged.
Figure 37:
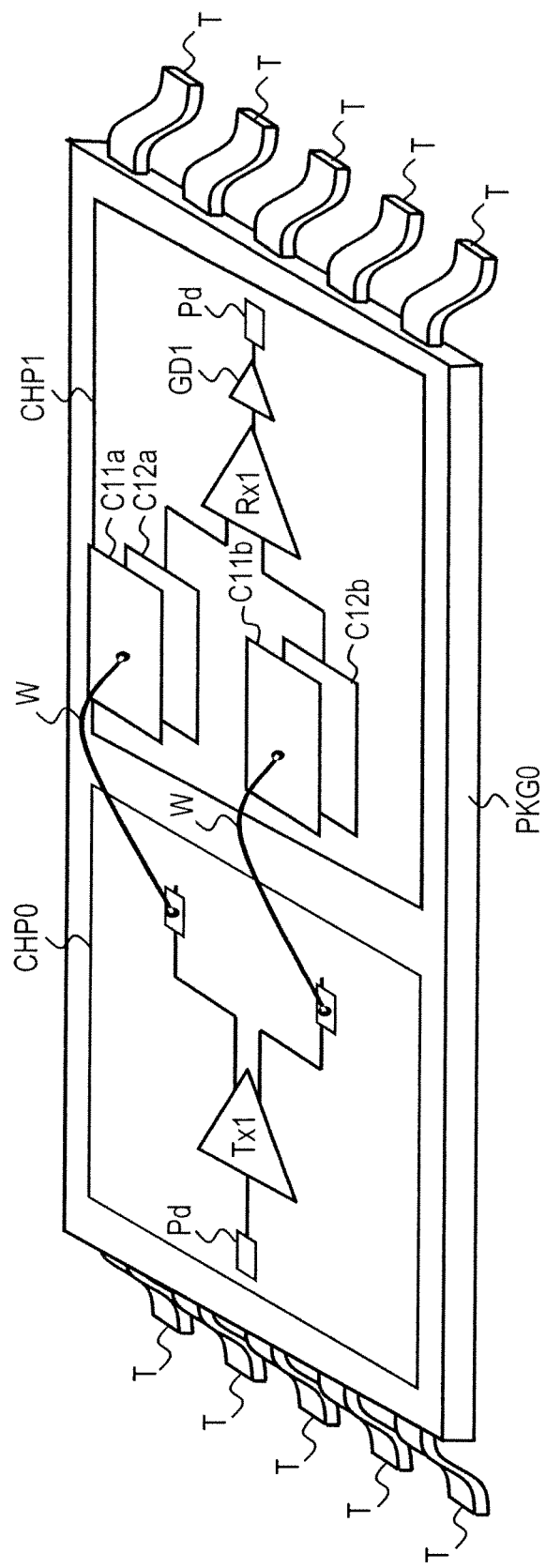
FIG. 37 is another schematic view showing how the semiconductor integrated circuit of the present invention is typically packaged.
Figure 38:
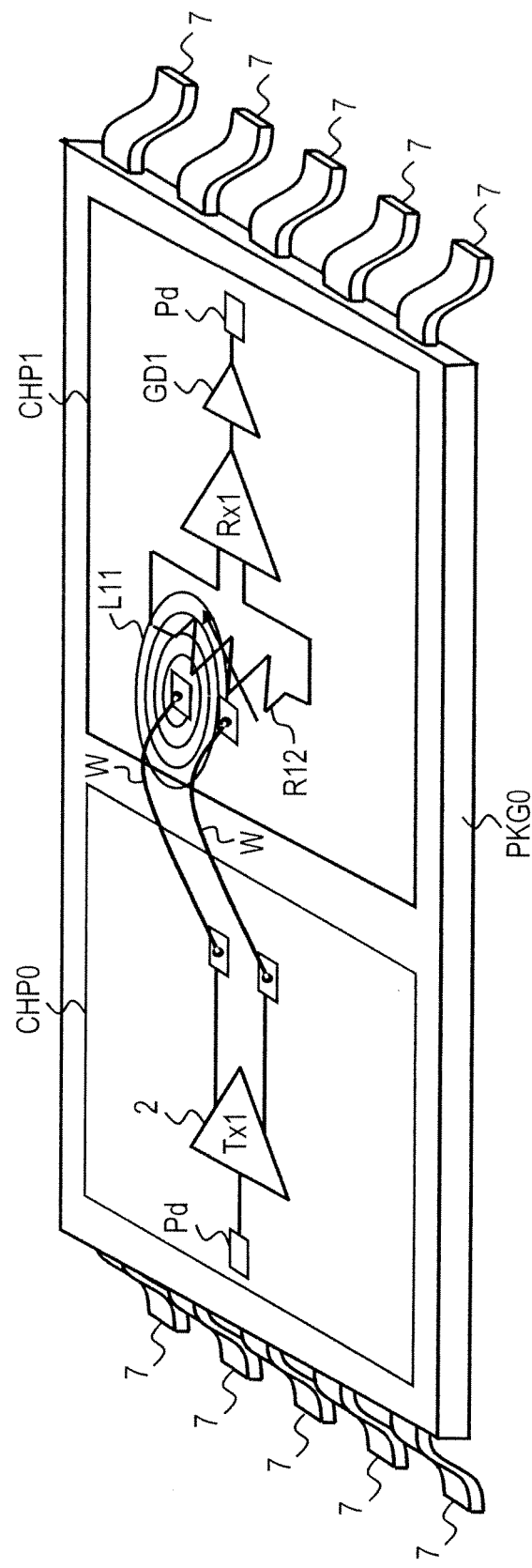
FIG. 38 is another schematic view showing how the semiconductor integrated circuit of the present invention is typically packaged.
Figure 39:
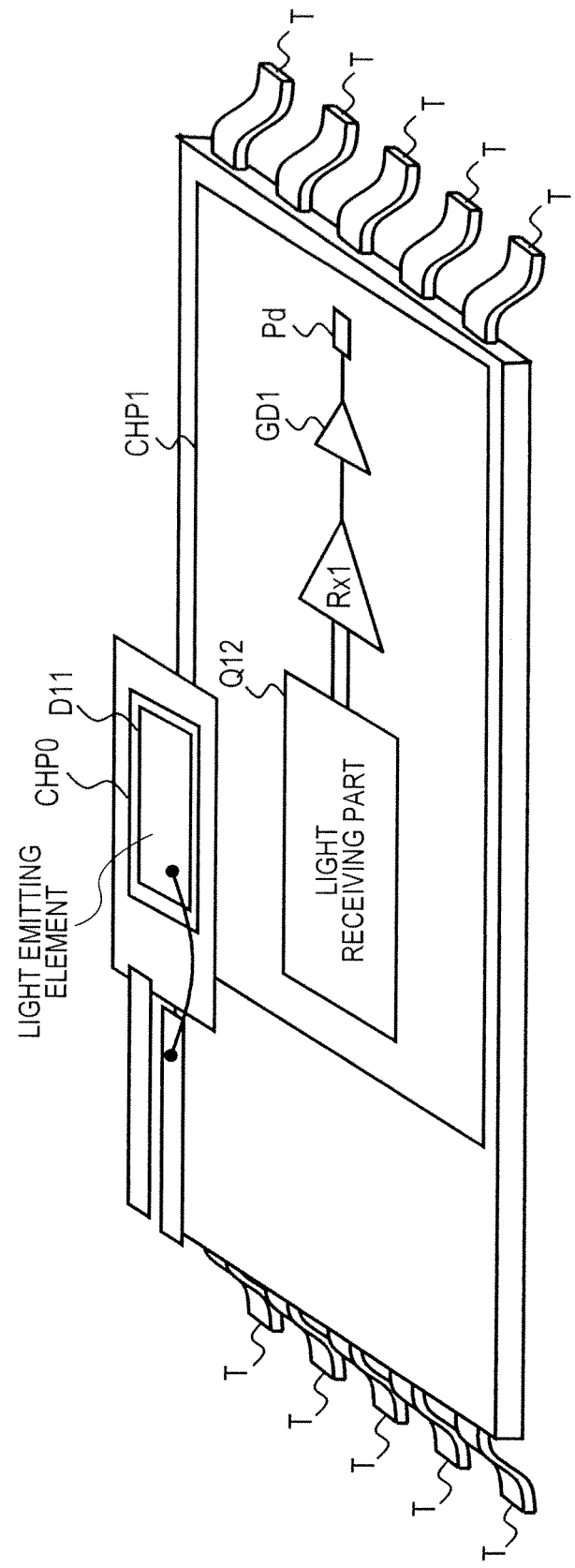
FIG. 39 is another schematic view showing how the semiconductor integrated circuit of the present invention is typically packaged.
Figure 40:
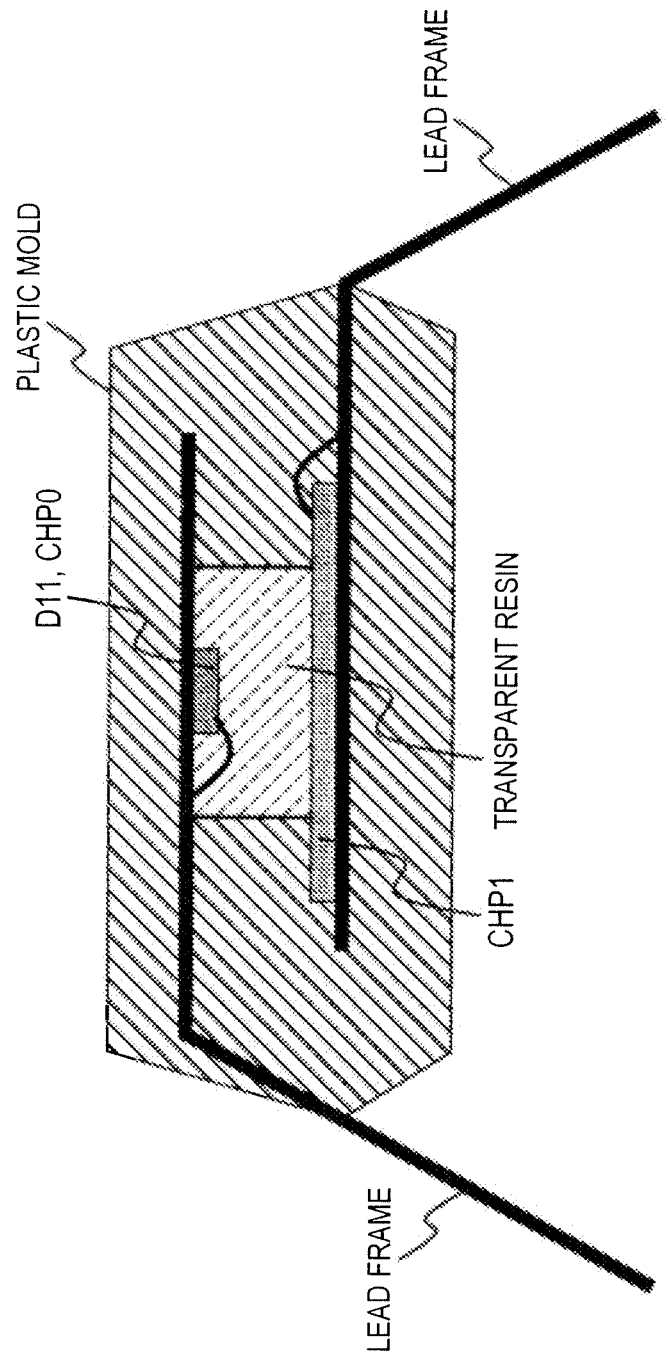
FIG. 40 is another schematic view showing how the semiconductor integrated circuit of the present invention is typically packaged.

The packaged state shown in FIG. 2 is not limitative of how the transmission circuit Tx1, reception circuit Rx1, and isolation element ISO1 interposed therebetween are to be packaged. Explained below by reference to FIGS. 29 through 40 are other packaged states of the semiconductor integrated circuit 1 embodying the present invention. FIGS. 29 through 35 show packaged states in which a transformer is used as the isolation element ISO1. FIGS. 36 and 37 show packaged state in which a capacitor is used as the isolation element ISO1. FIG. 38 shows a packaged state in which a GMR element isolator is used as the isolation element ISO1. FIGS. 39 and 40 show packaged states in which a photo-coupler is used as the isolation element ISO1. FIGS. 29 through 40 are provided primarily for the purpose of explaining how the transmission circuit Tx1, reception circuit Rx1, and isolation element ISO1 interposed therebetween are packaged. As such, FIGS. 29 through 40 do not show the control part CT1 and abnormality detection part DT1.

Figure 29:
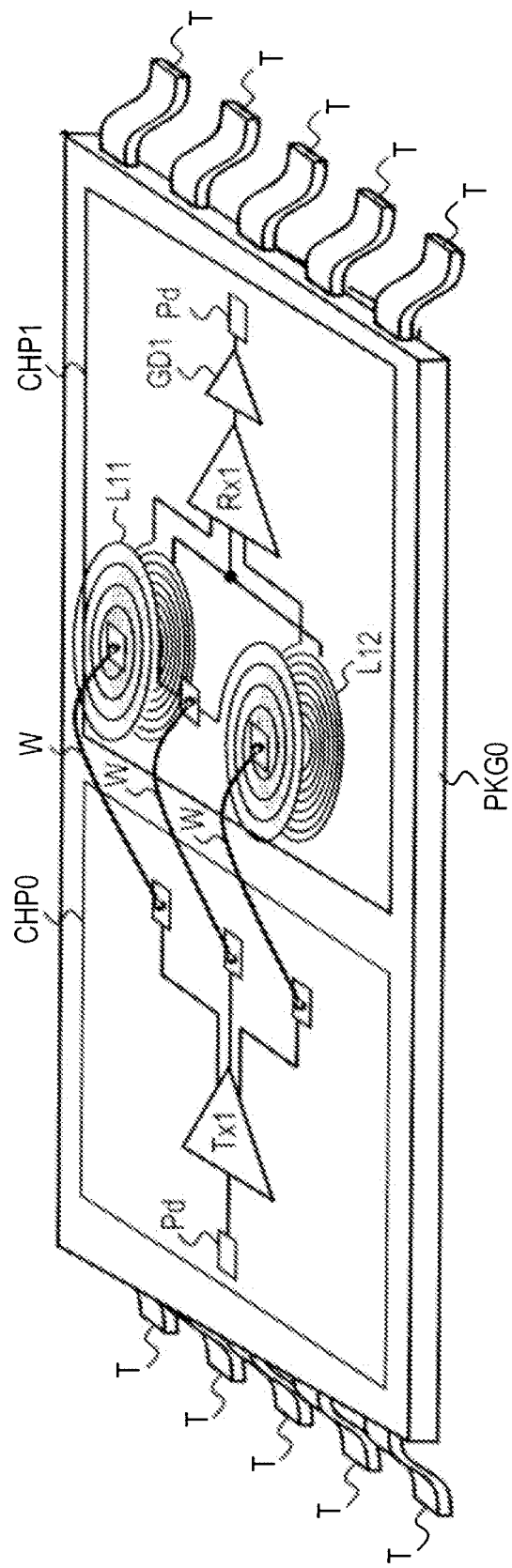
FIG. 29 is a schematic view showing how the semiconductor integrated circuit of the present invention is typically packaged.

In the packaged state shown in FIG. 29, the transmission circuit Tx1 is formed over the semiconductor chip CHP0. The semiconductor chip CHP1 includes the reception circuit Rx1, primary side coil L11 and secondary side coil L12 making up the isolation element ISO1, and gate driver GD1. Also, the semiconductor chip CHP0 has a plurality of pads formed and coupled to the output of the transmission circuit Tx1. The semiconductor chip CHP1 has pads formed and coupled to both ends of the primary side coil L11. By way of these pads and bonding wires W, the transmission circuit Tx1 is coupled to the primary side coil L11 formed over the semiconductor chip CHP1. The center tap of the primary side coil L11 is coupled to the power supply terminal on the side of the semiconductor chip CHP0 (e.g., ground voltage terminal GND0) by way of a pad and a bonding wire w separately provided. The center tap of the secondary side coil L12, on the other hand, is coupled to the power supply terminal on the side of the semiconductor chip CHP1 (e.g., ground voltage terminal GND1).

In the example shown in FIG. 29, the primary side coil L11 and secondary side coil L12 are formed in a first wiring layer and a second wiring layer, respectively, which are stacked one on top the other over one semiconductor chip. The primary side coil L11 is formed by two coils with the center tap interposed therebetween, and the secondary side coil L12 is also formed by two coils with the center tap interposed therebetween.

Figure 30:
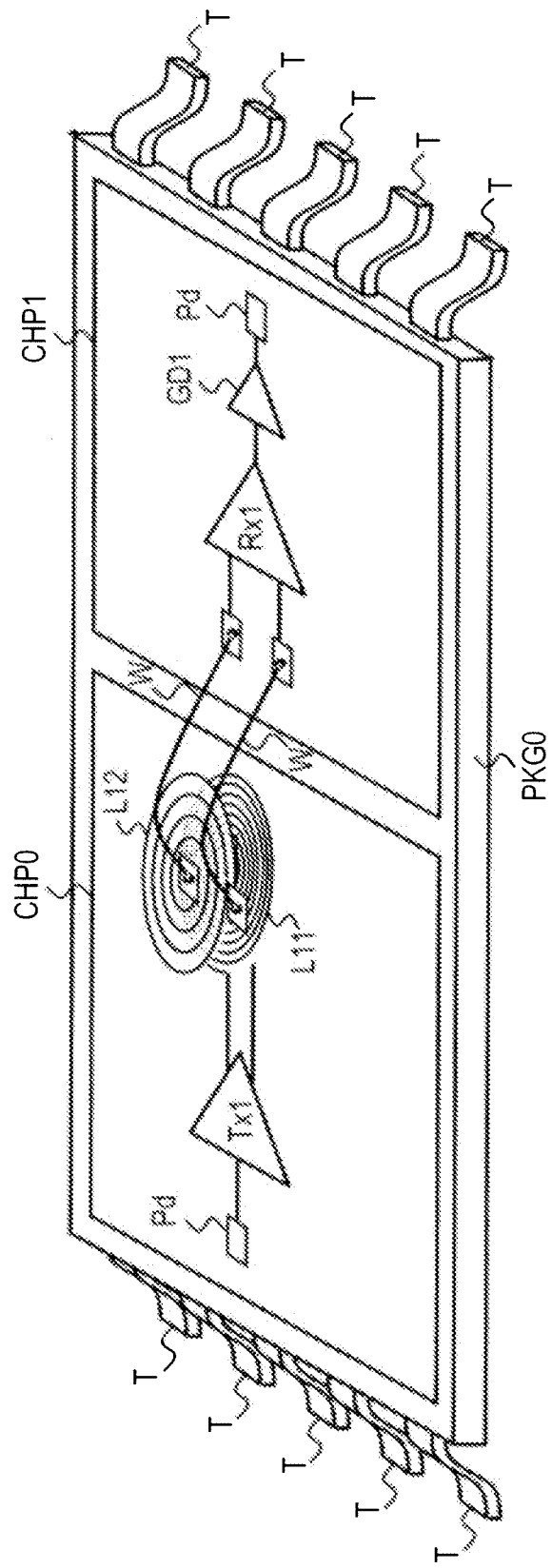
FIG. 30 is another schematic view showing how the semiconductor integrated circuit of the present invention is typically packaged.

In the packaged state shown in FIG. 30, the transmission circuit Tx1 and the primary side coil L11 and secondary side coil L12 making up the isolation element ISO1 are formed over the semiconductor chip CHP0. The reception circuit Rx1 and gate driver GD1 are formed over the semiconductor chip CHP1. Also, the semiconductor chip CHP0 has pads formed and coupled to both ends of the secondary side coil L12. The semiconductor chip CHP1 has pads formed and coupled to the input of the reception circuit Rx1. By way of these pads and bonding wires W, the reception circuit Rx1 is coupled to the secondary side coil L12 formed over the semiconductor chip CHP0.

In the example shown in FIG. 30, the primary side coil L11 and secondary side coil L12 are formed in a first wiring layer and a second wiring layer, respectively, which are stacked one on top the other over one semiconductor chip.

Figure 31:
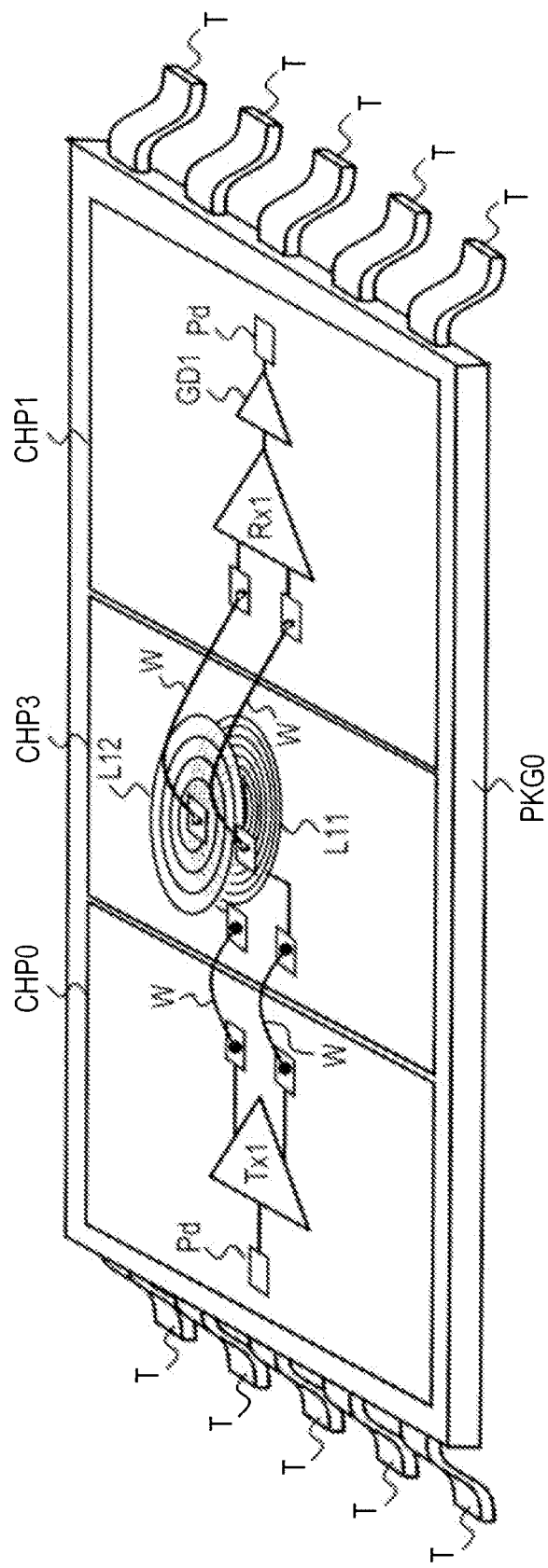
FIG. 31 is another schematic view showing how the semiconductor integrated circuit of the present invention is typically packaged.

In the packaged state shown in FIG. 31, the transmission circuit Tx1 is formed over the semiconductor chip CHP0. The reception circuit Rx1 and gate driver GD1 are formed over the semiconductor chip CHP1. The primary side coil L11 and secondary coil L12 making up the isolation element ISO1 are formed over a semiconductor chip CHP3 different from the semiconductor chips CHP0 and CHP1. Also, the semiconductor chip CHP0 has pads formed and coupled to the output of the transmission circuit Tx1. The semiconductor chip CHP1 has pads formed and coupled to the input of the reception circuit Rx1. The semiconductor chip CHP3 has pads formed and coupled to the two ends of the primary side coil L11 as well as pads formed and coupled to both ends of the secondary side coil L12. By way of these pads and bonding wires W, the transmission circuit Tx1 is coupled to the primary side coil L11 formed over the semiconductor chip CHP3. Also via these pads and bonding wires W, the reception circuit Rx1 is coupled to the secondary side coil L12 formed over the semiconductor chip CHP3.

In the example shown in FIG. 31, the primary side coil L11 and secondary side coil L12 are formed in a first wiring layer and a second wiring layer, respectively, which are stacked one on top the other over one semiconductor chip.

Figure 32:
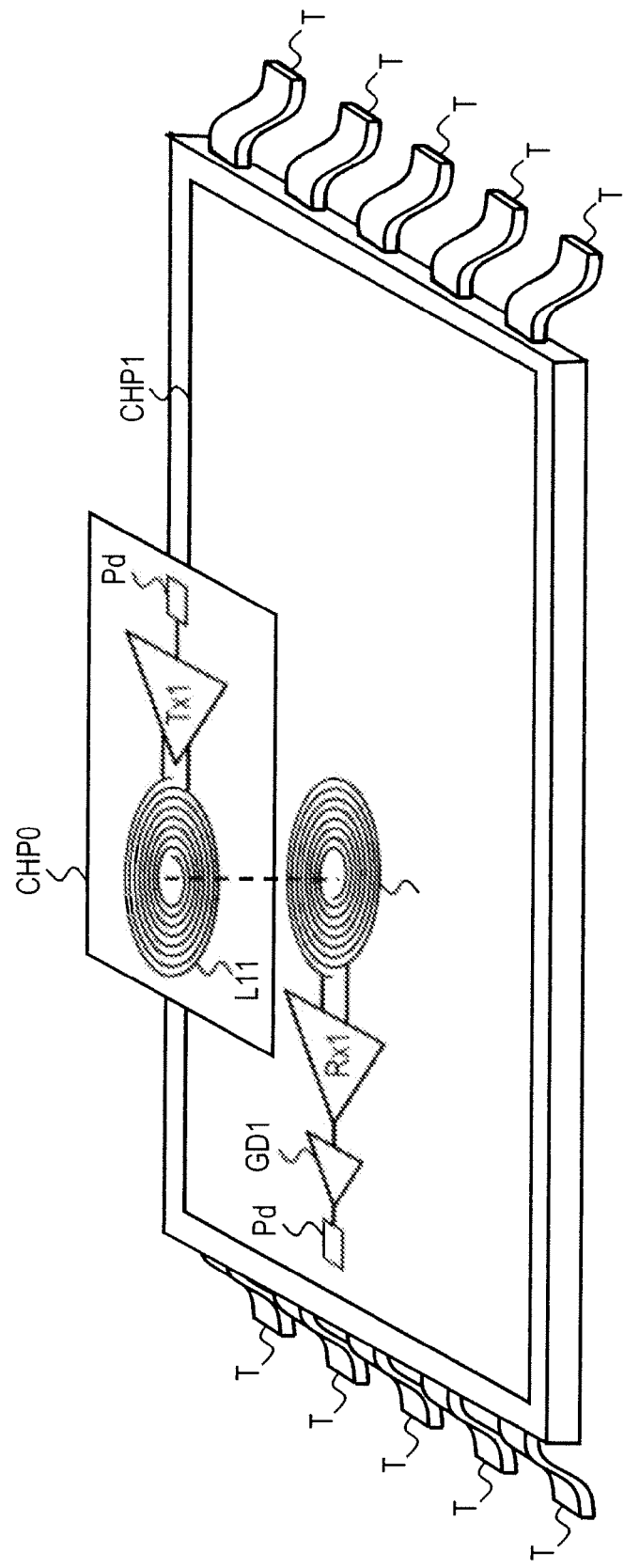
FIG. 32 is another schematic view showing how the semiconductor integrated circuit of the present invention is typically packaged.

In the packaged state shown in FIG. 32, the transmission circuit Tx1 and primary side coil L11 are formed over the semiconductor chip CHP0. The reception circuit Rx1, gate driver GD1, and secondary side coil L12 are formed over the semiconductor chip CHP1. The semiconductor chips CHP0 and CHP1 are stacked one on top the other. When stacked, the semiconductor chips CHP0 and CHP1 are positioned in such a manner that the center of the primary side coil L11 and that of the secondary side coil L12 are on the same straight line.

Figure 33:
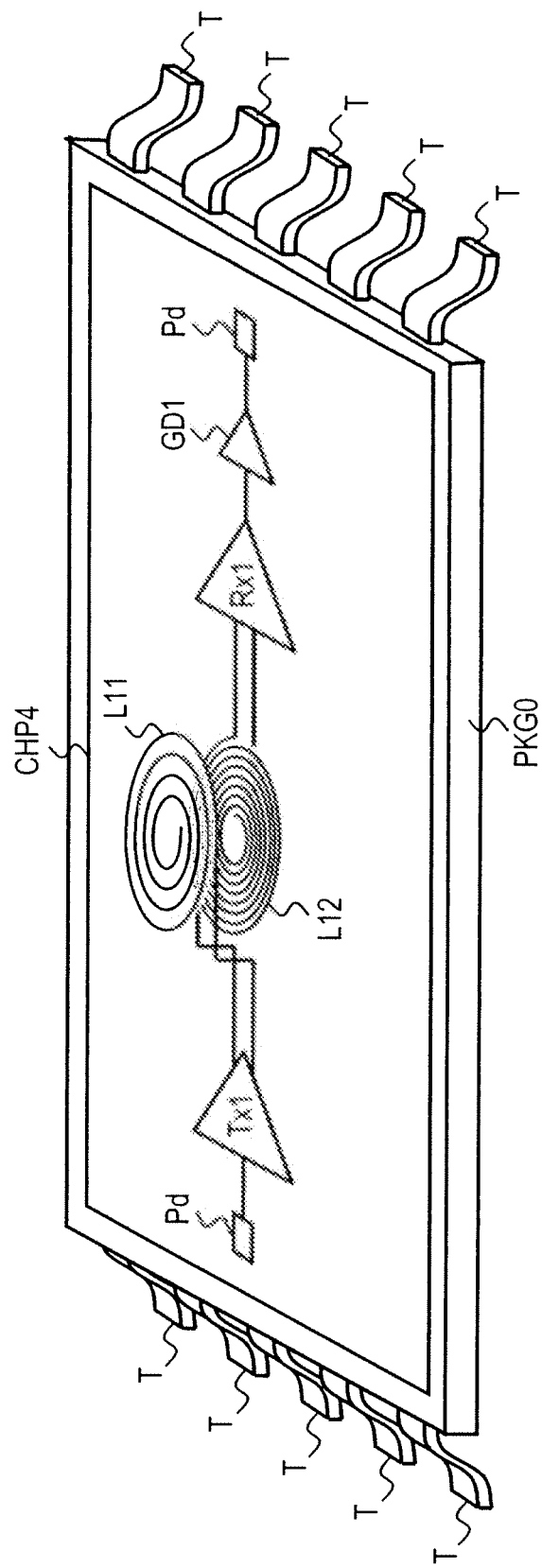
FIG. 33 is another schematic view showing how the semiconductor integrated circuit of the present invention is typically packaged.

In the packaged state shown in FIG. 33, the transmission circuit Tx1, reception circuit Rx1, primary side coil L11 and secondary side coil L12 making up the isolation element ISO1, and gate driver GD1 are formed over a common semiconductor chip CHP4. In the example of FIG. 33, the primary side coil L11 and secondary side coil L12 are formed in a first wiring layer and a second wiring layer, respectively, which are stacked one on top the other over the semiconductor chip CHP4. The area in which the transmission circuit Tx1 is located and the area in which the reception circuit Rx1 are positioned are isolated from each other by an isolation layer formed in the substrate of the semiconductor chip CHP4.

Figure 34:
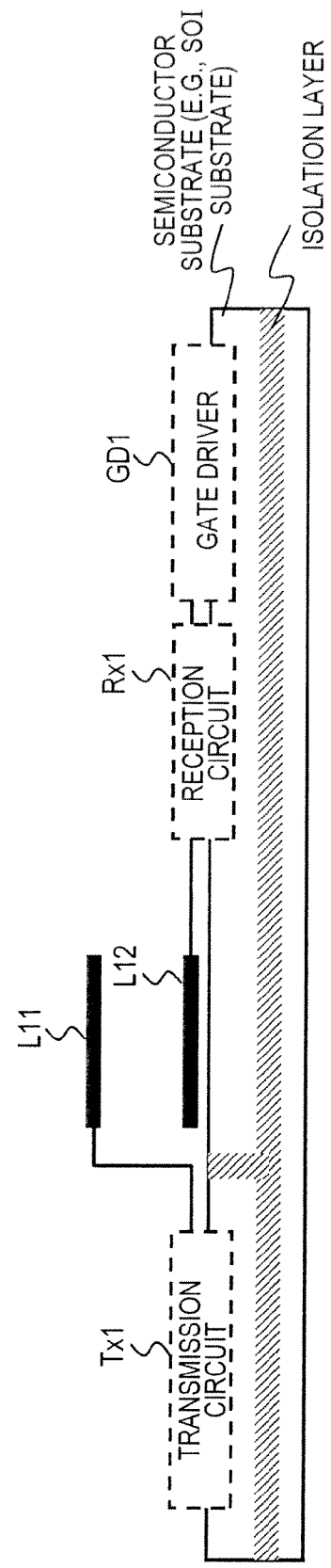
FIG. 34 is another schematic view showing how the semiconductor integrated circuit of the present invention is typically packaged.
Figure 35:
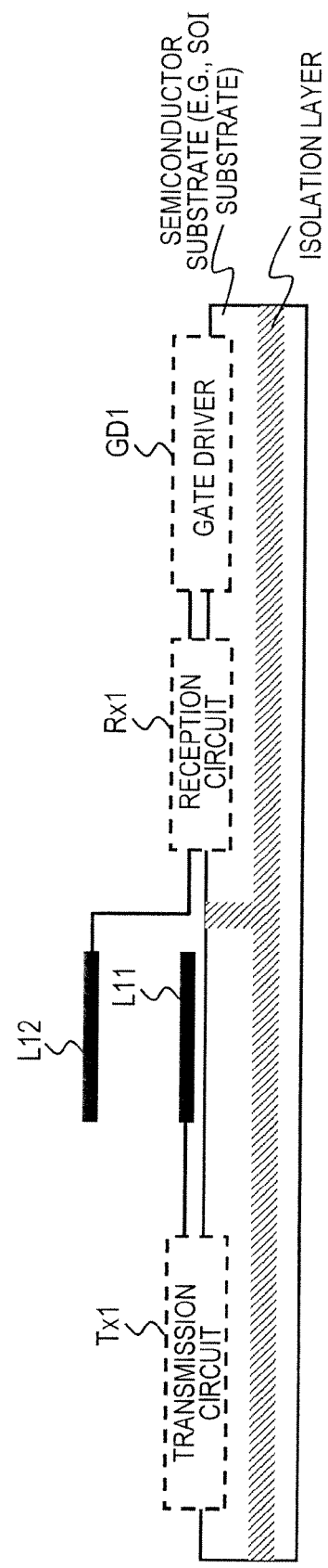
FIG. 35 is another schematic view showing how the semiconductor integrated circuit of the present invention is typically packaged.

FIGS. 34 and 35 are cross-sectional views of the substrate carrying the semiconductor chip CHP4 shown in FIG. 33. In the example shown in FIG. 34, the area in which the transmission circuit Tx1 is formed and the area in which the reception circuit Rx1 are formed are cut off electrically from each other by an isolation layer. The primary side coil L11 and secondary side coil L12 are provided in the area where the reception circuit Rx1 is formed. In the example shown in FIG. 35, the area in which the transmission circuit Tx1 is formed and the area in which the reception circuit Rx1 are formed are also cut off electrically from each other by an isolation layer. In this example, the primary side coil L11 and secondary side coil L12 are provided in the area where the transmission circuit Tx1 is formed.

FIG. 36 shows the packaged state of FIG. 2 in which the transformer is replaced with a capacitor as the isolation element ISO1. More specifically, the coil L11 is replaced with one electrode C11 of the capacitor and the coil L12 with the other electrode C12 thereof. FIG. 37 shows the packaged state of FIG. 29 in which the transformer is replaced with a capacitor as the isolation element ISO1. More specifically, the coil L11 is replaced with electrodes C11a and C11b on one side of the capacitor and the C12 with electrodes C12a and C12b on the other side thereof.

FIG. 37 shows the packaged state of FIG. 2 in which the transformer is replaced with a GMR element isolator as the isolation element ISO1. More specifically, the coil L11 is left intact while the coil L12 is replaced with a GMR element R12.

In the packaged state shown in FIG. 39 where a photo-coupler is used as the isolation element ISO1, a light emitting element D11 is formed over the semiconductor chip CHP0 while a light receiving part Q12, the reception circuit Rx1, and gate driver GD1 are formed over the semiconductor chip CHP1. The light emitting element D11 and light receiving part Q12 make up the photo-coupler.

FIG. 40 is a cross-sectional view of the semiconductor integrated circuit shown in FIG. 39. As shown in FIG. 40, the semiconductor chip CHP0 carrying the light emitting element D11 and the semiconductor chip CHP1 carrying the light receiving part Q12 are stacked one on top the other. When thus stacked, the semiconductor chips CHP0 and CHP1 are positioned so that the light emitting element D11 and light receiving part Q12 are faced with each other. The gap between the light emitting element D11 and the light receiving element Q12 is filled with a transparent resin material permitting transmission of light signals from the light emitting element D11 to the light receiving part Q12. The entire assembly is enclosed by a plastic mold that keeps the light signals of the light emitting element D11 from leaking out.

As explained above, there are no specific constraints on the type of the isolation element ISO1 or on the layout thereof. Whereas the foregoing paragraphs showed the isolation element ISO1 formed over a semiconductor chip, the isolation element ISO1 may be provided alternatively as an external part.

Although the foregoing paragraphs explained the packaged states of the combination of the transmission circuit Tx1, reception circuit Rx1, and isolation element ISO1 interposed therebetween, this combination is not limitative of the component parts that may be packaged. Alternatively, other combinations of transmission circuits, reception circuits, and isolation elements interposed therebetween may be packaged in like manner.

Second Embodiment

Figure 41:
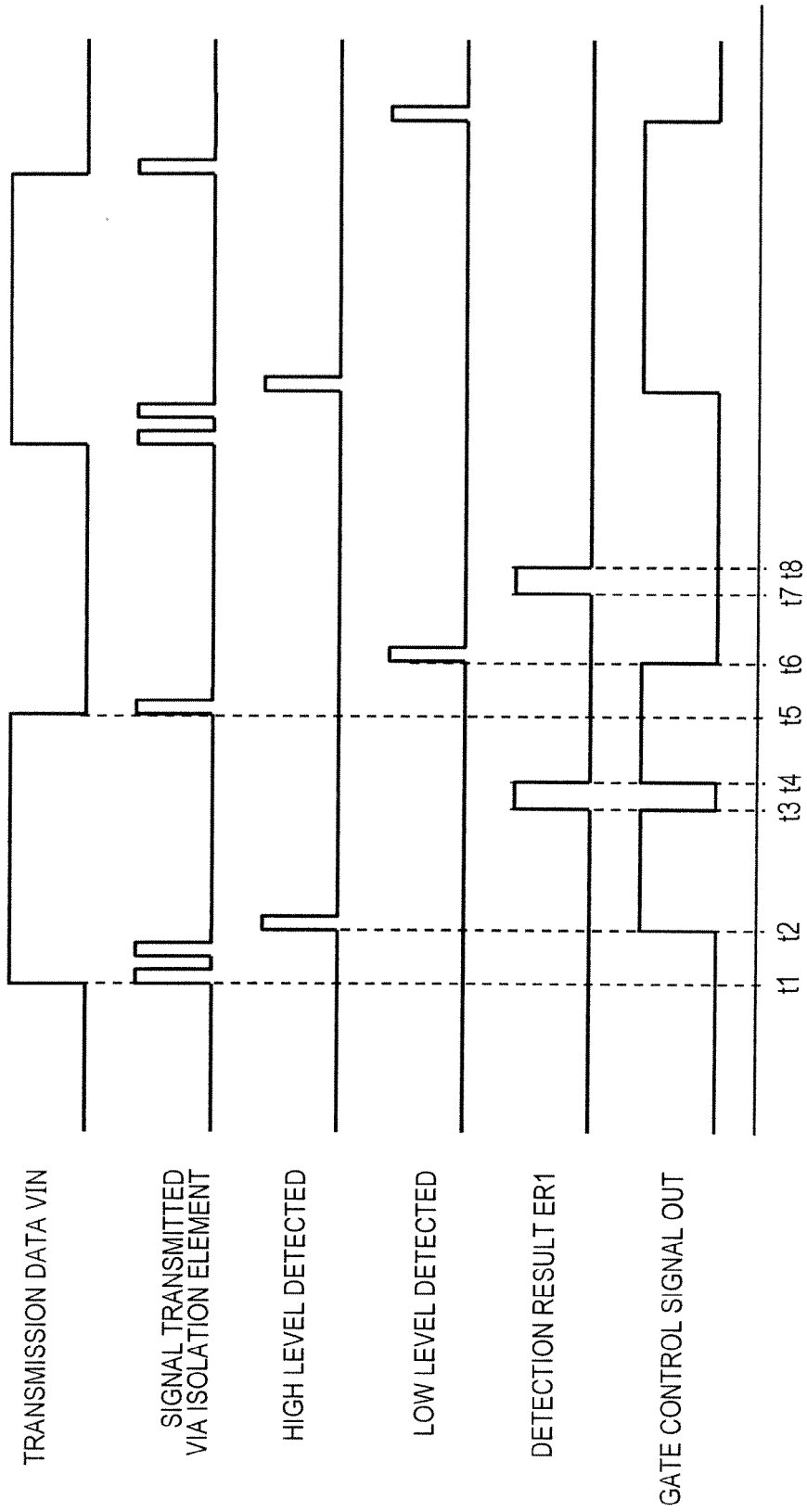
FIG. 41 is a timing chart showing typical operations of a semiconductor integrated circuit as a second embodiment of the present invention.

Another example of operations of the semiconductor integrated circuit 1 is explained below in reference to FIG. 41 as the second embodiment of the present invention. FIG. 41 is a timing chart showing typical operations of the semiconductor integrated circuit 1 operating on a signal transmission method different from that shown in FIG. 3. The signal transmission method shown in FIG. 41 may be adopted when the AC coupling element such as the transformer, capacitor, or GMR isolator is used as the isolation element ISO1. The signal transmission method shown in FIG. 41 is used not only for the transmission of signals via the isolation element ISO1 but also for signal transmission via other isolation elements, to be discussed later.

In the example of FIG. 41, the transmission circuit Tx1 outputs two consecutive pulse signals (called a two-pulse signal altogether) as a transmission signal in synchronism with a rising edge of transmission data VIN. The transmission circuit Tx1 also outputs a single pulse signal (called a one-pulse signal) as another transmission signal in synchronism with a falling edge of the transmission data VIN. The isolation element ISO1 forwards the transmission signal coming from the transmission circuit Tx1 to the reception circuit Rx1 as a reception signal. On receiving the two-pulse signal as the reception signal, the reception circuit Rx1 drives output data VOUT high; upon receipt of the one-pulse signal as the reception signal, the reception circuit Rx1 drives the output data VOUT low. In this manner, the reception circuit Rx1 reproduces the transmission data VIN and outputs the reproduced data as the output data VOUT.

Where the signal transmission method shown in FIG. 41 is adopted, the reception circuit Rx1 has a high-level detection circuit, a low-level detection circuit, and an RS latch, for example. Upon receipt of the two-pulse signal as the reception signal, the high-level detection circuit drives a set signal high. Upon receipt of the one-pulse signal as the reception signal, the low-level detection circuit drives a reset signal high. Based on the set signal from the high-level detection circuit and on the reset signal from the low-level detection circuit, the RS latch outputs the output data VOUT. That is, the RS latch drives the output data VOUT high upon receipt of the two-pulse signal and drives the output data VOUT low on receiving the one-pulse signal.

As shown in FIG. 41, the transmission data VIN changes from high level to low level at time t1. This causes the transmission circuit Tx1 to output the two-pulse signal as the transmission signal (at time t1). Upon receipt of the two-pulse signal as the reception signal, the reception circuit Rx1 drives the output data VOUT high (time t2). At this point, any abnormality that may cause a malfunction signal transmission via the isolation element ISO1 has not occurred, so that the abnormality detection part DT1 outputs a low-level detection result ER1. Thus the control part CT1 outputs the output data VOUT from the reception circuit Rx1 unchecked. Because the output data VOUT is at the high level, the gate control signal OUT is also high, which turns on the power transistor PTr1.

Suppose that there has since occurred an abnormality that can cause a malfunction in signal transmission via the isolation element ISO1. In this case, the abnormality detection part DT1 outputs a high-level detection result ER1 as long as the abnormality is present (from time t3 to time t4). Thus the control part CT1 outputs a low-level stop signal regardless of the output data VOUT (i.e., regardless of the transmission data VIN). This drives the gate control signal OUT low, which forcibly turns off the power transistor PTr1.

When the abnormality disappears, the abnormality detection part DT1 changes the detection result ER1 from high level to low level (at time t4). This causes the control part CT1 to again start outputting the output data VOUT from the reception circuit Rx1 unchecked. That is, the control part CT1 cancels the stop signal. Because the output data VOUT is at the high level, the gate control signal OUT also becomes high, which turns on the power transistor PTr1 (at time t4).

Thereafter, the transmission data VIN changes from high level to low level at time t5. This causes the transmission circuit Tx1 to output the one-pulse signal as the transmission signal (at time t5). On receiving the one-pulse signal as the reception signal, the reception circuit Rx1 drives the output data VOUT low (at time t6). At this point, there is no abnormality that may cause a malfunction in signal transmission via the isolation element ISO1. Consequently the abnormality detection part DT1 outputs a low-level detection result ER1. Thus the control part CT1 outputs the output data VOUT from the reception circuit Rx1 unchecked. Since the output data VOUT is at the low level, the gate control signal OUT also becomes low, which turns off the power transistor PTr1.

Suppose that there later occurred an abnormality that can cause a malfunction in signal transmission via the isolation element 1901. In this case, the abnormality detection part DT1 outputs a high-level detection result ER1 as long as the abnormality is present (from time t7 to time t8). Thus the control part CT1 outputs a low-level stop signal regardless of the output data VOUT (i.e., regardless of the transmission data VIN). This drives the gate control signal OUT low, which forcibly turns off the power transistor PTr1. That is, the power transistor PTr1 is kept turned off.

When the abnormality disappears, the abnormality detection part DT1 changes the detection result ER1 from high level to low level (at time t8). This causes the control part CT1 to again start outputting the output data VOUT from the reception circuit Rx1 unchecked. That is, the control part CT1 cancels the stop signal. Because the output data VOUT is at the low level, the gate control signal OUT also becomes low, which keeps the power transistor PTr1 off (at time t8).

As explained above, the semiconductor integrated circuit 1 adopting the signal transmission method of the second embodiment offers substantially the same effects as those of the first embodiment.

Figure 42:
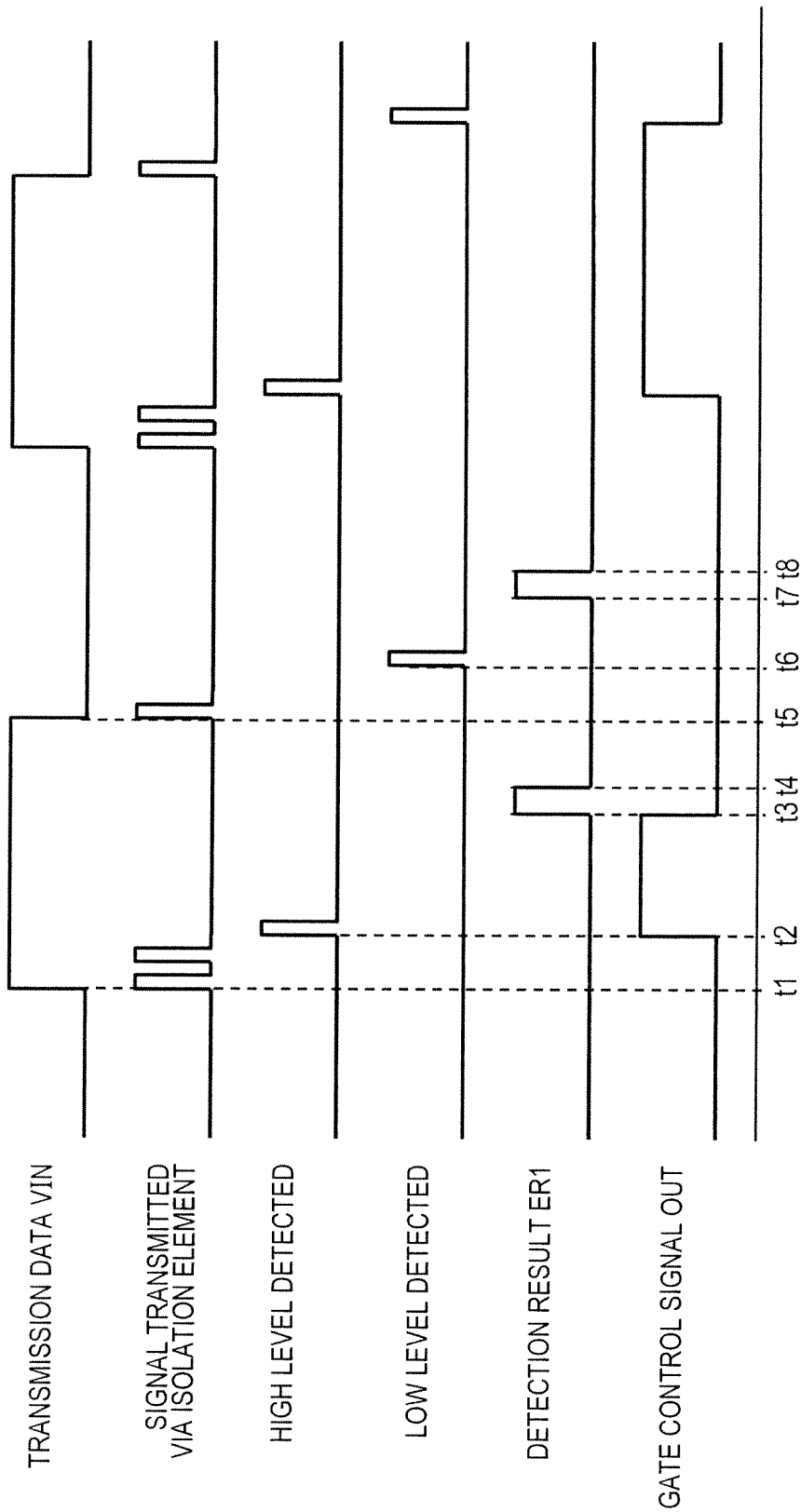
FIG. 42 is a timing chart showing other typical operations of the semiconductor integrated circuit as the second embodiment.

The second embodiment above was shown having the control part CT1 furnished separately from the reception circuit Rx1. Alternatively, the control part CT1 may be incorporated as part of the reception circuit Rx1. The same holds for the relationship between other control parts to be discussed later on the one hand and the reception circuit on the other hand. For example, the control part CT1 may be incorporated as an OR circuit in the reception circuit Rx1. The OR circuit outputs the OR of the reset signal from the low-level detection circuit and of the detection result ER from the abnormality detection part DT1 to the reset terminal R of the RS latch. In this case, even when the detection result ER1 changes from high level to low level following disappearance of the abnormality, the reception circuit Rx1 keeps outputting the low-level output data VOUT until the next logical value change occurs in the transmission data VIN (see FIG. 42). In other words, after the abnormality detected by the abnormality detection part is no longer detected, the reception circuit Rx1 cancels the stop signal in synchronism with a first logical value change in the transmission data VIN.

Third Embodiment

Figure 43:
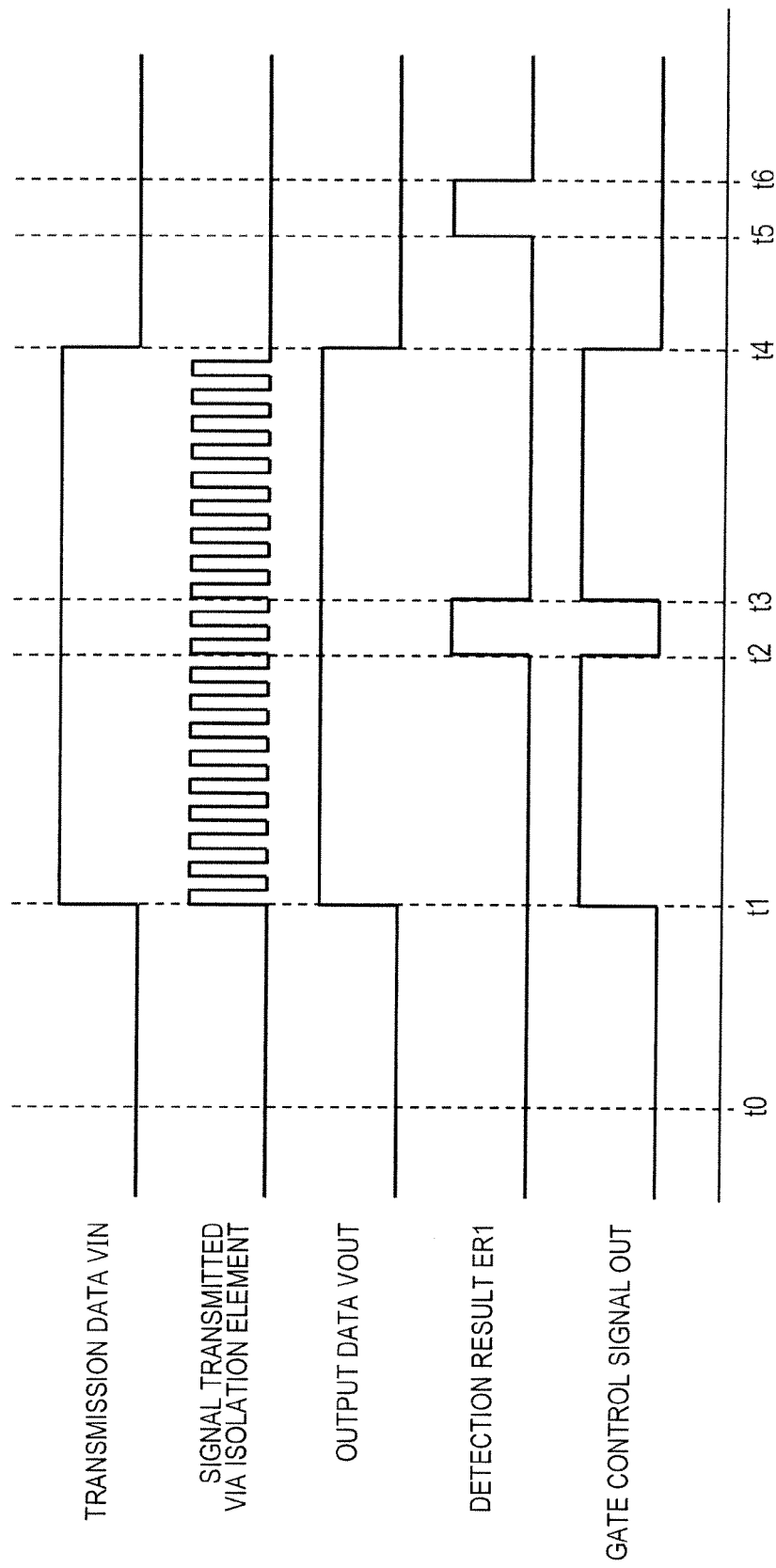
FIG. 43 is a timing chart showing typical operations of a semiconductor integrated circuit as a third embodiment of the present invention.

Another example of operations of the semiconductor integrated circuit 1 is explained below in reference to FIG. 43 as the second embodiment of the present invention. FIG. 43 is a timing chart showing typical operations of the semiconductor integrated circuit 1 operating on a signal transmission method different from that shown in FIG. 3 or in FIG. 41. The signal transmission method shown in FIG. 43 may be adopted when the AC coupling element such as the transformer, capacitor, or GMR isolator is used as the isolation element ISO1. The signal transmission method shown in FIG. 43 is used not only for the transmission of signals via the isolation element ISO1 but also for signal transmission via other isolation elements, to be discussed later.

In the example of FIG. 43, the transmission circuit Tx1 outputs pulses not multiplexed on the transmission signal when the transmission data VIN is at the low level, and outputs consecutive pulses multiplexed on the transmission signal when the transmission data is at the high level. The isolation element ISO1 forwards the transmission signal coming from the transmission circuit Tx1 to the reception circuit Rx1 as the reception signal. On receiving the pulse-multiplexed reception signal, the reception circuit Rx1 drives the output data VOUT high; upon receipt of the pulse-free reception signal, the reception circuit Rx1 drives the output data VOUT low. In this manner, the reception circuit Rx1 reproduces the transmission data VIN and outputs the reproduced data as the output data VOUT.

As shown in FIG. 43, the transmission data VIN is at the low level at time t0. Thus the transmission circuit Tx1 outputs pulses not multiplexed on the transmission signal (at time t0). The reception circuit x1 outputs the low-level output data VOUT because it is receiving the pulse-free reception signal (at time t0).

Thereafter, the transmission data VIN changes from low level to high level at time t1. This causes the transmission circuit Tx1 to start outputting continuous pulses multiplexed on the transmission signal (at time t1). On receiving the pulse-multiplexed reception signal, the reception circuit Rx1 drives the output data high (at time t1). At this point, any abnormality that can cause a malfunction in signal transmission via the isolation element ISO1 has not occurred, so that the abnormality detection part DT1 outputs a low-level detection result ER1. Thus the control part CT1 outputs the output data VOUT from the reception circuit Rx1 unchecked.

Because the output data VOUT is at the high level, the gate control signal OUT is also high, which turns on the power transistor PTr1.

Suppose that there later occurred an abnormality that can cause a malfunction in signal transmission via the isolation element ISO1. In this case, the abnormality detection part DT1 outputs a high-level detection result ER1 as long as the abnormality is present (from time t2 to time t3). Thus the control part CT1 outputs a low-level stop signal regardless of the output data VOUT (i.e., regardless of the transmission data VIN). This drives the gate control signal OUT low, which forcibly turns off the power transistor PTr1.

When the abnormality disappears, the abnormality detection part DT1 changes the detection result ER1 from high level to low level (at time t3). This causes the control part CT1 to again start outputting the output data VOUT from the reception circuit Rx1 unchecked. Because the output data VOUT is at the high level, the gate control signal OUT also becomes high, which turns on the power transistor PTr1 (from time t3 to t4).

Thereafter, the transmission data VIN changes from high level to low level at time t4. This causes the transmission circuit Tx1 to start outputting pulses not multiplexed on the transmission signal (at time t4). Upon receipt of the pulse-free reception signal, the reception circuit Rx1 drives the output data VOUT low (at time t4). At this point, any abnormality that can cause a malfunction in signal transmission via the isolation element ISO1 has not occurred, so that the abnormality detection part DT1 outputs a low-level detection result ER1. Thus the control part CT1 outputs the output data VOUT from the reception circuit Rx1 unchecked. Because the output data VOUT is at the low level, the gate control signal OUT is also low, which turns off the power transistor PTr1.

Suppose that there later occurred an abnormality that can cause a malfunction in signal transmission via the isolation element ISO1. In this case, the abnormality detection part DT1 outputs a high-level detection result ER1 as long as the abnormality is present (from time t5 to time t6). Thus the control part CT1 outputs a low-level stop signal regardless of the output data VOUT (i.e., regardless of the transmission data VIN). This drives the gate control signal OUT low, which forcibly turns off the power transistor PTr1. That is, the power transistor PTr1 is kept off.

When the abnormality disappears, the abnormality detection part DT1 changes the detection result ER1 from high level to low level (at time t6). This causes the control part CT1 to again start outputting the output data VOUT from the reception circuit Rx1 unchecked. Because the output data VOUT is at the low level, the gate control signal OUT also becomes low, which keeps the power transistor PTr1 off (at time t6).

As explained above, the semiconductor integrated circuit 1 adopting the signal transmission method of the third embodiment offers substantially the same effects as those of the first embodiment.

Fourth Embodiment

Figure 44:
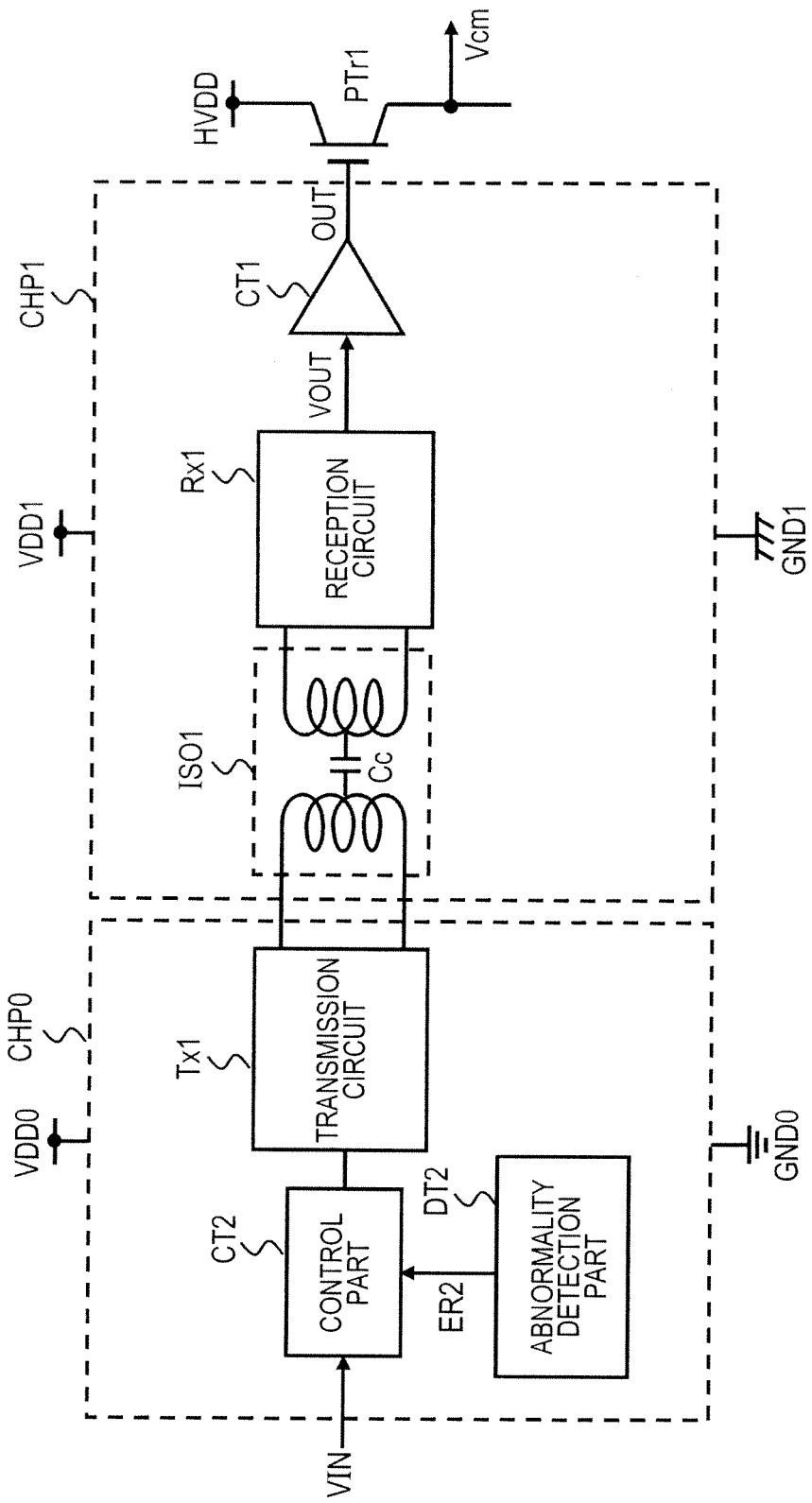
FIG. 44 is a block diagram showing a typical configuration of a semiconductor integrated circuit as a fourth embodiment of the present invention.

FIG. 44 shows a typical configuration of a semiconductor integrated circuit 2 as the fourth embodiment of the present invention. Compared with the semiconductor integrated circuit 1 shown in FIG. 1, the semiconductor integrated circuit 2 in FIG. 44 has an abnormality detection part DT2 and a control part CT2 which are formed over the semiconductor chip CHP0 and which replace the abnormality detection part DT1 and control part CT1, respectively, formed over the semiconductor chip CHP1. That is, the abnormality detection part and control part are provided over the chip on the side of the transmission circuit Tx1. The ensuing paragraphs will mainly explain the configurations and operations of the abnormality detection part DT2 and control part CT2.

The abnormality detection part DT2 has substantially the same circuit configuration as the abnormality detection part DT1. The abnormality detection part DT2 detects an abnormality that can cause a malfunction in signal transmission via the isolation element ISO1 and outputs a detection result ER2 upon such detection. For example, upon detecting an abnormality, the abnormality detection part DT2 outputs a high-level detection result ER2; when not detecting any abnormality, the abnormality detection part DT2 outputs a low-level detection result ER2. The abnormality detection part DT2 includes a magnetic field change detection circuit 201, a pulse width detection circuit 202, and a common mode noise detection circuit 203, not shown.

The control part CT2 has substantially the same circuit configuration as the control part CT1. When the abnormality detection part DT2 detects an abnormality, the control part CT2 outputs a stop signal to turn off the power transistor PTr1 regardless of externally supplied transmission data VIN.

For example, when the detection result ER2 from the abnormality detection part DT2 is at the low level, i.e., when any abnormality that can cause a malfunction in signal transmission via the isolation element ISO1 is not detected, the control part CT2 outputs the externally supplied transmission data VIN unchecked to the transmission circuit Tx1. This allows the conduction state of the power transistor PTr1 to be controlled in accordance with the transmission data VIN. On the other hand, if the detection result ER2 from the abnormality detection part DT2 is at the high level, i.e., if an abnormality that can cause a malfunction in signal transmission via the isolation element ISO1 is detected, the control part CT2 outputs a low-level stop signal to the transmission circuit Tx1 regardless of the externally supplied transmission data VIN. This causes the transmission circuit Tx1 to convert the low-level stop signal to the transmission signal and to output the signal. The transmission signal from the transmission circuit Tx1 is forwarded to the reception circuit Rx1 as the reception signal via the isolation element ISO1. Consequently the power transistor PTr1 is controlled to be turned off.

What follows are explanations of specific configurations and operations of the detection circuits included in the abnormality detection part DT2.

(Magnetic Field Change Detection Circuit 201)

The configuration and operations of the magnetic field change detection circuit 201 are substantially the same as those of the magnetic field change detection circuit 101 and thus will not be discussed further.

(Pulse Width Detection Circuit 202)

The pulse width detection circuit 202 is a circuit that detects whether the interval between logical value changes in the transmission data VIN supplied from another semiconductor chip has become longer than a predetermined interval. In other words, the pulse width detection circuit 202 detects whether the pulse width of the PWM-modulated transmission data VIN fed from another semiconductor chip has become greater than a predetermined width. The remaining details of the configuration and operations of the pulse width detection circuit 202 are the same as those of the pulse width detection circuit 102 and thus will not be discussed further.

(Common Mode Noise Detection Circuit 203)

Figure 45:
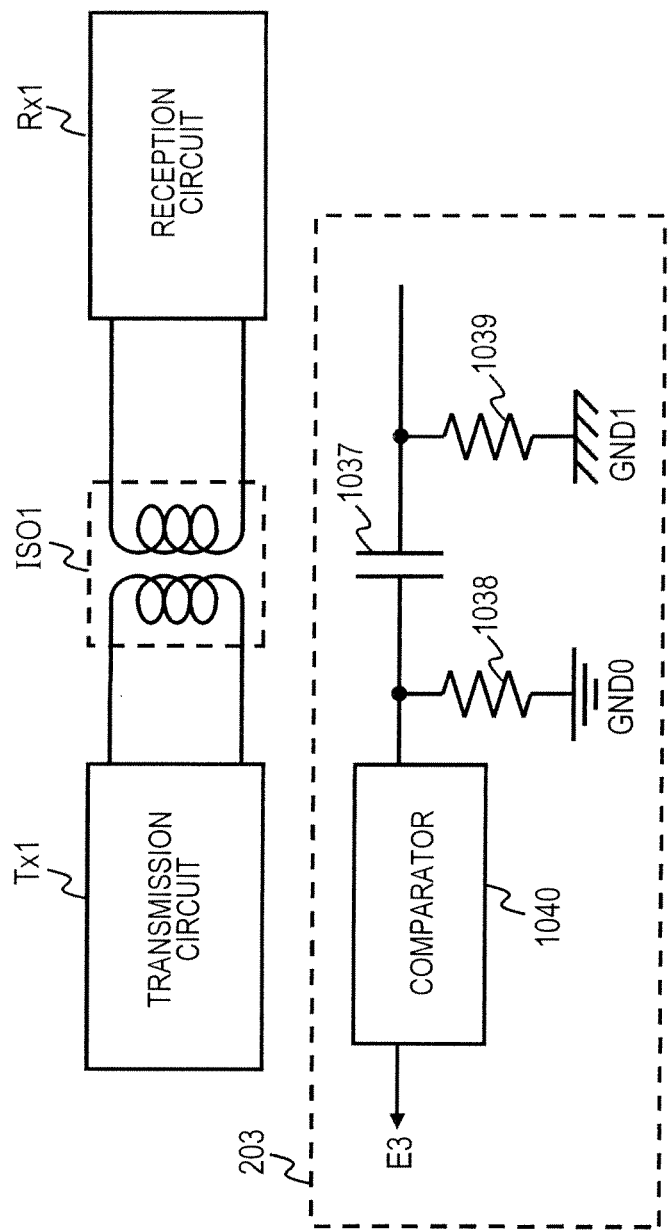
FIG. 45 is a circuit diagram showing a typical configuration of a common mode noise detection circuit in the fourth embodiment.

The common mode noise detection circuit 203 is a circuit that detects whether common mode noise has exceeded a predetermined threshold range. In the common mode noise detection circuit 103a in FIG. 16, the comparator 1040 was shown furnished on the side of the other electrode (second power source side) of the capacitor 1037. On the other hand, in the common mode noise detection circuit 203 in FIG. 45, the comparator 1040 is shown provided on the side of one electrode (first power source side) of the capacitor 1037. The remaining details of the configuration and operations of the common mode noise detection circuit 203 are the same as those of the common mode noise detection circuit 103a and thus will not be discussed further.

The abnormality detection part DT2 may be configured differently in such a manner that, as a circuit for detecting an abnormality that can cause a malfunction in signal transmission via the isolation element ISO1, the part DT2 may include a power-on reset circuit 205, a low-voltage detection circuit 206, a power source noise detection circuit 207, and an overheat detection circuit 209 in addition to the above-mentioned three detection circuits. The power-on reset circuit 205, low-voltage detection circuit 206, power source noise detection circuit 207, and overheat detection circuit 209 correspond to the power-on reset circuit 105, low-voltage detection circuit 106, power source noise detection circuit 107, and overheat detection circuit 109, respectively.

(Power-on Reset Circuit 205)

The power-on reset circuit 205 is a circuit that detects a predetermined time period over which the source voltage VDD0 on the side of the semiconductor chip CHP0 stabilizes after power-on. The remaining details of the configuration and operations of the power-on reset circuit 205 are the same as those of the power-on reset circuit 105 and thus will not be discussed further.

(Low-Voltage Detection Circuit 206)

The low-voltage detection circuit 206 is a circuit that detects whether the voltage level of the source voltage VDD0 on the side of the semiconductor chip CHP0 has become lower than a predetermined threshold value. The remaining details of the configuration and operations of the low-voltage detection circuit 206 are the same as those of the low-voltage detection circuit 106 and thus will not be discussed further.

(Power Source Noise Detection Circuit 207)

The power source noise detection circuit 207 is a circuit that detects whether the noise of the source voltage VDD0 on the side of the semiconductor chip CHP0 has exceeded a predetermined threshold range. The remaining details of the configuration and operations of the power source noise detection circuit 207 are the same as those of the power source noise detection circuit 107 and thus will not be discussed further.

(Overheat Detection Circuit 209)

The overheat detection circuit 209 is a circuit that detects whether the temperature inside or around the semiconductor chip CHP0 has become higher than a predetermined threshold temperature. The remaining details of the configuration and operations of the overheat detection circuit 209 are the same as those of the overheat detection circuit 109 and thus will not be discussed further.

As explained above, upon detection of an abnormality that can cause a malfunction in signal transmission via the isolation element ISO1 on the side of the semiconductor chip CHP0, the semiconductor integrated circuit 2 of the fourth embodiment turns off the power transistor PTr1 that is the target to be controlled. The inventive semiconductor integrated circuit 2 thus prevents the power transistor PTr1 from getting inadvertently turned on and thereby forestalls the malfunction of the load.

The foregoing paragraphs describing the fourth embodiment gave the example in which the abnormality detection part DT2 outputs the detection result ER2 solely to the control part CT2. Alternatively, the abnormality detection part DT2 may feed the detection result ER2 back to an external microcomputer. In this setup, upon detection of an abnormality by the abnormality detection part DT2, the microcomputer may again output the transmission data VIN of the same value. As another alternative, when the abnormality detection part DT2 detects an abnormality, the microcomputer may output as the transmission data VIN a stop signal (low-level signal) that turns off the power transistor PTr1.

Figure 46:
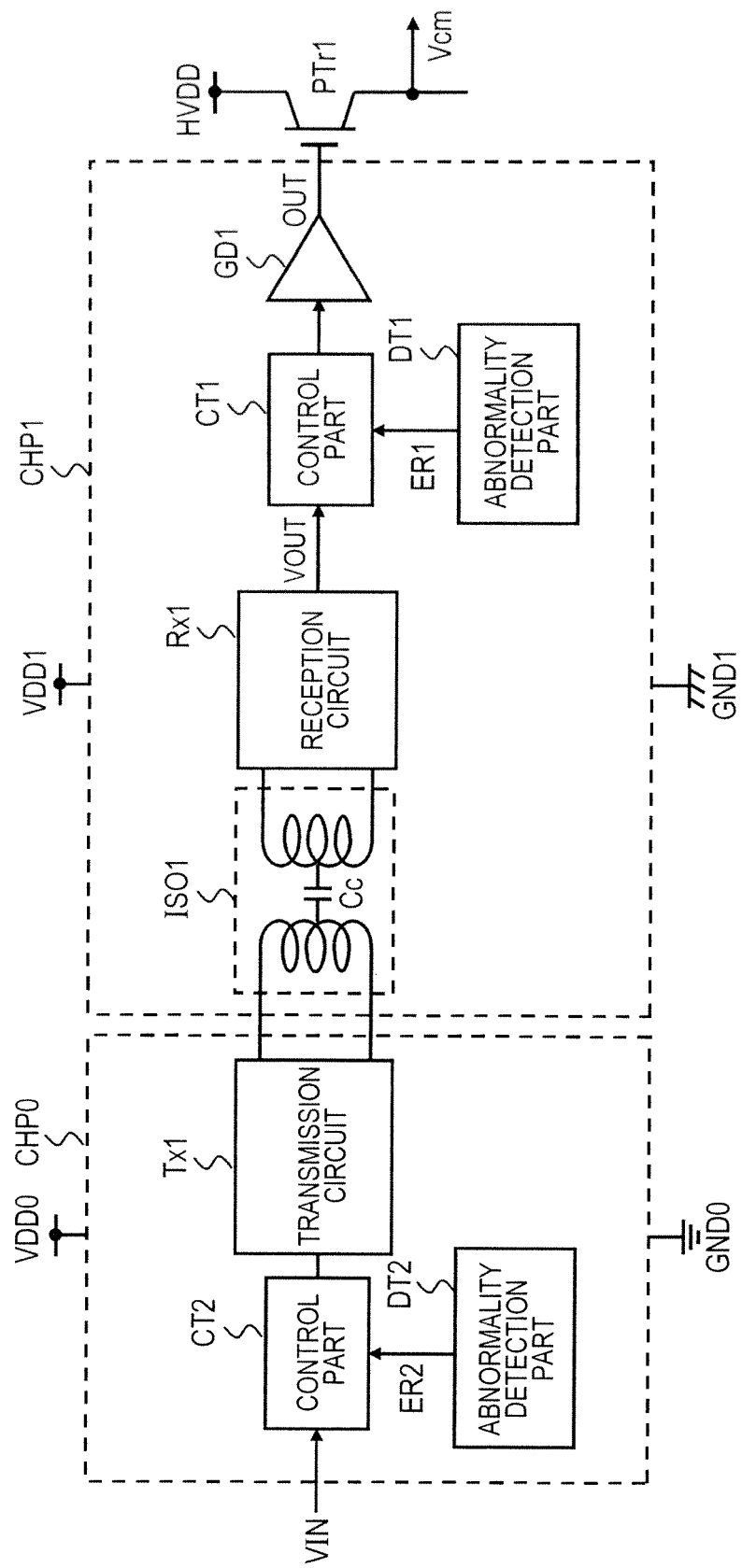
FIG. 46 is a block diagram showing another typical configuration of the semiconductor integrated circuit as the fourth embodiment.
Figure 47:
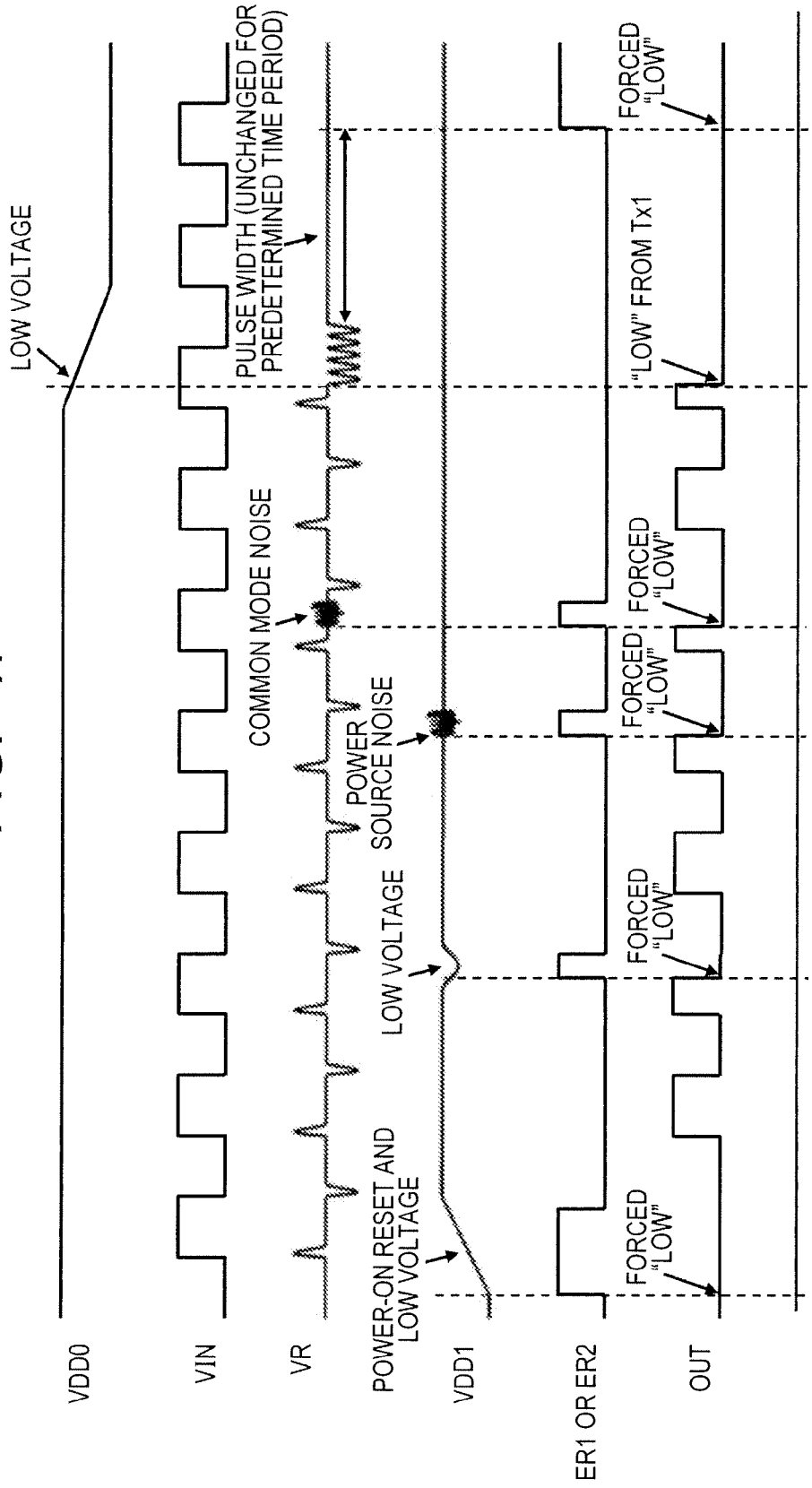
FIG. 47 is a timing chart showing typical operations of the semiconductor integrated circuit in FIG. 46.

Also, the foregoing paragraphs describing the fourth embodiment gave the example in which the semiconductor integrated circuit 2 has the abnormality detection part DT2 and control part CT2 furnished on the side of the semiconductor chip CHP0. Alternatively, as shown in FIG. 46, the semiconductor integrated circuit 2 may be configured differently in such a manner that the abnormality detection part DT1 and control part CT1 are further provided on the side of the semiconductor chip CHP1. FIG. 47 is a timing chart showing typical operations of the semiconductor integrated circuit 2 in FIG. 46. As is clear from FIG. 47, upon detection of an abnormality by the abnormality detection part DT1 or DT2, the gate control signal OUT is controlled to be at the low level (i.e., the power transistor PTr1 is controlled to be off) regardless of the transmission data VIN.

Fifth Embodiment

Figure 48:
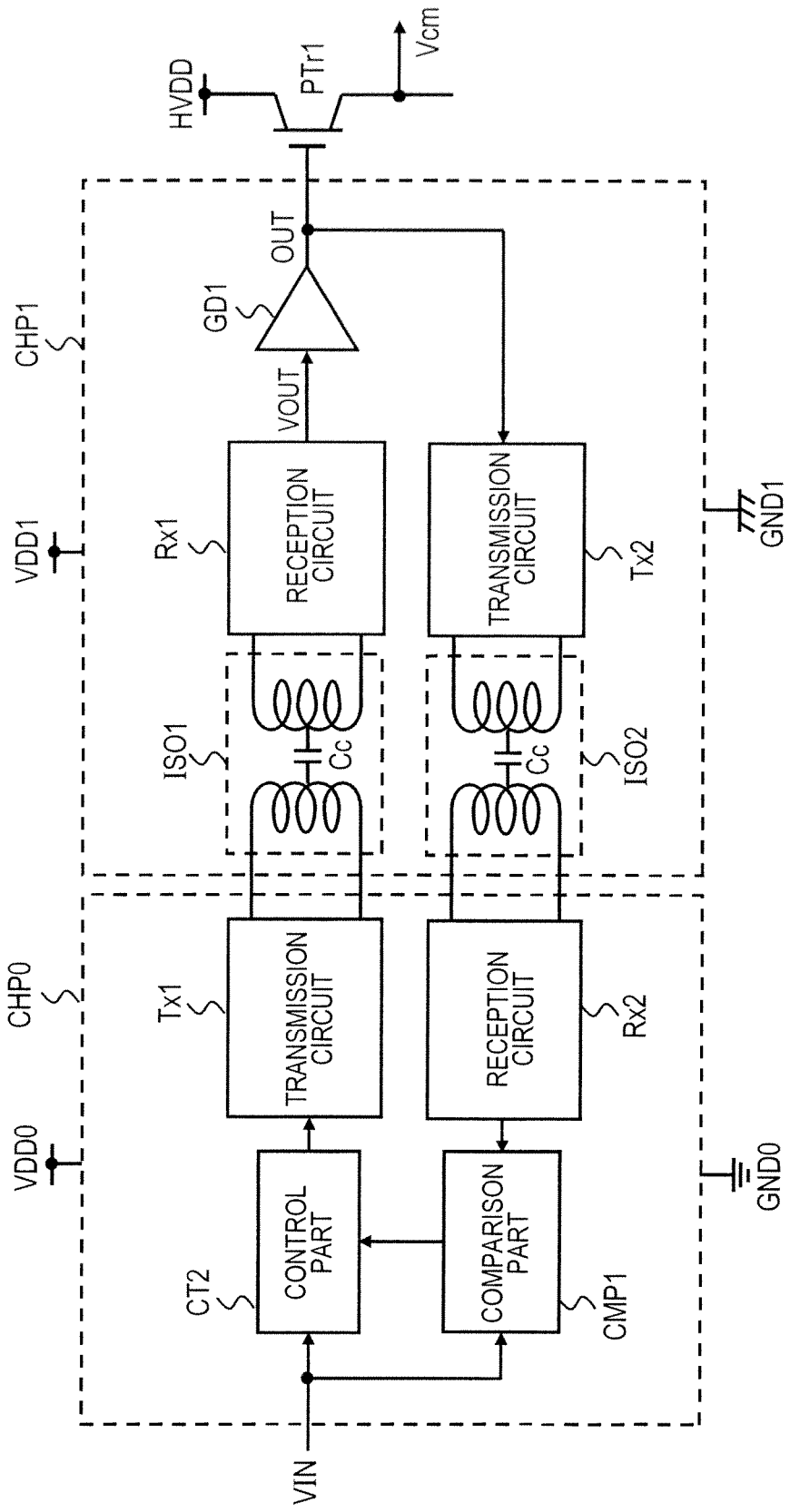
FIG. 48 is a block diagram showing a typical configuration of a semiconductor integrated circuit as a fifth embodiment of the present invention.

FIG. 48 is a block diagram showing a typical configuration of a semiconductor integrated circuit 3 as the fifth embodiment of the present invention. The semiconductor integrated circuit 3 shown in FIG. 48 includes a comparison part CMP1 that compares the logical value of the gate control signal OUT from the gate driver GD1 with the logical value of the transmission data VIN corresponding to the gate control signal OUT in question. The comparison part CMP1 also functions as an abnormality detection part detecting an abnormality that can cause a malfunction in signal transmission via the isolation element ISO1. That is, if the logical value of the gate control signal OUT is different from the logical value of the transmission data VIN corresponding to the gate control signal OUT, the comparison part CMP1 determines that an abnormality that may possibly cause a malfunction in signal transmission via the isolation element ISO1 has occurred.

Compared with the semiconductor integrated circuit 2 shown in FIG. 44, the semiconductor integrated circuit 3 in FIG. 48 has the comparison part CMP1 replacing the abnormality detection part DT2 and further includes a transmission circuit (second transmission circuit) Tx2, a reception circuit (second reception circuit) Rx2, and an isolation element (second isolation element) ISO2. As mentioned above, the comparison part CMP1 also serves as the abnormality detection part.

The transmission circuit Tx2 is formed along with the reception circuit Rx1 over the semiconductor chip CHP1. The reception circuit Rx2 is formed together with the transmission circuit Tx1 over the semiconductor chip CHP0.

The transmission circuit Tx1 converts the gate control signal OUT from the gate drive GD1 into a pulse signal and outputs the pulse signal as the transmission signal. The isolation element ISO2 forwards the transmission signal coming from the transmission circuit Tx2 to the reception circuit Rx2 as the reception signal. Based on the reception signal from the isolation element ISO2, the reception circuit Rx2 reproduces and outputs the gate control signal OUT.

The comparison part CMP1 compares the gate control signal OUT reproduced by the reception circuit Rx2 with the transmission data VIN corresponding to the gate control signal OUT in question. If the logical value of the reproduced gate control signal OUT matches the logical value of the transmission data VIN corresponding to the gate control signal OUT, the comparison part CMP1 outputs a low-level comparison result; in case of a mismatch, the comparison part CMP1 outputs a high level comparison result.

Upon detection of an abnormality by the comparison part CMP1, the control part CT2 outputs a stop signal to turn off the power transistor PTr1 regardless of the externally supplied transmission data VIN.

For example, if the comparison result from the comparison part CMP1 is at the low level, i.e., if any abnormality that can cause a malfunction in signal transmission via the isolation element ISO1 is not detected, the control part CT2 outputs the externally supplied transmission data VIN unchecked to the transmission circuit Tx1. This allows the conduction state of the power transistor PTr1 to be controlled in accordance with the transmission data VIN. On the other hand, if the comparison result from the comparison part CMP1 is at the high level, i.e., if an abnormality that can cause a malfunction in signal transmission via the isolation element ISO1 is detected, the control part CT2 outputs a low-level stop signal to the transmission circuit Tx1 regardless of the externally supplied transmission data VIN. This causes the transmission circuit Tx1 to convert the low-level stop signal into the transmission signal that is output. The transmission signal from the transmission circuit Tx1 is forwarded via the isolation element ISO1 to the reception circuit Rx1 as the reception signal. Consequently the power transistor PTr1 is controlled to be turned off.

As explained above, upon detection of an abnormality that can cause a malfunction in signal transmission via the isolation element ISO1 following the comparison between the gate control signal OUT and the transmission data VIN, the semiconductor integrated circuit 2 as the fifth embodiment turns off the power transistor PTr1 that is the target to be controlled. The inventive semiconductor integrated circuit 3 thus prevents the power transistor PTr1 from getting inadvertently turned on and thereby forestalls the malfunction of the load.

The foregoing paragraphs describing the fifth embodiment gave the example in which the comparison part CMP1 outputs the result of the comparison solely to the control part CT2. Alternatively, the comparison part CMP1 may feed the comparison result back to a microcomputer (not shown in FIG. 48). In this case, upon detection of an abnormality by the comparison part CMP1, the microcomputer may again output the transmission data VIN of the same value. As another alternative, if the comparison part CMP1 detects an abnormality, the microcomputer may output as the transmission data VIN a stop signal (low-level signal) that turns off the power transistor PTr1.

Also, the foregoing paragraphs describing the fifth embodiment gave the example in which the semiconductor integrated circuit 3 has the comparison part CMP1 and control part CT2 furnished on the side of the semiconductor chip CHP0. Alternatively, the semiconductor integrated circuit 3 may be configured differently in such a manner that the abnormality detection part DT2 is further provided on the side of the semiconductor chip CHP0. As another alternative, the semiconductor integrated circuit 3 may be configured in such a manner that the abnormality detection part DT1 and control part CT1 are further provided on the side of the semiconductor chip CHP1. Since the comparison part CMP1 also functions as the abnormality detection part, the comparison part CMP1 may be included in the abnormality detection part DT2.

Sixth Embodiment

Explained below as the sixth embodiment of the present invention is an application example of the semiconductor integrated circuit embodying this invention. A semiconductor integrated circuit 4 shown in FIG. 49 as the sixth embodiment has the capability of detecting an abnormality regarding the semiconductor chip CHP0 or CHP1 and turning off the power transistor PTr1 upon such detection, as well as the capability of feeding the result of the detection from the abnormality detection part back to a microcomputer.

Figure 49:
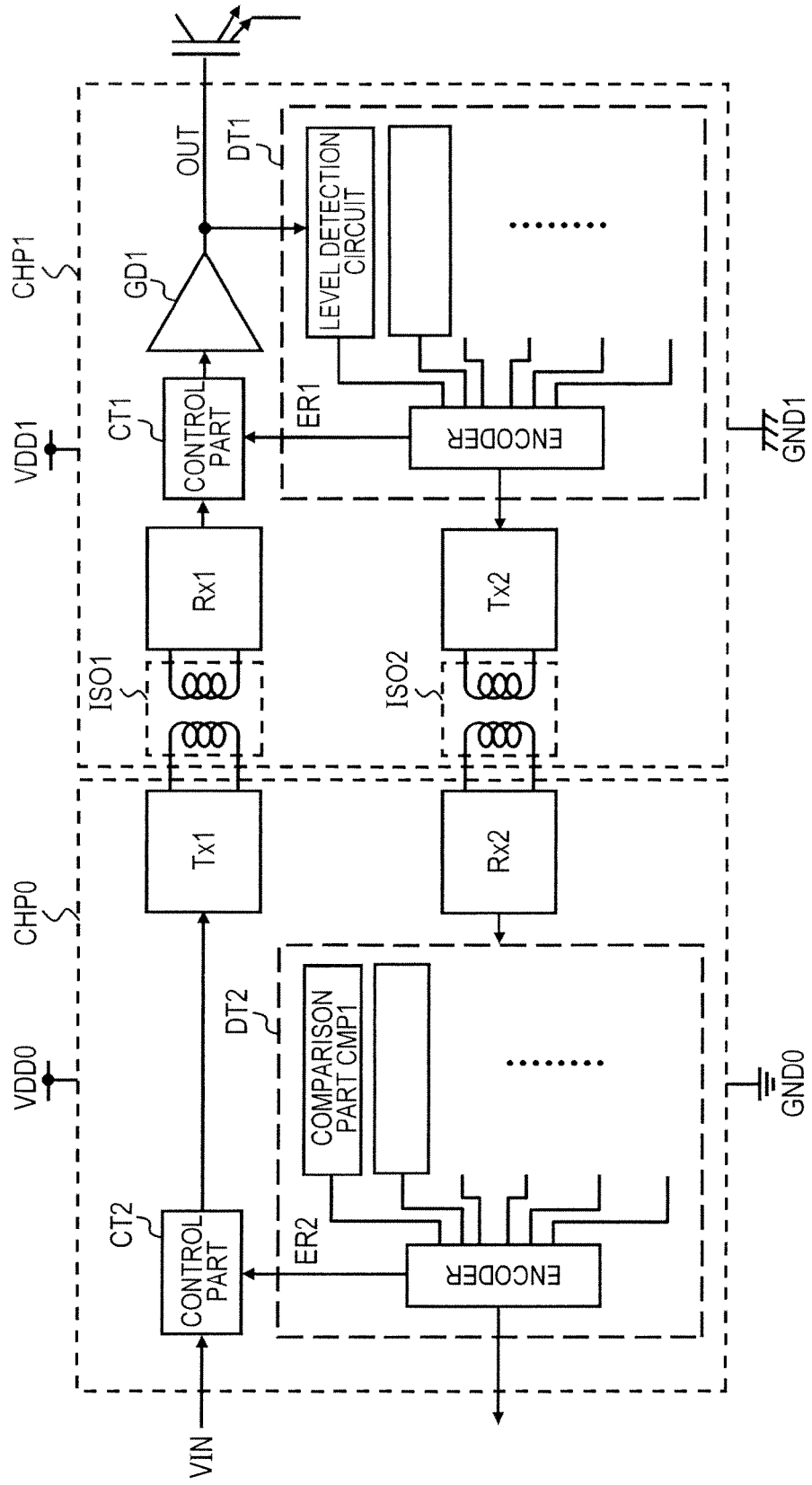
FIG. 49 is a block diagram showing a typical configuration of a semiconductor integrated circuit as a sixth embodiment of the present invention.

The semiconductor integrated circuit 4 shown in FIG. 49 has the abnormality detection part DT1 and control part CT1 furnished on the side of the semiconductor chip CHP1 and the abnormality detection part DT2 and control part CT2 provided on the side of the semiconductor chip CHP0. The basic configurations and operations of the functional blocks making up the semiconductor integrated circuit 4 are the same as those discussed so far. Thus some characteristic features of the components involved are mainly described below.

The abnormality detection part DT1 further includes a level detection circuit that detects the voltage level of the gate control signal OUT. The abnormality detection part DT1 has an encoder in place of the OR circuit in its output stage. The abnormality detection part DT1 outputs the detection result ER1 from the encoder to the control part CT1 and also feeds the detection result ER1 back to the abnormal detection part DT2.

The abnormality detection part DT2 further includes the comparison part CMP1 as one of a plurality of detection circuits for detecting abnormalities. The comparison part CMP1 compares the detection result stemming from the level detection circuit (logical value of the gate control circuit OUT) and fed back from the abnormality detection part DT1 with the logical value of the corresponding transmission data VIN, and outputs the result of the comparison. The abnormality detection part DT2 has an encoder in place of the OR circuit in its output stage. Based on the detection result from any one of the multiple detection circuits it possesses, the abnormality detection part DT2 generates the detection result ER2 that is output to the control part CT2. Also, the abnormality detection part DT2 feeds the detection result ER2 and the fed-back detection result ER1 back to a microcomputer, not shown.

Figure 50:
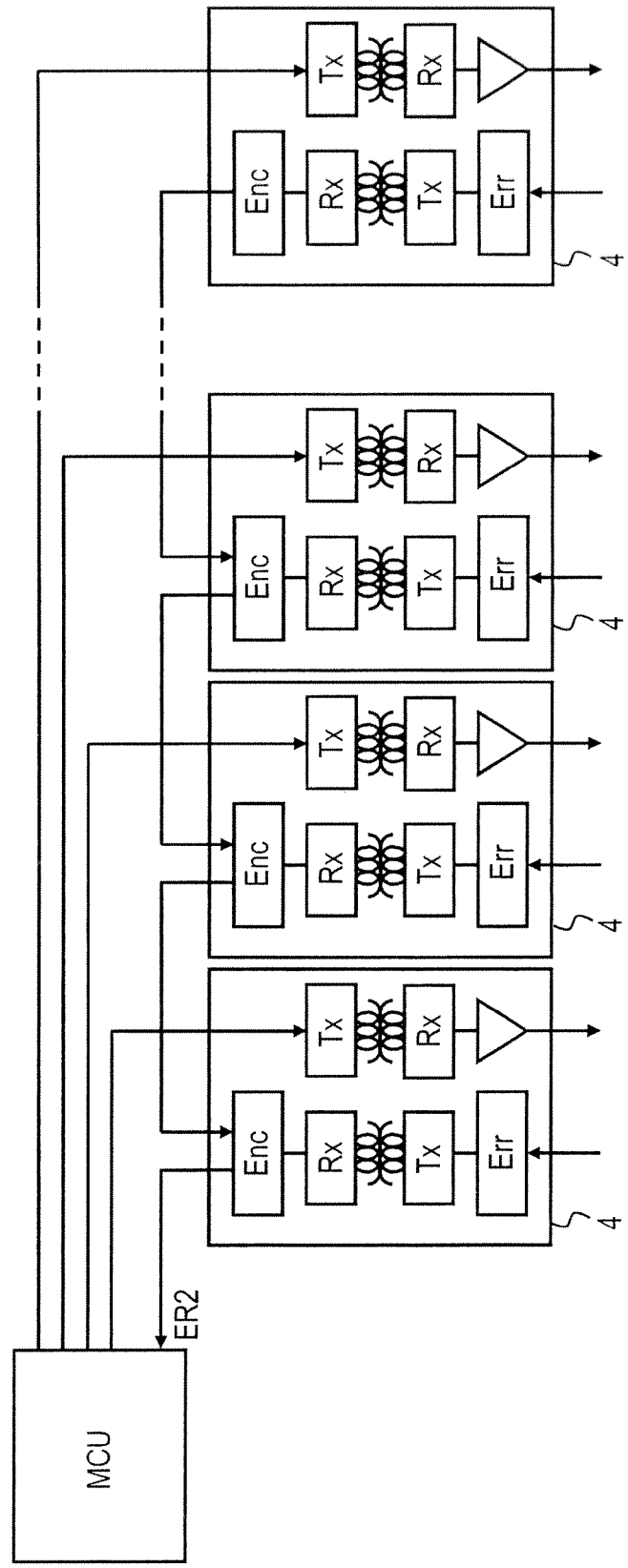
FIG. 50 is a schematic view explanatory of the relations of coupling between the semiconductor integrated circuit as the sixth embodiment and a microcomputer.

For example, upon detection of an abnormality by the abnormality detection part DT1 or DT2, the microcomputer may again output the transmission data VIN of the same value. Alternatively, if the abnormality detection part DT1 or DT2 detects an abnormality, the microcomputer may output as the transmission data VIN a stop signal (low-level signal) that turns off the power transistor PTr1.

Where a plurality of semiconductor integrated circuits 4 are provided, the encoders included in their respective abnormality detection parts may be coupled in a chain so that the detection result ER2 from the encoder in the last stage of the chain may be fed back to the microcomputer, as shown in FIG. 50.

Seventh Embodiment

Figure 51:
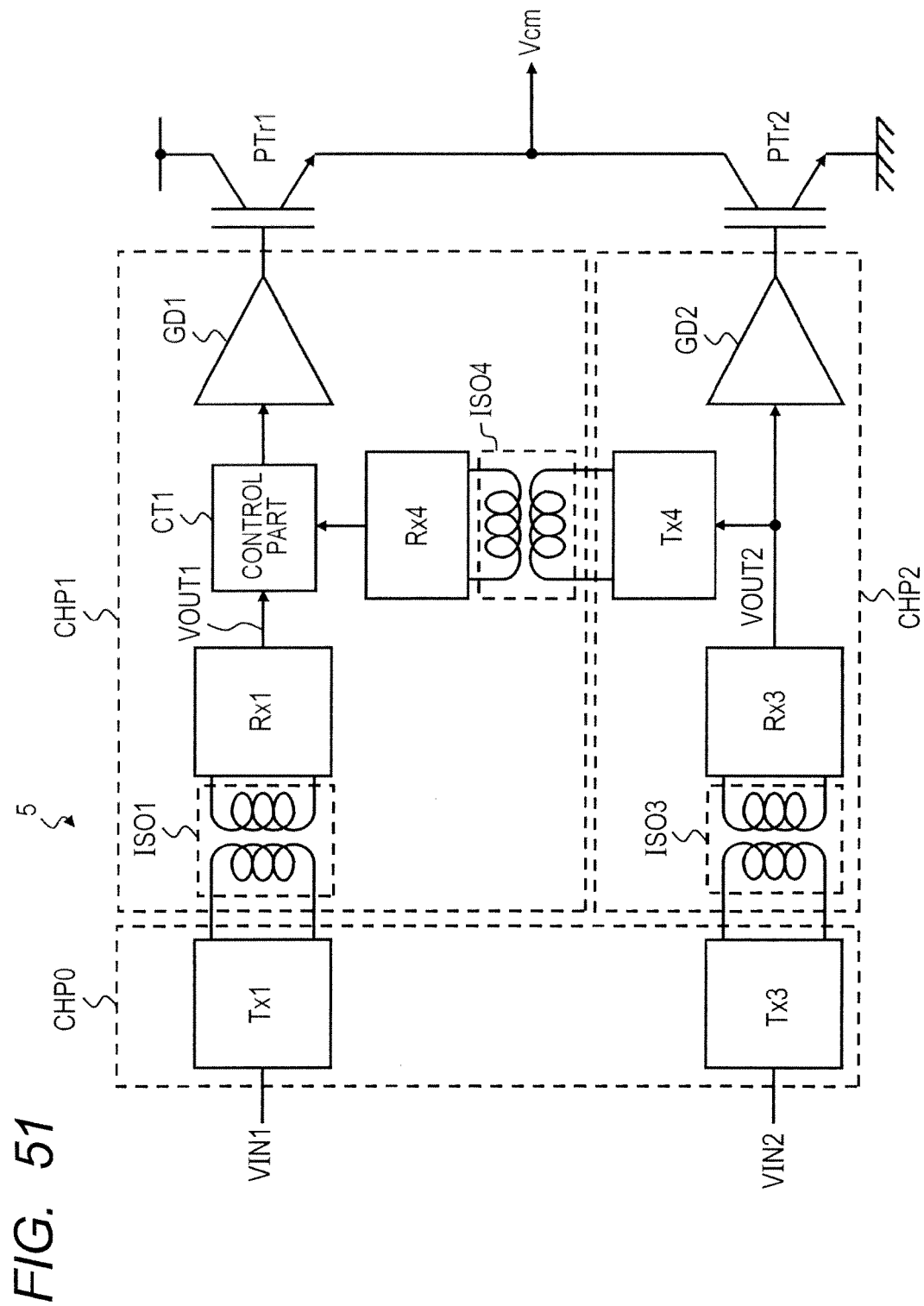
FIG. 51 is a block diagram showing a typical configuration of a semiconductor integrated circuit as a seventh embodiment of the present invention.
Figure 52:
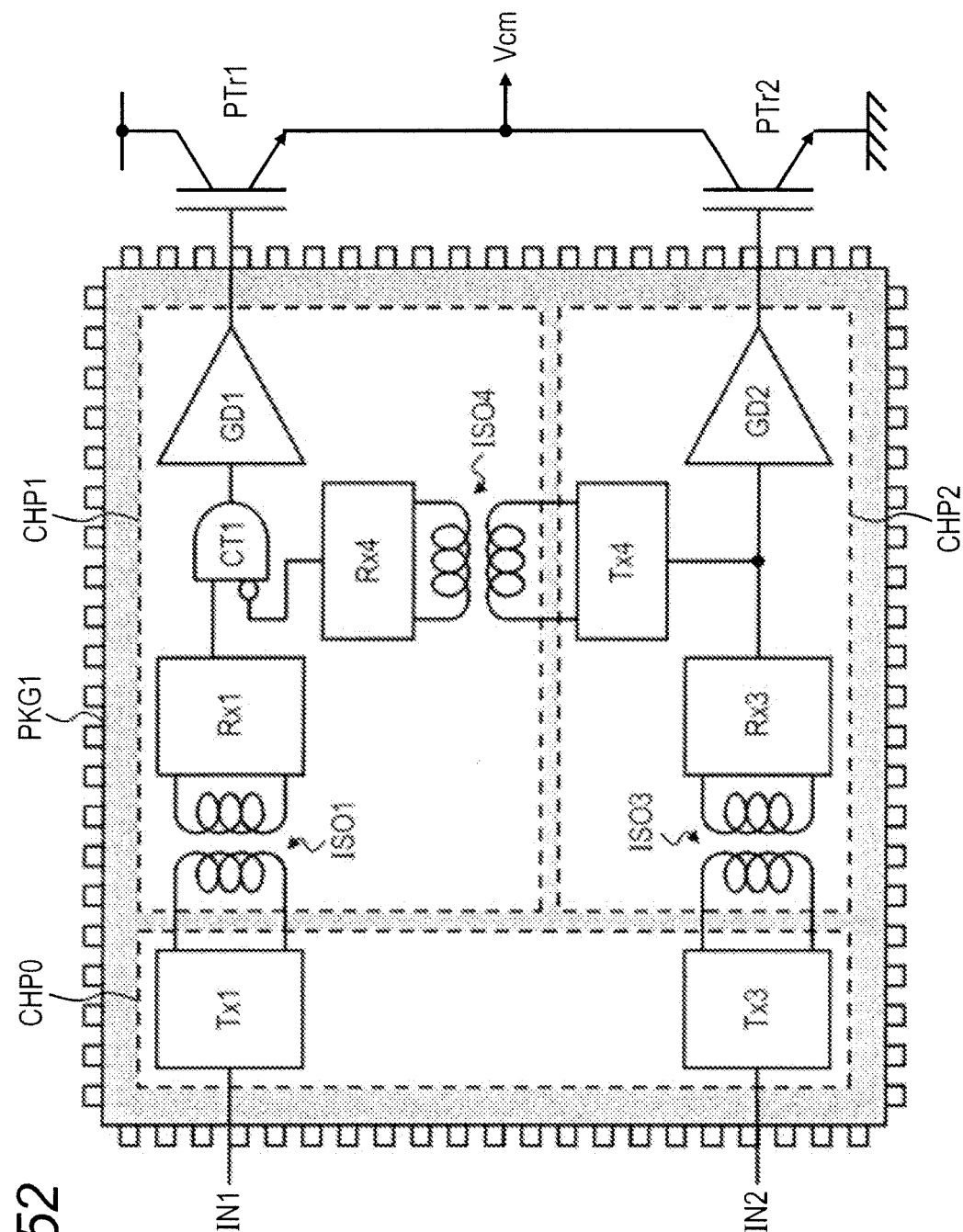
FIG. 52 is a schematic view showing how the semiconductor integrated circuit as the seventh embodiment is typically packaged.
Figure 53:
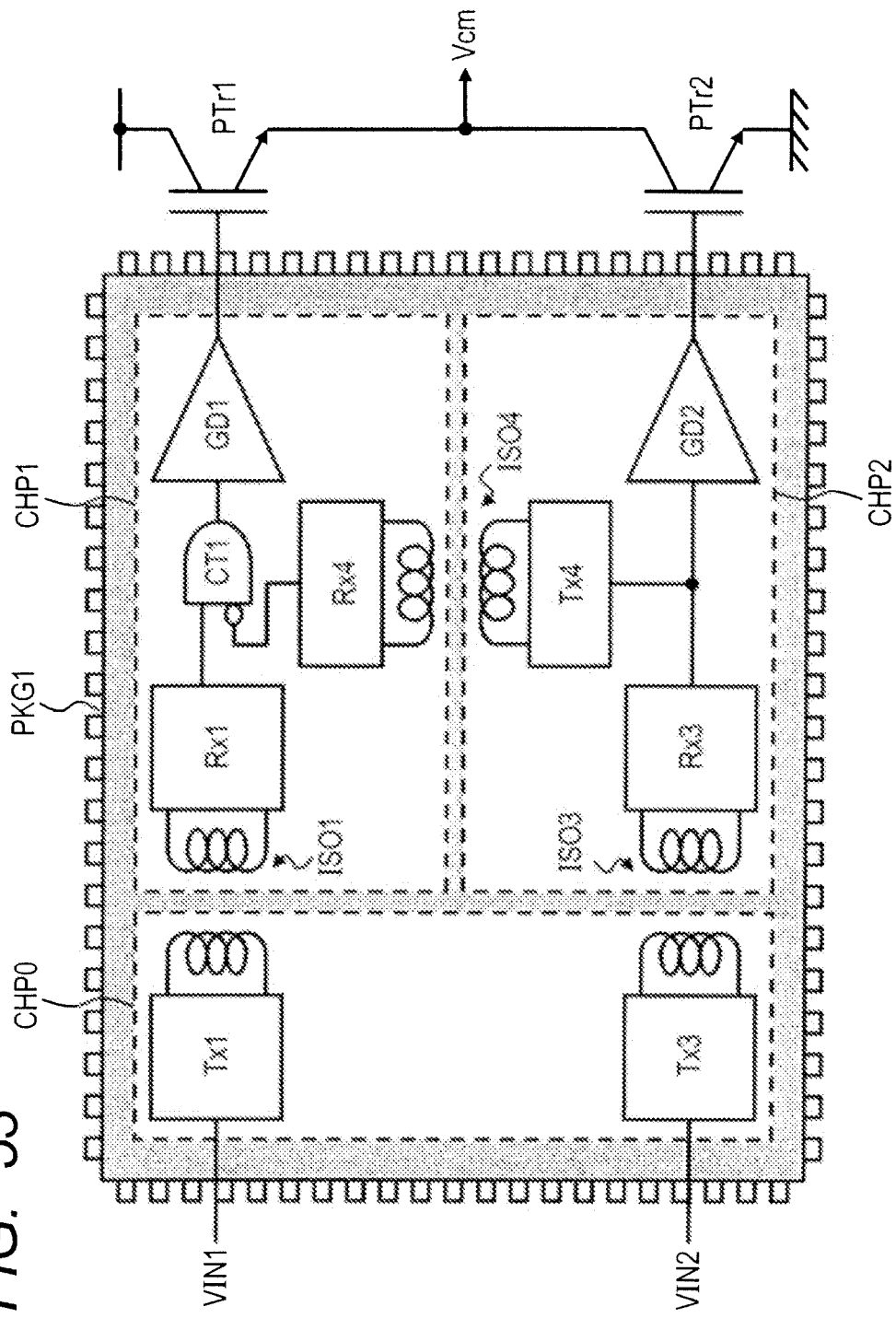
FIG. 53 is another schematic view showing how the semiconductor integrated circuit as the seventh embodiment is typically packaged.
Figure 54:
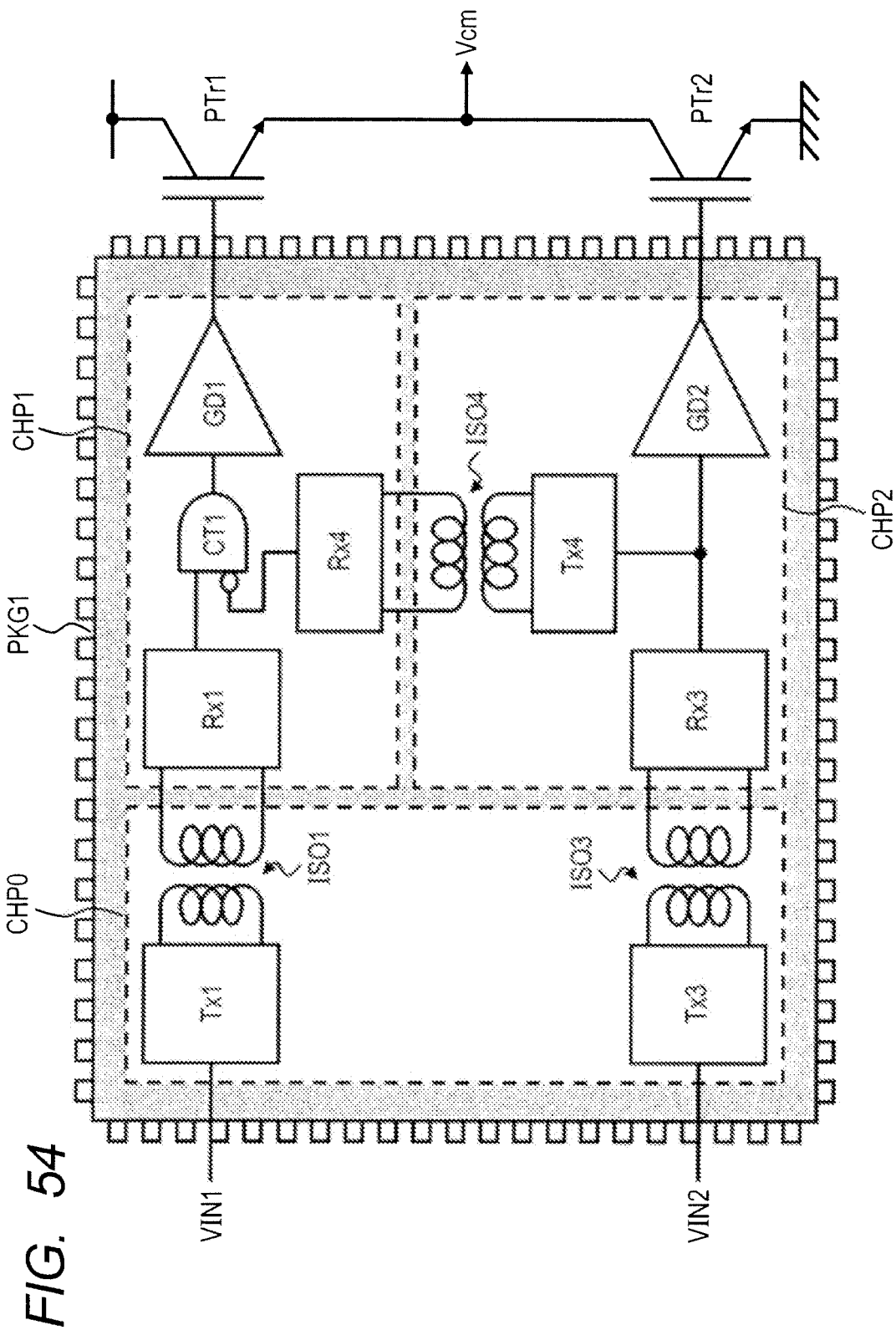
FIG. 54 is another schematic view showing how the semiconductor integrated circuit as the seventh embodiment is typically packaged.
Figure 55:
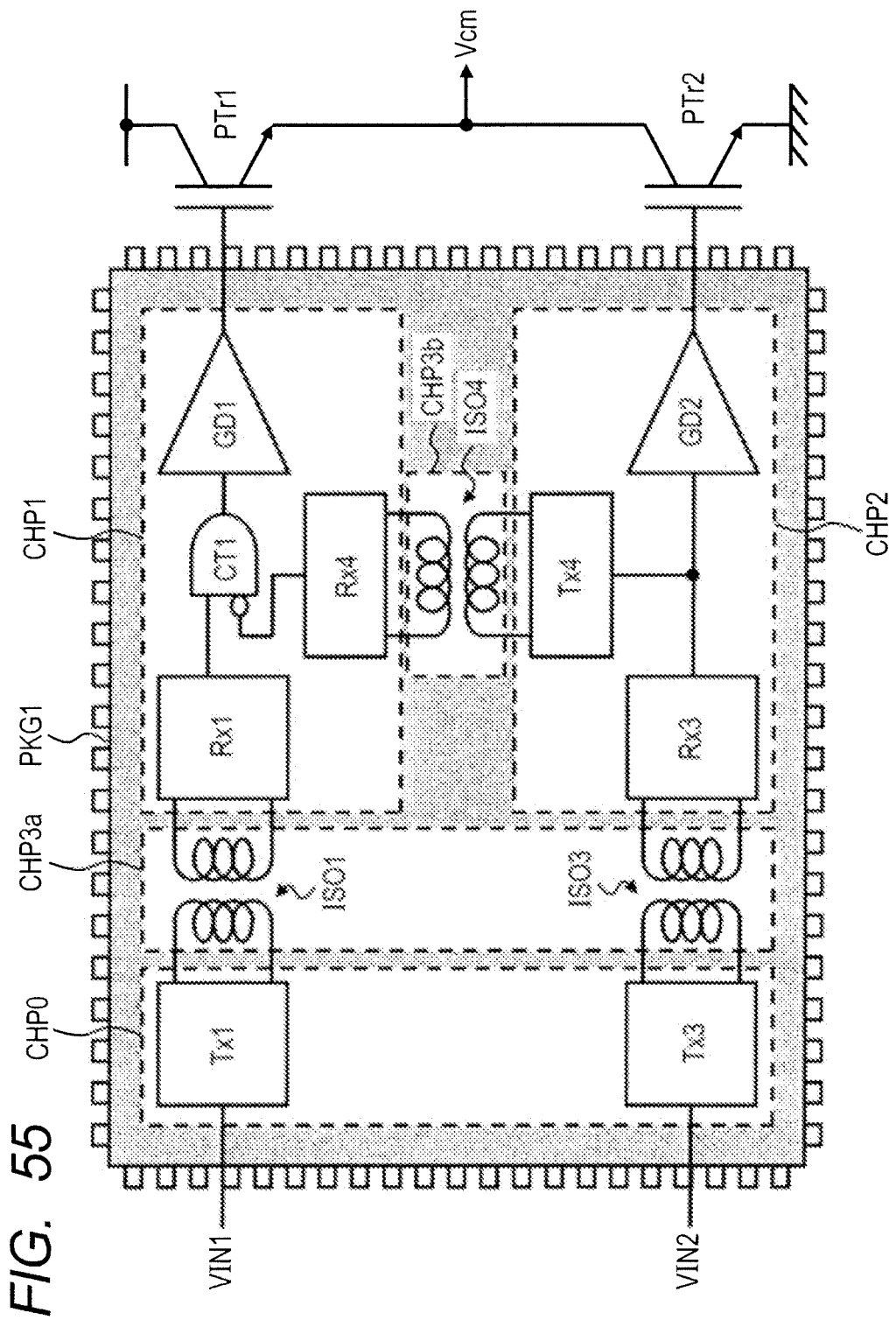
FIG. 55 is another schematic view showing how the semiconductor integrated circuit as the seventh embodiment is typically packaged.

FIG. 51 is a block diagram showing a typical configuration of a semiconductor integrated circuit 5 as the seventh embodiment of the present invention. The semiconductor integrated circuit 5 configured as the seventh embodiment controls the conduction state of two power transistors PTr1 and PTr2 that are the targets to be controlled.

The semiconductor integrated circuit 5 shown in FIG. 51 includes the transmission circuit Tx1, another transmission circuit (third transmission circuit) Tx3, another transmission circuit (fourth transmission circuit) Tx4, the reception circuit Rx1, another reception circuit (third reception circuit) Rx3, another reception circuit (fourth reception circuit) Rx4, the isolation element ISO1, another isolation element (third isolation element) ISO3, another isolation element ISO4 (fourth isolation element), the control part CT1, and gate drivers GD1 and GD2. The reception circuits Rx3 and Rx4 and the isolation elements ISO3 and ISO4 make up a single abnormality detection circuit for detecting an abnormality that can cause a malfunction in signal transmission via the isolation element ISO1. FIG. 51 shows the power transistor PTr1 as the target to be controlled using the transmission data VIN1 (first data signal) reproduced by the reception circuit Rx1. FIG. 51 also shows the power transistor PTr2 as the target to be controlled using the transmission data VIN2 (second data signal) reproduced by the reception circuit Rx3.

The power transistors PTr1 and PTr2 are coupled in series between the source voltage terminal HVDD and a ground voltage terminal to which a ground voltage GND is supplied (the terminal is called the ground voltage terminal GND). The voltage of a node between the two power transistors PTr1 and PTr2 is used as a load drive signal Vcm. The power transistors PTr1 and PTr2 are turned on and off in complementary fashion.

The transmission circuits Tx1 and Tx3 are formed over the semiconductor chip CHP0. The isolation elements ISO1 and ISO4, reception circuits Rx1 and Rx4, control part CT1, and gate driver GD1 are formed over the semiconductor chip CHP1. The isolation element ISO3, reception circuit Rx3, transmission circuit Tx4, and gate driver GD2 are formed over a semiconductor chip (third semiconductor chip) CHP2. The semiconductor chip CHP2 is driven by a third power source (source voltage VDD2, ground voltage GND2) belonging to a third power supply system.

The configurations and operations of the transmission circuit Tx3, isolation element ISO3, reception circuit Rx3, and gate driver GD2 are substantially the same as those of the transmission circuit Tx1, isolation element ISO1, reception circuit Rx1, and gate driver GD1, respectively. It should be noted that the transmission circuit Tx1 is supplied with the transmission data VIN1 and the transmission circuit Tx3 with the transmission data VIN2. The reception circuit Rx1 outputs output data VOUT1 and the reception circuit Rx3 outputs output data VOUT2. The gate driver GD1 controls the conduction state of the power transistor PTr1 by driving the output data VOUT1. The gate driver GD2 controls the conduction state of the power transistor PTr2 by driving the output data VOUT2.

The transmission circuit Tx4 converts the output data VOUT2 from the reception circuit Rx3 into a pulse signal that is output as the transmission signal. The isolation element ISO4 forwards the transmission signal coming from the transmission circuit Tx4 to the reception circuit Rx4 as the reception signal. In this manner, the transmission signal from the transmission circuit Tx4 is sent via the isolation element ISO4 to the reception circuit Rx4 as the reception signal. Based on the reception signal, the reception circuit Rx4 reproduces and outputs the output data VOUT2.

When the reproduced output data VOUT2 is at the low level, the control part CT1 outputs the output data VOUT unchecked. When the reproduced output data VOUT2 is at the high level, the control part CT1 outputs a low-level stop signal regardless of the output data VOUT1 (i.e., regardless of the transmission data VIN1).

Explained below are typical operations performed by the semiconductor integrated circuit 5 in FIG. 51 when turning off the power transistor PTr1 and turning on the power transistor PTr2. In this case, the transmission circuit Tx1 is supplied with the low-level transmission data VIN1 and the transmission circuit Tx3 with the high-level transmission data VIN2.

Where any abnormality that can cause a malfunction in signal transmission via the isolation element ISO1 has not occurred, the reception circuit Rx1 outputs the low-level output data VOUT1 because there is no malfunction in signal transmission via the isolation element ISO1. At this point, the reception circuit Rx3 outputs the high-level output data VOUT2. This causes the power transistor PTr1 to be turned off and the power transistor PTr2 to be turned on. That is, the normal switching operations are carried out.

On the other hand, if there has occurred an abnormality that can cause a malfunction in signal transmission via the isolation element ISO1 and if the malfunction has actually taken place in the signal transmitted via the isolation element ISO1, the reception circuit Rx1 outputs the high-level output data VOUT1 that is different from the transmission data VIN1. At this point, the reception circuit Rx3 outputs the high-level output data VOUT2. If the transmission circuit Tx4, isolation element ISO4, reception circuit Rx4, and control part CT1 were not provided, the power transistors PTr1 and PTr2 would both be turned on. This would let through-currents flow through the power transistors PTr1 and PTr2 and increase consumption current.

The problem outlined above is resolved by the semiconductor integrated circuit 5 of the seventh embodiment using the transmission circuit Tx4, isolation element ISO4, reception circuit Rx4, and control part CT1 incorporated therein. Since the power transistors PTr1 and PTr2 are turned on and off in complementary fashion, the output data VOUT1 should be at the low level when the output data VOUT2 is at the high level. Thus if the output data VOUT1 is at the high level when the output data VOUT2 is at the high level, there is a possibility that a malfunction has occurred in signal transmission via the isolation element ISO1. In this case, based on the output data VOUT1 and on the reproduced output data VOUT2, the control part CT1 determines that a malfunction that can cause a malfunction in signal transmission via the isolation element ISO1 has occurred, and outputs a low-level stop signal. This turns off the power transistor PTr1 and prevents through-currents from flowing through the power transistors PTr1 and PTr2, thereby inhibiting the increase in consumption current.

As explained above, the semiconductor integrated circuit 5 as the seventh embodiment compares the output data VOUT1 from one reception circuit Rx1 with the output data VOUT2 from another reception circuit Rx3 to detect an abnormality that can cause a malfunction in signal transmission via the isolation element ISO1, and performs control to turn off the power transistor PTr1 that is the target to be controlled. The semiconductor integrated circuit 5 as the seventh embodiment thus prevents the power transistor PTr1 from getting inadvertently turned on. This in turn inhibits the increase in consumption current attributable to through-currents flowing through the power transistors PTr1 and PTr2.

The seventh embodiment above was shown configured so that upon detection of an abnormality that can cause a malfunction in signal transmission via the isolation element ISO1, the power transistor PTr1 as one target to be controlled is forcibly turned off. Alternatively, the embodiment may be configured in such a manner that upon detection of an abnormality that can cause a malfunction in signal transmission via the isolation element ISO1, the power transistor PTr2 as another target to be controlled is forcibly turned off. As another alternative, these configurations may be combined.

Alternatively, the semiconductor integrated circuit 5 as the seventh embodiment may be configured to have the abnormality detection part DT1 and control part CT1 included in the semiconductor chip CHP1. As another alternative, the semiconductor integrated circuit 5 of this embodiment may be configured to have an abnormality detection part (corresponding to the abnormality detection part DT1 in FIG. 1) and a control part (corresponding to the control part CT1 in FIG. 1) included in the semiconductor chip CHP2. As a further alternative, the semiconductor integrated circuit 5 of this embodiment may be configured to have the abnormality detection part DT2 and control part CT2 included on the side of the semiconductor chip CHP0.

(Typical Packaged States of the Semiconductor Integrated Circuit 5)

Explained below in reference to FIGS. 52 through 58 are some typical packaged states of the semiconductor integrated circuit 5 embodying the present invention. Unless otherwise specified, each of the packaged states shown in FIGS. 52 through 58 is an example in which the transformer is used as the isolation element. Some of these packaged states to be discussed below utilize an AND circuit as the control part CT1.

In each of the packaged states shown in FIGS. 52 through 55, a single package PKG1 carries semiconductor chips CHP0, CHP1, and CHP2 isolated from one another and operating from a different power supply system each. As shown in FIGS. 52 through 55, the isolation element ISO1 may be formed in a manner overlying the semiconductor chip CHP1, overlying the semiconductor chip CHP0, spanning the semiconductor chips CHP0 and CHP1, or overlying a separately furnished semiconductor chip CHP3a. The isolation element 1903 may be formed in a manner overlying the semiconductor chip CHP2, overlying the semiconductor chip CHP0, spanning the semiconductor chips CHP0 and CHP2, or overlying the separately furnished semiconductor chip CHP3a. Likewise, the isolation element ISO4 may be formed in a manner overlying the semiconductor chip CHP1, overlying the semiconductor chip CHP2, spanning the semiconductor chips CHP1 and CHP2, or overlying a separately furnished semiconductor chip CHP3b.

The packaged states in FIGS. 52 through 55 are each an example in which the transmission circuit (e.g., transmission circuit Tx1) and the reception circuit (e.g., reception circuit Rx1) are formed over different semiconductor chips (e.g., semiconductor chips CHP0 and CHP1) respectively. Alternatively, the transmission circuit and reception circuit may be formed over a single semiconductor chip (i.e., common semiconductor chip). In this case, the area in which the transmission circuit is located and the area in which the reception circuit is positioned are isolated from each other by an isolation layer formed inside the semiconductor chip.

Figure 56:
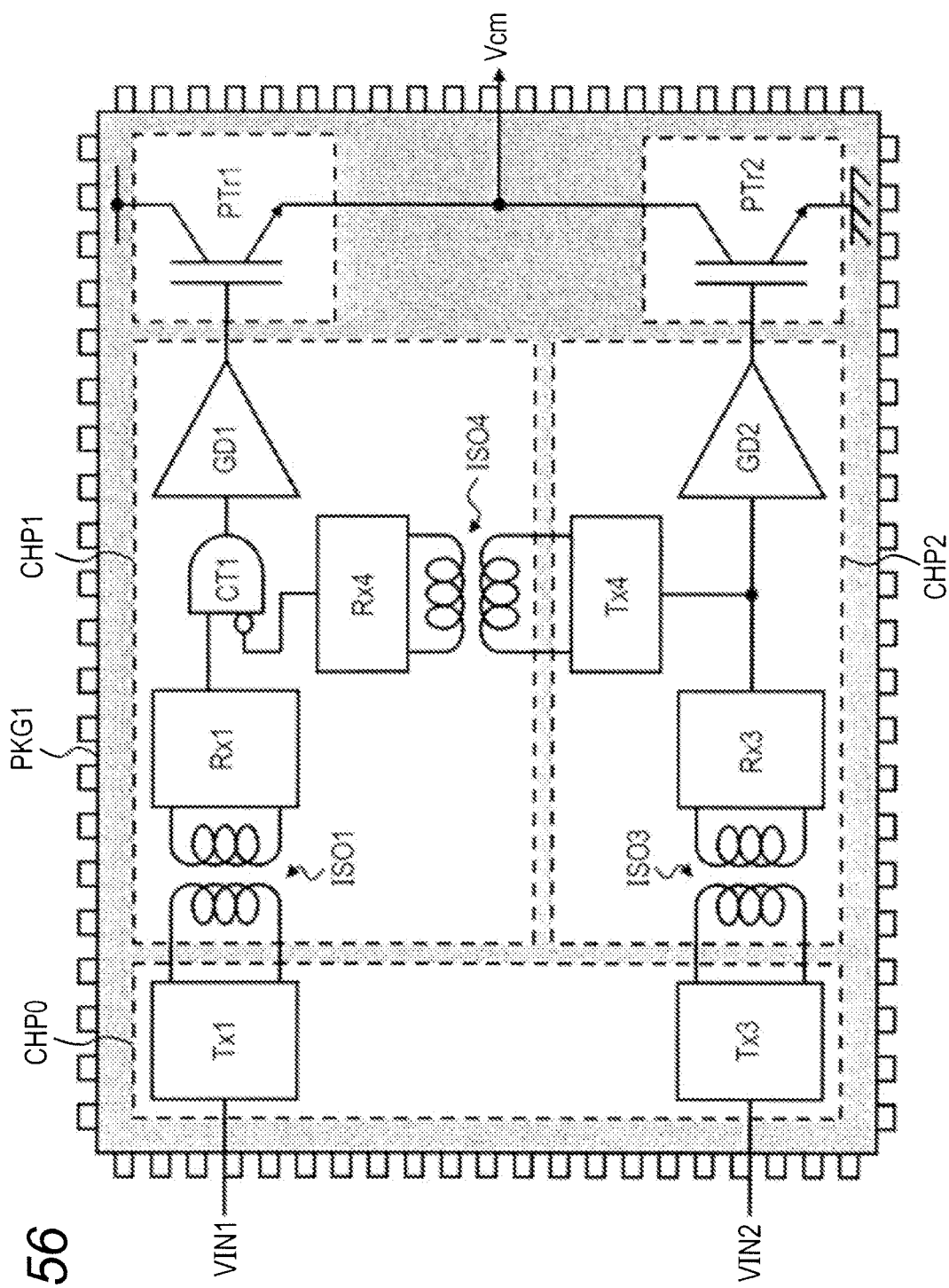
FIG. 56 is another schematic view showing how the semiconductor integrated circuit as the seventh embodiment is typically packaged.

Also, the packaged states in FIGS. 52 through 55 are each an example in which the power transistors PTr1 and PTr2 are discrete elements furnished outside the package PKG1. Alternatively, as shown in FIG. 56, the power transistors PTr1 and PTr2 may be furnished within the package PKG1.

Figure 57:
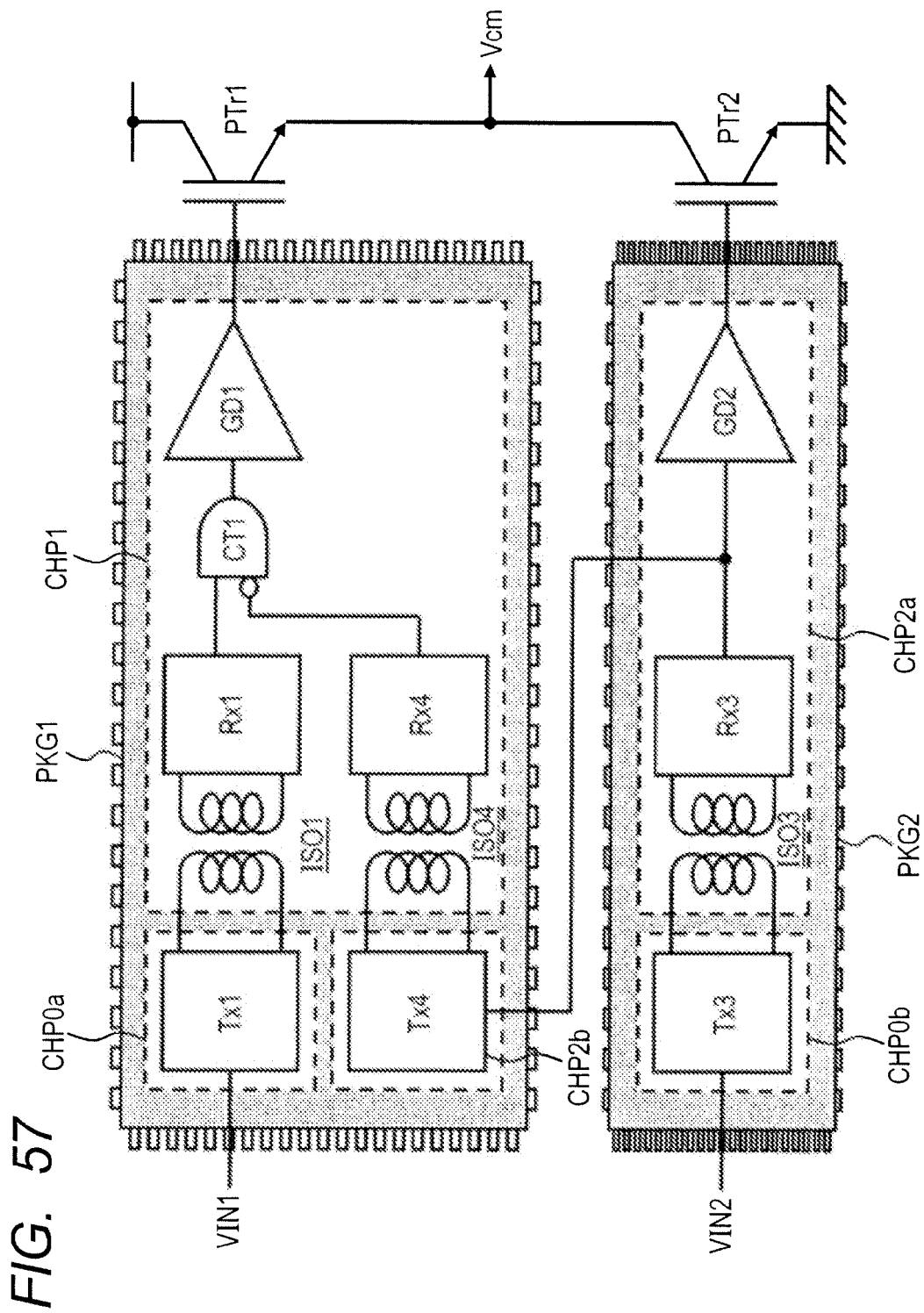
FIG. 57 is another schematic view showing how the semiconductor integrated circuit as the seventh embodiment is typically packaged.
Figure 58:
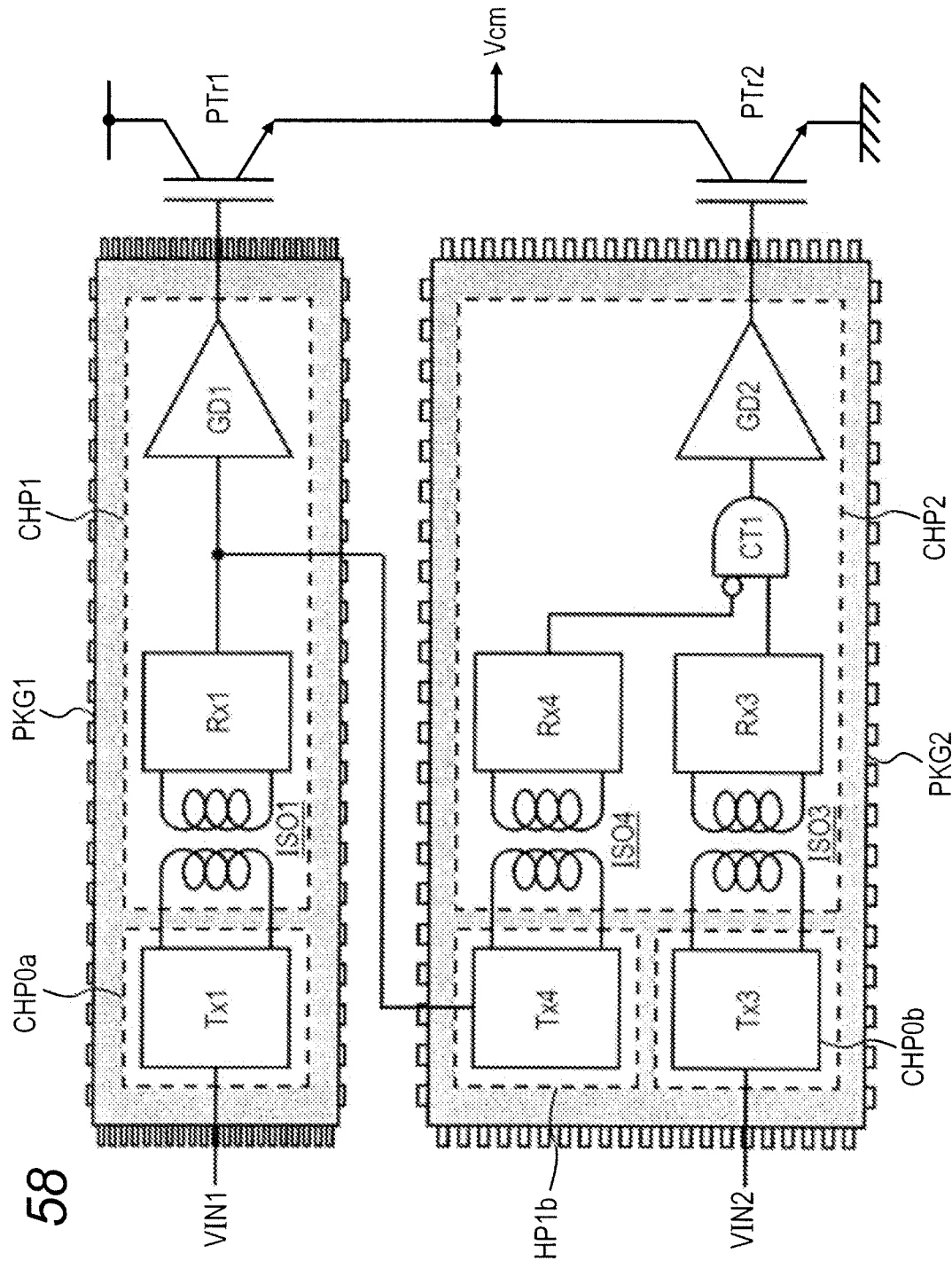
FIG. 58 is another schematic view showing how the semiconductor integrated circuit as the seventh embodiment is typically packaged.

Furthermore, the packaged states in FIGS. 52 through 55 are each an example in which the gate driver GD1 on the high side and the gate driver GD2 on the low side are furnished over a single package PKG1. Alternatively, as shown in FIGS. 57 and 58, the gate driver GD1 on the high side and the gate driver GD2 on the low side may be furnished respectively over packages PKG1 and PKG2 that are different from each other. In this case, the packages PKG1 and PKG2 are provided with additional external terminals for permitting communication between the two packages.

In the example of FIG. 57, semiconductor chips CHP0a and CHP0b operate from a common power source (first power source), and semiconductor chips CHP2a and CHP2b operate from another common power source (third power source). In the example of FIG. 58, the semiconductor chips CHP0a and CHP0b operate from one common power source (first power source), and semiconductor chips CHP1a and CHP1b operate from another common power source (second power source). FIG. 58 shows a typical packaged state in which upon detection of an abnormality that can cause a malfunction in signal transmission via the isolation element ISO3, the power transistor PTr2 is forcibly turned off.

Figure 59:
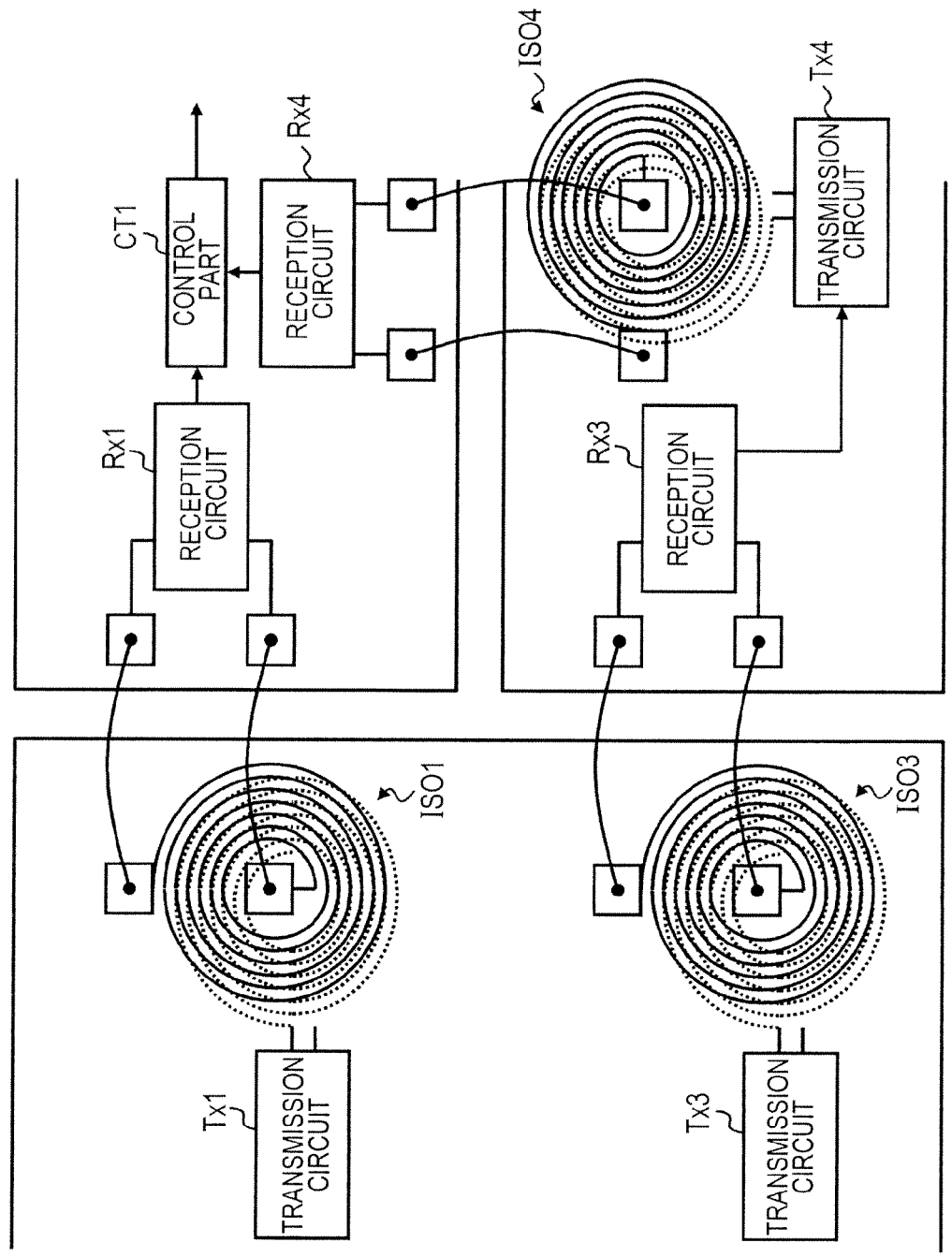
FIG. 59 is a schematic view showing a typical layout of the semiconductor integrated circuit as the seventh embodiment.
Figure 60:
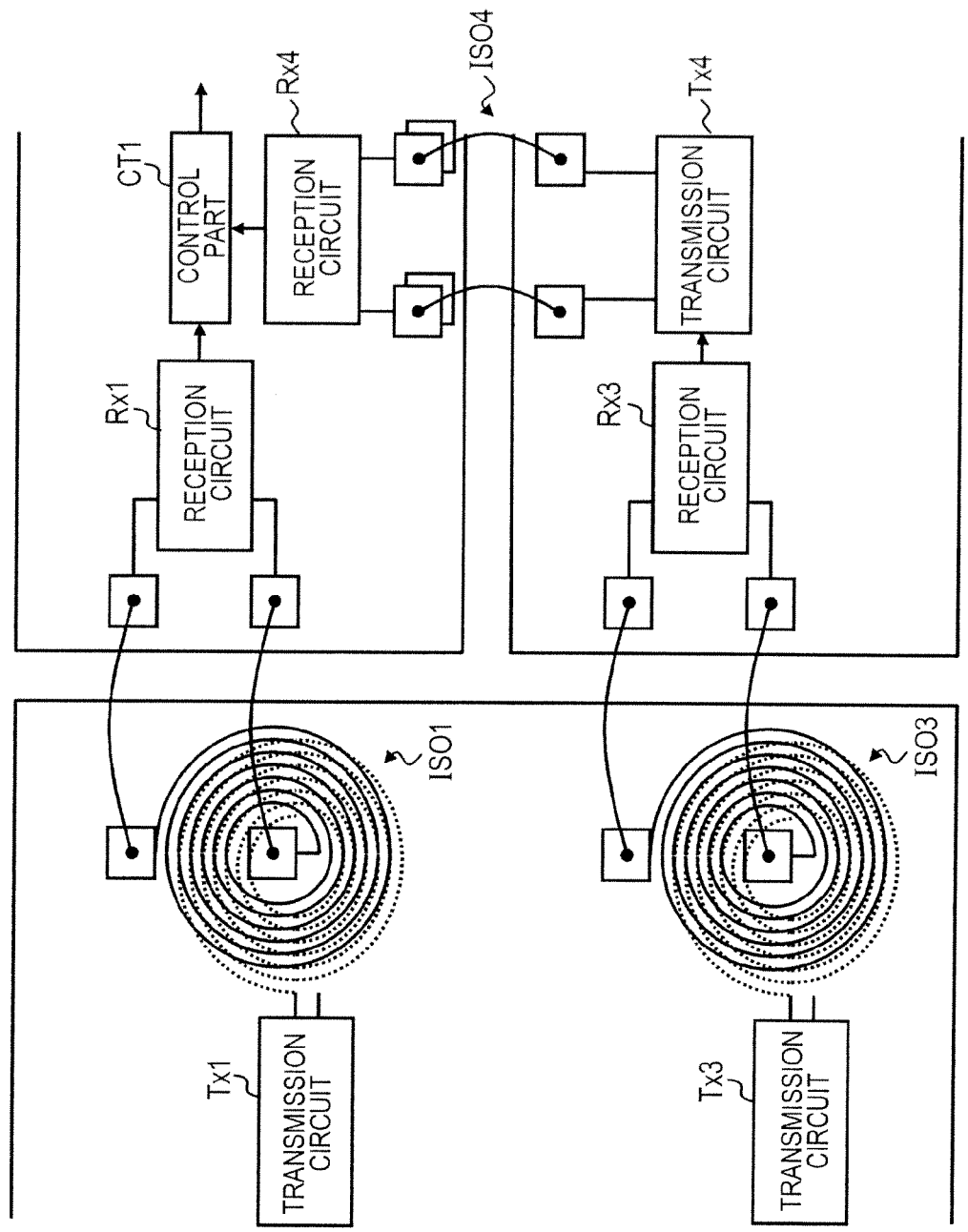
FIG. 60 is a schematic view showing another typical layout of the semiconductor integrated circuit as the seventh embodiment.

The packaged states in FIGS. 52 through 58 are each an example in which transformers are used as the isolation elements ISO1, ISO3 and ISO4. Alternatively, the type of the isolation elements ISO1 and ISO3 may be different from the type of the isolation element ISO4. For example, FIG. 59 shows an example in which transformers are used as the isolation elements ISO1, ISO3 and ISO4, whereas FIG. 60 indicates an example in which transformers are used as the isolation elements ISO1 and ISO3 and a capacitor is utilized as the isolation element ISO4.

The winding direction of the coil (clockwise or counterclockwise) making up the transformer may be changed from one isolation element to another. For example, if the isolation element ISO1 has the tendency to transmit high-level data erroneously under the influence of external magnetic fields, the isolation element ISO4 may have its coil adjusted in layout and in winding direction so as to develop the tendency to transmit high-level data. Given such adjustments, even if malfunctions do occur in signal transmission via both the isolation element ISO1 and the isolation element ISO4, the power transistor PTr1 is controlled to be turned off. This prevents through-currents from flowing through the power transistors PTr1 and PTr2 and thereby inhibits the increase in consumption current.

The above-mentioned adjustments can be applied not only to cases where malfunctions are caused by external magnetic fields but also to cases where common mode noise can trigger malfunctions. For example, if the isolation element ISO1 has the tendency to transmit high-level data erroneously under the influence of common mode noise, the isolation element ISO4 may likewise have its coil adjusted in layout and in winding direction so as to manifest the tendency to transmit high-level data. Given these adjustments, if malfunctions occur in signal transmission via both the isolation element ISO1 and the isolation element ISO4, the power transistor PTr1 is controlled to be turned off. This prevents through-currents from flowing through the power transistors PTr1 and PTr2 and thereby inhibits the increase in consumption current.

Figure 61:
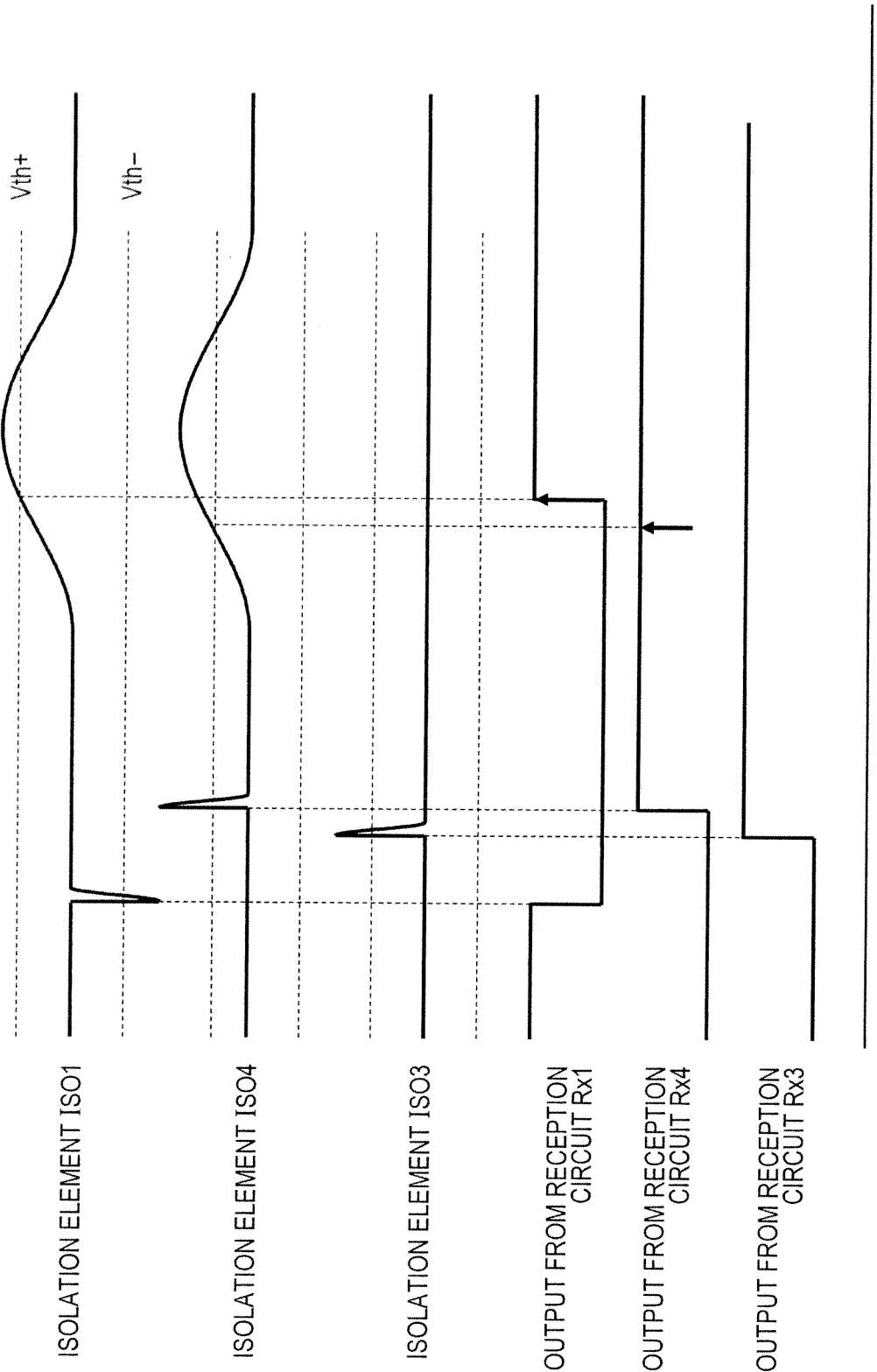
FIG. 61 is a timing chart showing typical operations of the semiconductor integrated circuit as the seventh embodiment.

Alternatively, the isolation element ISO4 may be configured to be affected by common mode noise or by external magnetic fields more sensitively than the isolation element ISO1. This configuration permits transmission of the high-level data via the isolation element ISO4 at earlier timing than the high-level data via the isolation element ISO1, as shown in FIG. 61. This controls the power transistor PTr1 to be forcibly turned off by the reproduced output data VOUT2 before getting inadvertently turned on by the output data VOUT1 (reproduced transmission data VIN). That in turn prevents through-currents from flowing through the power transistors PTr1 and PTr2 and thereby inhibits the increase in consumption current.

Figure 62:
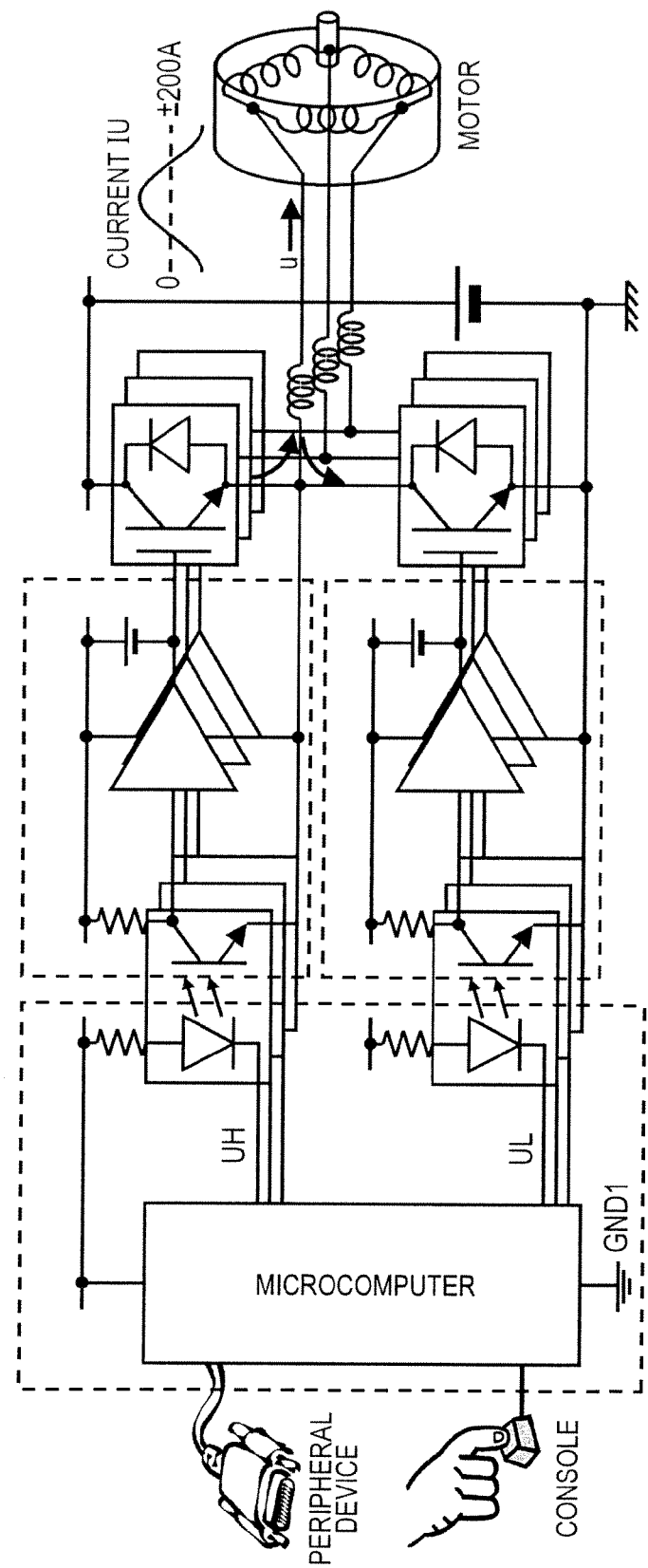
FIG. 62 is a schematic view showing inverter equipment to which the present invention may be applied.
Figure 63:
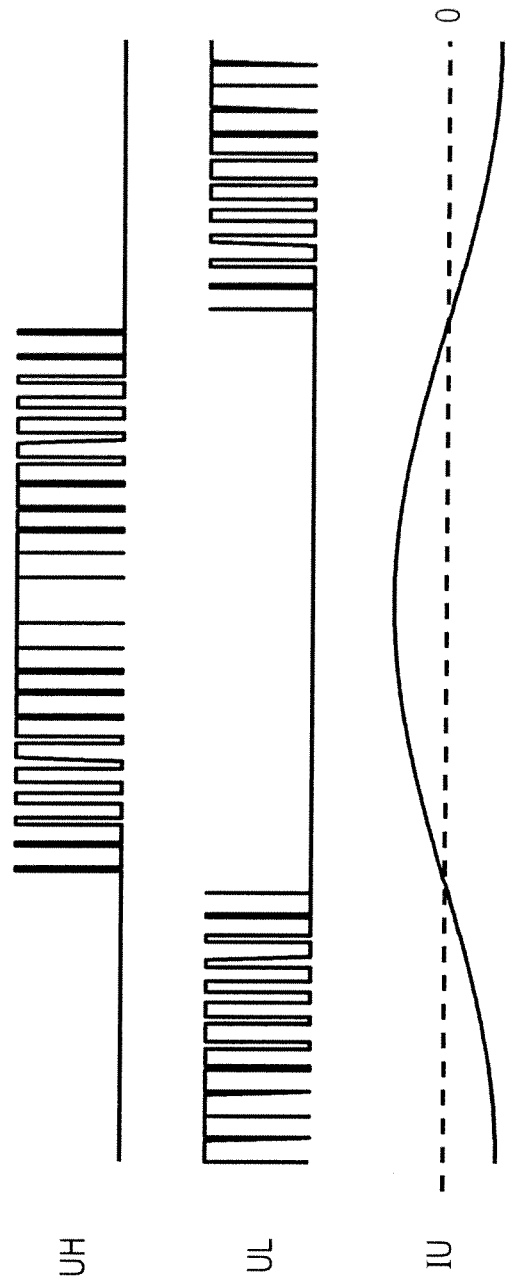
FIG. 63 is a timing chart showing typical operations of the inverter equipment to which the present invention may be applied.

Each of the semiconductor integrated circuits implemented as the first through the seventh embodiments discussed above may be applied to inverter equipment that drives a monitor (load), as shown in FIG. 62 for example. The inverter equipment shown in FIG. 62 has three gate drivers on each of the high and the low sides. Based on PWM-modulated transmission data (e.g., UH, UL) output from a microcomputer, this inverter equipment controls currents (e.g., IU) flowing through the motor in analog fashion (see FIG. 63).

For example, if the abnormality detection part (not shown in FIG. 62) detects an abnormality, information about the detected abnormality is fed back to the microcomputer. The microcomputer transmits the information about the detected abnormality to peripheral devices. Specifically, the microcomputer may illuminate a warning lamp or display the abnormality-related information on the display screen of a car navigation system. On verifying the glowing warning lamp, the user operating an attached console can give the microcomputer relevant instructions to carrying out appropriate processes.

The semiconductor integrated circuit embodying the present invention may also be applied to a motor drive apparatus mounted on electric vehicles, two-wheeled electric vehicles or the like; to a drive apparatus for driving the compressor or motor mounted on home electrical appliances such as air conditioners and refrigerators; to a power control apparatus for high-power home electrical appliances such as microwave ovens and IH cookers; to a drive apparatus for DC and AC power sources; to dimmer controls for lighting equipment, backlights and displays; to washing machines, inverter-controlled florescent lamps, microwave ovens, IH cookers, vacuum cleaners, LED lights, uninterruptible power supplies (UPS), solar power generation systems, cogeneration systems, pumps, liquid crystal displays (for backlight control), and PDP; and to industrial inverters, machine tools, robots, elevators, wind power generation systems, NAS cells, forklifts, gold carts, and fuel cells.

It should be understood that the present invention when embodied is not limited to the above-described first through the seventh embodiments and that various modifications, variations and alternatives may be made of this invention so far as they are within the spirit and scope thereof. For example, in the first through the seventh embodiments discussed above, the target to be controlled was shown to be the power transistor or transistors (e.g., power transistor PTr1 in FIG. 1) for example. Alternatively, the target to be controlled may be the IGBT, power MOS, GaN FET, SiC FET, or the combination of any one of these elements with a snubber diode.

Also in the first through the seventh embodiments discussed above, the control part CT1 was shown to be an AND circuit for example. Alternatively, the circuit configuration of the control part CT1 may be changed as needed as long as the control part CT1 can turn off the power transistor PTr1 upon detection of an abnormality by the abnormality detection part DT1. The same holds for other control parts (e.g., control part CT2) having the same capabilities as those of the control part CT1.

Further in the first through the seventh embodiments discussed above, the abnormality detection part DT1 was shown to have three detection circuits (magnetic field change detection circuit 101, pulse width detection circuit 102, and common mode noise detection circuit 103) for example. Alternatively, the abnormality detection part DT1 may possess at least one of these detection circuits. The same holds for other abnormality detection parts (e.g., abnormality detection part DT2) having the same capabilities as those of the abnormality detection part DT1.

It should also be understood that the configuration examples of the detection circuits included in the abnormality detection part DT1 are only for illustration purposes and may be replaced with other configurations offering substantially the same capabilities.

Thus the scope of the invention should be determined by the appended claims and their legal equivalents, rather than by the examples given.

What is claimed is:

1. A semiconductor integrated circuit comprising:
   a first transmission circuit generating and outputting a first transmission signal reflecting a first data signal supplied from outside;
   a first reception circuit reproducing the first data signal based on a first reception signal;
   a first isolation element isolating the first transmission circuit from the first reception circuit and transmitting the first transmission signal as the first reception signal;
   an abnormality detection part detecting an abnormality that can cause a malfunction in signal transmission via the first isolation part, and
   a control part which, upon detection of an abnormality by the abnormality detection part, outputs a stop signal regardless of the first data signal supplied from outside to the first transmission circuit.

2. The semiconductor integrated circuit according to claim 1, further comprising:
   a gate driver outputting a gate control signal based on the first data signal reproduced by the first reception circuit, the gate control signal being used to control on/off operations of an output transistor for controlling a current flowing through a load;
   wherein, upon detection of an abnormality by the abnormality detection part, the control part turns off the output transistor by outputting the stop signal.

3. The semiconductor integrated circuit according to claim 1, wherein the abnormality detection part includes a pulse width detection circuit detecting the abnormality if the interval between logical value changes in the first data signal reproduced by the first reception circuit becomes larger than a predetermined interval.

4. The semiconductor integrated circuit according to claim 1, wherein the abnormality detection part includes a common mode noise detection circuit detecting the abnormality if common mode noise exceeds a predetermined threshold range.

5. The semiconductor integrated circuit according to claim 1, wherein the first isolation element is comprised of a transformer.

6. The semiconductor integrated circuit according to claim 1, wherein the first isolation element is comprised of a GMR element isolator.

7. The semiconductor integrated circuit according to claim 1, wherein the first isolation element is comprised of a capacitor.

8. The semiconductor integrated circuit according to claim 1, wherein the first isolation element is comprised of a photocoupler.

9. The semiconductor integrated circuit according to claim 1, wherein the first isolation element includes a coil, and
   wherein the abnormality detection part includes a magnetic field change detection circuit detecting the abnormality if an electromotive force induced in the coil in response to a magnetic field change exceeds a predetermined threshold range.

10. The semiconductor integrated circuit according to claim 9, wherein the first isolation element is comprised of a transformer.

11. The semiconductor integrated circuit according to claim 9, wherein the first isolation element is comprised of a GMR element isolator.

12. The semiconductor integrated circuit according to claim 1, wherein the first transmission circuit is mounted over a first semiconductor chip driven by a first power source,
wherein the first reception circuit is mounted over a second semiconductor chip driven by a second power source, and
wherein the abnormality detection part and the control part are mounted over the second semiconductor chip along with the first reception circuit.

13. The semiconductor integrated circuit according to claim 1, wherein the first transmission circuit is mounted over a first semiconductor chip driven by a first power source,
wherein the first reception circuit is mounted over a second semiconductor chip driven by a second power source, and
wherein the abnormality detection part and the control part are mounted over the first semiconductor chip along with the first transmission circuit.

14. The semiconductor integrated circuit according to claim 13, wherein the abnormality detection part includes a power-on reset circuit detecting the abnormality if a predetermined time period has yet to elapse after the first power source starts supplying a source voltage to the first semiconductor chip.

15. The semiconductor integrated circuit according to claim 13, wherein the abnormality detection part includes a low-voltage detection circuit detecting the abnormality if the source voltage supplied from the first power source to the first semiconductor chip is lower than a predetermined threshold voltage.

16. The semiconductor integrated circuit according to claim 13, wherein the abnormality detection part includes a power source noise detection circuit detecting the abnormality if the noise in the source voltage supplied from the first power source to the first semiconductor chip exceeds a predetermined threshold range.

17. The semiconductor integrated circuit according to claim 13, wherein the abnormality detection part includes an overheat detection circuit detecting the abnormality if the temperature of the first semiconductor chip exceeds a predetermined temperature.

18. The semiconductor integrated circuit according to claim 13, wherein the abnormality detection part includes a comparison part comparing the first data signal supplied to the first transmission circuit with the first data signal reproduced by the first reception circuit, the comparison part detecting the abnormality if there is a mismatch between the compared signals.

19. The semiconductor integrated circuit according to claim 13, further comprising:
a comparison part comparing the first data signal supplied to the first transmission circuit with the first data signal reproduced by the first reception circuit,
wherein, upon detection of a mismatch between the compared signals by the comparison part, the control part outputs unchecked to the first transmission circuit the first data signal supplied again from outside to the first transmission circuit.

20. The semiconductor integrated circuit according to claim 18, further comprising:
a second transmission circuit mounted over the second semiconductor chip along with the first reception circuit and generating and outputting a second transmission signal reflecting the first data signal reproduced by the first reception circuit;
a second reception circuit mounted over the first semiconductor chip along with the first transmission circuit and reproducing the first data signal based on a second reception signal; and
a second isolation element isolating the second transmission circuit from the second reception circuit and transmitting the second transmission signal as the second reception signal,
wherein the comparison part compares the first data signal supplied to the first transmission circuit with the first data signal reproduced by the second reception circuit.

21. The semiconductor integrated circuit according to claim 12, wherein the first semiconductor chip corresponds to a first area of a common semiconductor chip, and
wherein the second semiconductor chip corresponds to a second area isolated from the first area over the common semiconductor chip.

22. The semiconductor integrated circuit according to claim 1,
wherein the abnormality detection part includes:
a third transmission circuit generating and outputting a third transmission signal reflecting a second data signal supplied from outside;
a third reception circuit reproducing the second data signal based on a third reception signal, and
a third isolation element isolating the third transmission circuit from the third reception circuit and transmitting the third transmission signal as the third reception signal, and
wherein the abnormality detection part detects the abnormality if the second data signal reproduced by the third reception circuit does not match the first data signal reproduced by the first reception circuit.

23. The semiconductor integrated circuit according to claim 2,
wherein the first transmission circuit and the third transmission circuit are mounted over the first semiconductor chip driven by the first power source,
wherein the first reception circuit is mounted over the second semiconductor chip driven by the second power source,
wherein the third reception circuit is mounted over a third semiconductor chip driven by a third power source,
wherein the control part is mounted over the second semiconductor chip along with the first reception circuit,
wherein the abnormality detection part is mounted over the third semiconductor chip along with the third reception circuit and includes:
a fourth transmission circuit generating and outputting a fourth transmission signal in response to the second data signal reproduced by the third reception circuit;
a fourth reception circuit mounted over the second semiconductor chip along with the first reception circuit and reproducing the second data signal based on a fourth reception signal, and
a fourth isolation element isolating the fourth transmission circuit from the fourth reception circuit and transmitting the fourth transmission signal as the fourth reception signal, and wherein the abnormality detection part detects the abnormality if the second data signal reproduced by the fourth reception circuit does not match the first data signal reproduced by the first reception circuit.

24. The semiconductor integrated circuit according to claim 23, wherein the fourth isolation element is comprised of an element of which the type is different from that of the first isolation element.

25. The semiconductor integrated circuit according to claim 23,
- wherein the first semiconductor chip corresponds to a first area of a common semiconductor chip,
- wherein the second semiconductor chip corresponds to a second area isolated from the first area of the common semiconductor chip, and
- wherein the third semiconductor chip corresponds to a third area isolated from the first and the second areas over the common semiconductor chip.

26. The semiconductor integrated circuit according to claim 1, wherein the control part cancels the stop signal at the same time that the abnormality being detected by the abnormality detection circuit is no longer detected.

27. The semiconductor integrated circuit according to claim 1, wherein the control part cancels the stop signal in synchronism with a first logical value change of the first data signal supplied from outside to the first transmission circuit after the abnormality being detected by the abnormality detection circuit is no longer detected.

28. A drive apparatus comprising:
- a semiconductor integrated circuit according to claim 1; and
- a microcomputer supplying at least the first data signal to the semiconductor integrated circuit.

29. The drive apparatus according to claim 28, wherein the semiconductor integrated circuit feeds the abnormality detected by the abnormality detection part back to the microcomputer.

* * * * *